United States Patent
Oohashi

(10) Patent No.: US 8,361,700 B2
(45) Date of Patent: Jan. 29, 2013

(54) LITHOGRAPHIC PRINTING PLATE PRECURSOR AND METHOD OF PREPARING LITHOGRAPHIC PRINTING PLATE

(75) Inventor: Hidekazu Oohashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 867 days.

(21) Appl. No.: 12/059,317

(22) Filed: Mar. 31, 2008

(65) Prior Publication Data

US 2008/0241740 A1 Oct. 2, 2008

(30) Foreign Application Priority Data

Mar. 29, 2007 (JP) .................................. 2007-089729
Sep. 28, 2007 (JP) .................................. 2007-256774

(51) Int. Cl.
*B41F 7/00* (2006.01)
*G03F 7/00* (2006.01)

(52) U.S. Cl. ..................... 430/302; 430/309; 101/450.1; 101/453; 101/463.1

(58) Field of Classification Search ............... 430/270.1, 430/302
See application file for complete search history.

(56) References Cited

U.S. PATENT DOCUMENTS

| | | | |
|---|---|---|---|
| 2,850,455 A | 9/1958 | Oster | |
| 4,708,925 A | 11/1987 | Newman | |
| 6,509,132 B1 * | 1/2003 | Oohashi et al. | 430/270.1 |
| 6,670,096 B2 * | 12/2003 | Kawamura et al. | 430/271.1 |
| 2002/0039702 A1 | 4/2002 | Hotta | |

FOREIGN PATENT DOCUMENTS

| | | |
|---|---|---|
| EP | 1302504 A1 | 4/2003 |
| EP | 1396756 A2 | 3/2004 |
| EP | 1865378 A1 | 12/2007 |
| JP | 44-20189 A | 8/1969 |
| JP | 04-197798 A | 7/1992 |
| JP | 8-276558 A | 10/1996 |
| JP | 2938397 B2 | 6/1999 |
| JP | 2000-211262 A | 8/2000 |
| JP | 2001-277740 A | 10/2001 |
| JP | 2001-318458 A | 11/2001 |
| JP | 2002-29162 A | 1/2002 |
| JP | 2002-46361 A | 2/2002 |
| JP | 2002-137562 A | 5/2002 |
| JP | 2002-326470 A | 11/2002 |
| JP | 2006-15530 A | 1/2006 |
| WO | 2006/023667 A1 | 3/2006 |

OTHER PUBLICATIONS

Extended European Search Report dated Apr. 28, 2009.
Office Action dated Oct. 30, 2012 in Japanese Patent Application No. 2007-256774.

* cited by examiner

*Primary Examiner* — Cynthia Kelly
*Assistant Examiner* — Chanceity Robinson
(74) *Attorney, Agent, or Firm* — Sughrue Mion, PLLC

(57) ABSTRACT

A lithographic printing plate precursor includes: a support having a surface, a contact angle of water droplet in air on which is 70° or more; and a photosensitive layer, wherein the support has, on a surface of the support, a compound having a functional group X, the functional group X is a functional group capable of forming a chemical bond with a compound having a functional group Y which can interact with the functional group X, when the functional group X is brought into contact with the compound having a functional group Y, to adsorb the compound having a functional group Y on the surface of the support so as to decrease the contact angle of water droplet in air on the surface of the support to 30° or less.

3 Claims, 2 Drawing Sheets

LITHOGRAPHIC PRINTING PLATE PRECURSOR AND METHOD OF PREPARING LITHOGRAPHIC PRINTING PLATE

FIELD OF THE INVENTION

The present invention relates to a lithographic printing plate precursor which is capable of being subjected to a so-called direct plate making, in which the plate making is directly conducted based on digital signals, for example, from a computer using various kinds of lasers, particularly, to a lithographic printing plate precursor of a simple processing type which does not need alkali development, and a method of preparing a lithographic printing plate using the lithographic printing plate precursor.

BACKGROUND OF THE INVENTION

A solid laser, semiconductor laser and gas laser having a large output and a small size, which radiate an ultraviolet ray, visible light or infrared ray having a wavelength of 300 to 1,200 nm, have become easily available, and these lasers are very useful for recording light sources used in the direct plate making based on digital signals, for example, from a computer. Various investigations on recording materials sensitive to such various laser beams have been made. Typical examples thereof include firstly recording materials capable of being recorded with a infrared laser having a wavelength of not less than 760 nm, for example, positive type recording materials described in U.S. Pat. No. 4,708,925 and acid catalyst crosslinking type negative type recording materials described in JP-A-8-276558 (the term "JP-A" as used herein means an "unexamined published Japanese patent application"), and secondly recording materials responsive to an ultraviolet ray or visible light laser having a wavelength of from 300 to 700 nm, for example, radical polymerization type negative type recording materials described in U.S. Pat. No. 2,850,445 and JP-B-44-20189 (the term "JP-B" as used herein means an "examined Japanese patent publication").

Further, with respect to hitherto known lithographic printing plate precursors (hereinafter, also referred to as PS plates), a step of removing the non-image area by dissolution (development processing) is indispensable and a post-processing step, for example, washing the printing plate after the development processing with water, treatment of the printing plate after the development processing with a rinse solution containing a surfactant or treatment of the printing plate after the development processing with an oil-desensitizing solution containing gum arabic or a starch derivative, is also necessary. The point that such additional wet treatments are indispensable is a large subject of investigation in hitherto known PS plates. Even when the first half (image-forming process) of plate making process is simplified by the above-described digital processing, the effects due to the simplification is still insufficient as long as the last half (development processing) is the troublesome wet treatment.

Particularly, the consideration for global environment has become a great concern throughout the field of industry in recent years. In view of the consideration for global environment, a treatment with a developer closer to a neutral range and a small amount of waste liquid are subjects of further investigations. Further, it is desirable that the wet type post-processing is simplified or changed to a dry processing.

From this viewpoint, as one method for eliminating the processing step, a method referred to as on-machine development wherein an exposed printing plate precursor is mounted on a cylinder of a printing machine and the non-image area of the printing plate precursor is removed by supplying dampening water and ink while rotating the cylinder is known. Specifically, according to the method, the printing plate precursor is exposed and mounted on a printing machine as it is to complete development processing in a conventional process of printing.

A lithographic printing plate precursor suitable for the on-machine development is required to have an image-forming layer soluble in dampening water or an ink solvent and a bright room handling property suitable for development on a printing machine placed in a bright room. However, it is substantially impossible for hitherto known PS plates to fulfill such requirements.

In order to fulfill such requirements, a lithographic printing plate precursor having provided on a hydrophilic support an image-forming layer in which fine particles of thermoplastic hydrophobic polymer are dispersed in a hydrophilic binder polymer is proposed (see, for example, Japanese Patent 2,938,397). In the plate-making, the lithographic printing plate precursor is exposed to an infrared laser to agglomerate (fuse) the fine particles of thermoplastic hydrophobic polymer by heat generated by light-to-heat conversion thereby forming an image, and mounted on a cylinder of a printing machine to carry out on-machine development by supplying at least any one of dampening water and ink. Since the lithographic printing plate precursor has the sensitive zone in an infrared region, it has also the handling property in a bright room.

However, the image formed by the agglomeration (fusion) of the fine particles of thermoplastic hydrophobic polymer is insufficient in strength and has a problem of printing durability as a printing plate.

Lithographic printing plate precursors including microcapsules containing a polymerizable compound incorporated therein in stead of the thermoplastic fine particles are also proposed (see, for example, JP-A-2000-211262, JP-A-2001-277740, JP-A-2002-29162, JP-A-2002-46361, JP-A-2002-137562, JP-A-2002-326470 and JP-A-2006-15530). In the lithographic printing plate precursors according to such a proposal, it is advantageous that the polymer image formed by a reaction of the polymerizable compound is excellent in the strength in comparison with the image formed by the fusion of the fine particles.

Also, since the polymerizable compound has high reactivity, many proposals for isolation of the polymerizable compound using microcapsules have been made. Further, it has been proposed to use a thermally degradable polymer in a shell of the microcapsule.

However, in the hitherto known lithographic printing plate precursors described in Japanese Patent 2,938,397, JP-A-2000-211262, JP-A-2001-277740, JP-A-2002-29162, JP-A-2002-46361, JP-A-2002-137562 and JP-A-2002-326470, printing durability of the image formed by laser exposure is insufficient so that further improvements have been requested. Specifically, in such a lithographic printing plate precursor of a simple processing type, a support having a surface of high hydrophilicity is used in order to make possible development with an aqueous solution having pH of 10 or less or dampening water (ordinarily nearly neutral) on a printing machine and as a result, the image area is apt to be removed from the support by dampening water during printing so that sufficient printing durability can not be obtained. On the contrary, when the surface of support renders hydrophobic, ink also adheres on the non-image area during printing to cause printing stain. Thus, it is extremely difficult to achieve a good balance between the printing durability and the stain resistance and a lithographic printing plate precursor of a simple processing type which provides good stain resistance and sufficient printing durability has not yet been known.

On the other hand, in JP-A-2006-15530, a lithographic printing plate precursor comprising a support having thereon (1) a polymer resin layer having a hydrophilic substituent capable of adsorbing the support and (2) an image-recording layer capable of being removed with an oily ink and an aqueous component in this order, wherein a contact angle of the polymer resin layer after coated on the support is from 50 to 100° is described. It is described in JP-A-2006-15530 that since the polymer resin layer is almost removed without residue at the time of removing the unexposed area by supplying an oily ink and an aqueous component on a printing machine, good stain resistance can be obtained.

SUMMARY OF THE INVENTION

Therefore, an object of the present invention is to provide a lithographic printing plate precursor capable of being subjected to a direct plate making based on digital data, for example, from a computer, by image-recording using a solid laser or semiconductor laser radiating an ultraviolet ray, visible light or an infrared ray, particularly, a lithographic printing plate precursor of a simple processing type which can be developed with an aqueous solution having pH of 10 or less or on a printing machine and provides high printing durability and good stain resistance, and a method of preparing a lithographic printing plate using the lithographic printing plate precursor.

As a result of the intensive investigations, the inventors have found that the above-described object can be achieved by using a support for lithographic printing plate precursor, a surface of which has a contact angle value of water droplet in air of 70° or more and the contact angle of water droplet in air can be decreased to a value of 30° or less by a treatment with an aqueous solution having pH of 2 to 10.

Specifically, the present invention includes the following items.

(1) A lithographic printing plate precursor comprising a support having a surface, a contact angle of water droplet in air on which is 70° or more and a photosensitive layer, wherein the support has on its surface a compound having a functional group X, the functional group X is a functional group capable of forming a chemical bond with a compound having a functional group Y which can interact with the functional group X, when the functional group X is brought into contact with the compound having a functional group Y, to adsorb the compound having a functional group Y on the surface of support, thereby decreasing the contact angle of water droplet in air on the surface of support to 30° or less.

(2) The lithographic printing plate precursor as described in (1) above, wherein the functional group X is a functional group represented by formula (0) shown below.

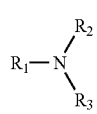
(0)

In formula (0), $R_1$ to $R_3$ each independently represents a monovalent substituent comprising at least one atom selected from hydrogen, carbon, oxygen, nitrogen, sulfur, phosphorus, halogen and silicon or a covalent bond, or appropriate two of $R_1$ to $R_3$ may be combined with each other to form a ring, provided that at least one of $R_1$ to $R_3$ represents a divalent connecting group for connecting to a skeleton of the compound having the functional group X, which comprises at least one atom selected from hydrogen, carbon, oxygen, nitrogen, sulfur, phosphorus, halogen and silicon.

(3) The lithographic printing plate precursor as described in (1) or (2) above, wherein the functional group Y is a functional group selected from —COOH, —SO₃H, —=PO(OH)(OM) and —B(OH)(OM) wherein M represents a hydrogen atom, a metal cation, an ammonium group, a phosphonium group, an iodonium group, a sulfonium group, a diazonium group or an azinium group.

(4) The lithographic printing plate precursor as described in (1) above, wherein the functional group X is a functional group having a positive charge and the functional group Y is a functional group having a negative charge.

(5) The lithographic printing plate precursor as described in (4) above, wherein the functional group X is a functional group represented by any one of formulae (1) to (5) shown below and the functional group Y is a functional group represented by any one of formulae (6) to (8) shown below:

(1)

(2)

(3)

(4)

(5)

In formulae (1) to (5), $R_1$ to $R_3$ each independently represents a hydrogen atom, an alkyl group, an aryl group, an alkenyl group or an alkynyl group, L represents a divalent connecting group for connecting to a skeleton of the compound having the functional group X, and $Z^-$ represents a counter anion;

(6)

(7)

-continued

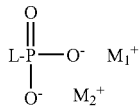
(8)

In formulae (6) to (8), $M_1^+$ and $M_2^+$ each independently represents a counter cation, and L represents a divalent connecting group for connecting to a skeleton of the compound having the functional group Y.

(6) The lithographic printing plate precursor as described in (1) above, wherein the functional group X is a functional group having a negative charge and the functional group Y is a functional group having a positive charge.

(7) The lithographic printing plate precursor as described in (6) above, wherein the functional group X is a functional group represented by any one of formulae (9) to (11) shown below and the functional group Y is a functional group represented by any one of formulae (12) to (16) shown below:

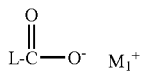
(9)

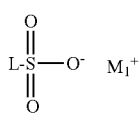
(10)

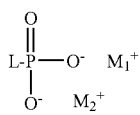
(11)

In formulae (9) to (11), $M_1^+$ and $M_2^+$ each independently represents a counter cation, and L represents a divalent connecting group for connecting to a skeleton of the compound having the functional group X;

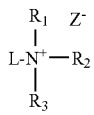
(12)

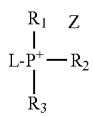
(13)

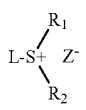
(14)

(15)

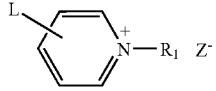
(16)

In formulae (12) to (16), $R_1$ to $R_3$ each independently represents a hydrogen atom, an alkyl group, an aryl group, an alkenyl group or an alkynyl group, L represents a divalent connecting group for connecting to a skeleton of the compound having the functional group Y, and $Z^-$ represents a counter anion.

(8) The lithographic printing plate precursor as described in any one of (1) to (7) above, wherein the photosensitive layer contains a binder polymer having an acid value of 0.3 mmol/g or less.

(9) The lithographic printing plate precursor as described in any one of (1) to (8) above, wherein the photosensitive layer contains a sensitizing dye having absorption in a wavelength of 350 to 1,200 nm.

(10) The lithographic printing plate precursor as described in any one of (1) to (9) above, which comprises a protective layer on the photosensitive layer.

(11) A method of preparing a lithographic printing plate comprising exposing imagewise the lithographic printing plate precursor as described in any one of (1) to (10) above and then developing the exposed lithographic printing plate precursor with an aqueous solution having pH of 2 to 10 to form a non-image area, wherein at or after the development, the lithographic printing plate precursor is treated with an aqueous solution containing the compound having a functional group Y, thereby decreasing the contact angle of water droplet in air on the surface of support in the unexposed area to 30° or less.

(12) A method of preparing a lithographic printing plate comprising exposing imagewise the lithographic printing plate precursor as described in any one of (1) to (10) above with an laser having an oscillation wavelength of 350 to 1,200 nm and then developing the exposed lithographic printing plate precursor with an aqueous solution having pH of 2 to 10 and containing the compound having a functional group Y, thereby removing the photosensitive layer in the unexposed area and forming a surface of an non-image area having a contact angle of water droplet in air of 30° or less.

(13) A method of preparing a lithographic printing plate comprising exposing imagewise the lithographic printing plate precursor as described in any one of (1) to (10) above with an laser having an oscillation wavelength of 350 to 1,200 nm, developing the exposed lithographic printing plate precursor with an aqueous solution having pH of 2 to 10 to remove the photosensitive layer in the unexposed area and then treating the lithographic printing plate precursor with an aqueous solution having pH of 2 to 10 and containing the compound having a functional group Y, thereby forming a surface of an non-image area having a contact angle of water droplet in air of 300 or less.

(14) The method of preparing a lithographic printing plate as described in any one of (1) to (13) above, the exposed lithographic printing plate precursor is subjected to heat treatment between the imagewise exposure and the development.

According to the present invention, a lithographic printing plate precursor which is capable of being subjected to a so-called direct plate making, in which the plate making is directly conducted based on digital signals, for example, from a computer using various kinds of lasers, particularly, a lithographic printing plate precursor of a simple processing type which does not need development with an aqueous alkali solution, and a method of preparing a lithographic printing plate using the lithographic printing plate precursor are obtained.

Figure 1:
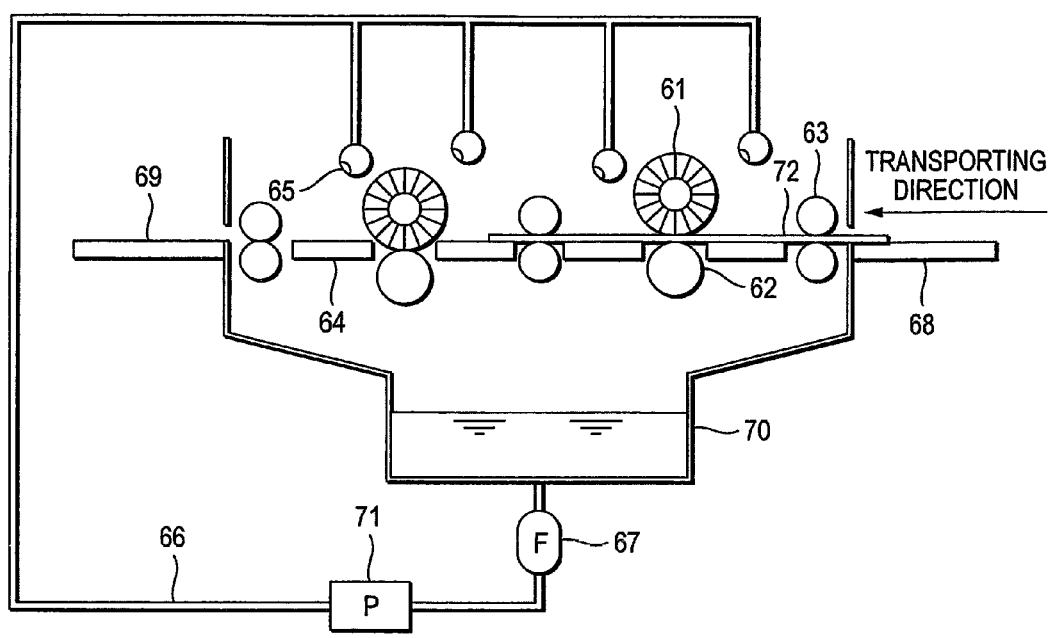
FIG. 1 is an illustration for showing a structure of an automatic development processor.

DESCRIPTION OF REFERENCE NUMERALS
AND SIGNS

1: Transport roller pair
2: Transport roller pair
3: Rotating brush roller
4: Transport roller pair
5: Transport roller pair
6: Rotating brush roller
7: Rotating brush roller
8: Transport roller pair
9: Transport roller pair
10: Backing roller
11: Transport roller pair
12: Transport roller pair
13: Transport roller pair
61: Rotating brush roller
62: Backing roller
63: Transport roller
64: Transport guide plate
65: Spray pipe
66: Pipe line
67: Filter
68: Plate supply table
69: Plate discharge table
70: Developer tank
71: Circulating pump
72: Plate

DETAILED DESCRIPTION OF THE INVENTION

The lithographic printing plate precursor according to the invention comprises a photosensitive layer provided on a support having a surface, a contact angle of water droplet in air on which is 70° or more, the support has on its surface a compound having a functional group X, the functional group X is a functional group capable of forming a chemical bond with a compound having a functional group Y which can interact with the functional group X, when the functional group X is brought into contact with the compound having a functional group Y, to adsorb the compound having a functional group Y on the surface of support, thereby decreasing the contact angle of water droplet in air on the surface of support to 30° or less.

[Support]

First, the support for use in the lithographic printing plate precursor according to the invention is described in detail below.

The support for use in the invention has a feature in that it has a surface having a contact angle value of water droplet in air of 70° or more and the contact angle value of water droplet in air of its surface decreases to 30° or less by treatment with a specific aqueous solution having pH of 2 to 10.

As the support for use in the invention, any support can be preferably used as long as it has the characteristic in that a contact angle value of water droplet in air of its surface is 70° or more and the contact angle value of water droplet in air of its surface decreases to 300 or less after it is developed with an aqueous solution having pH of 2 to 10 and containing a specific compound or after it is developed with an aqueous solution having pH of 2 to 10 and then treated with an aqueous solution having pH of 2 to 10 and containing a specific compound.

According to one example of the support having the characteristic as described above, a support has on its surface a compound having a functional group X, and the functional group X is a functional group capable of decreasing the contact angle of water droplet in air on the surface of support to 30° or less when the functional group X comes into contact with a compound having a functional group Y which can interact with the functional group X.

When the functional group X present on the surface of support comes into contact with the functional group Y, the functional group X interacts with the functional group Y to decrease the contact angle of water droplet in air on the surface of support to 300 or less. The interaction between the functional group X and the functional group Y includes formation of a bond resulting from the reaction therebetween. The bond formed is preferably a chemical bond, for example, a hydrogen bond, an ionic bond, a covalent bond or a coordinate bond.

Due to the formation of bond between the functional group X and the functional group Y, the compound having the functional group Y is fixed so that the contact angle of water droplet in air on the surface of support can be decreased to 30° or less.

Specific examples of the functional group X include a basic functional group, for example, a primary amino group, a secondary amino group or a tertiary amino group.

According to one preferable example of the compound having the functional group X, compounds having a functional group represented by formula (0) shown below are exemplified.

In formula (0), $R_1$ to $R_3$ each independently represents a monovalent group comprising at least one atom selected from hydrogen, carbon, oxygen, nitrogen, sulfur, phosphorus, halogen and silicon or a covalent bond, or appropriate two of $R_1$ to $R_3$ may be combined with each other to form a ring, provided that at least one of $R_1$ to $R_3$ represents a divalent connecting group for connecting to a skeleton of the compound having the functional group X, which comprises at least one atom selected from hydrogen, carbon, oxygen, nitrogen, sulfur, phosphorus, halogen and silicon.

The monovalent group comprising at least one atom selected from hydrogen, carbon, oxygen, nitrogen, sulfur, phosphorus, halogen and silicon represented by any one of $R_1$ to $R_3$ in formula (0) includes a monovalent group formed from —H, —F, —Cl, —Br, —I, >C<, =C<, =C—, —O—, O=, —N<, —N=, ≡N, —S—, S=, >S<, =S=, —P<, =P<, >Si<, =Si<, =Si— and combinations thereof. Examples of the monovalent group include a hydrogen atom, an alkyl group [for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, an 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group], an aryl group [for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group or a phosphonatophenyl group], a heteroaryl group [for example, a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrine, acridine, perimidine, phenanthroline, phthalazine, phenarsazine, phenoxazine, furazane or phenoxazine], an alkenyl group [for example, a vinyl group, a 1-propenyl group, a 1-butenyl group, a cinnamyl group or a 2-chloro-1-ethenyl group], an alkynyl group [for example, an ethynyl group, a 1-propynyl group, a 1-butynyl group or a trimethylsilylethynyl group], a halogen atom [for example, —F, —Br, —Cl or —I], a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group and a nitro group. Among the above-described groups, a hydrogen atom, an alkyl group, an aryl group, an alkenyl group and an alkynyl group are preferable.

In the functional group represented by formula (0), the divalent connecting group for connecting to a skeleton of the compound includes divalent groups formed by eliminating one constituting atom from the monovalent groups described above.

As the skeleton of the compound having the functional group represented by formula (0), any skeleton of organic compounds having a molecular weight of 150 or more may be preferably used. A skeleton of a polymer compound having a weight average molecular weight of 1,000 or more is preferable, a skeleton of a polymer compound having a weight average molecular weight of 5,000 or more is more preferable, and a skeleton of a polymer compound having a weight average molecular weight of 10,000 or more is particularly preferable. As the skeleton of a polymer compound, a known resin, for example, an acrylic resin, a methacrylic resin, a styrene resin, an ester resin, an amide resin, a urethane resin, a urea resin, a vinyl resin, a novolac resin, an epoxy resin or a carbonate resin can be used, an acrylic resin, a methacrylic resin, a styrene resin, an ester resin, an amide resin, a urethane resin, a urea resin or a vinyl resin is preferable, and an acrylic resin, a methacrylic resin, a styrene resin or a urethane resin is more preferable.

Of the compound having the functional group represented by formula (0), the amount of the functional group represented by formula (0) is preferably from 0.01 to 50 mmol/g, more preferably from 0.05 to 25 mmol/g, particularly preferably from 0.1 to 10 mmol/g. Two or more of the functional groups represented by formula (0) may be contained in the compound.

It is preferred that the compound having the functional group represented by formula (0) further has a functional group capable of interacting with the surface of support. By the introduction of the functional group capable of interacting with the surface of support, printing durability of the image area and stain resistance in the non-image area are further improved. The functional group capable of interacting with the surface of support can be appropriately selected according to the support used. In the case of using an aluminum support conventionally used as the support for lithographic printing plate precursor, a functional group, for example, a phosphoric acid group or a salt group thereof, a phosphonic acid group or a salt group thereof, an ammonium group, a siloxane group, a β-dicarbonyl group or a carboxylic acid group or a salt group thereof is exemplified, although a specific functional group may be varied depending on the surface treatment of the support. Of the functional groups, a phosphoric acid salt group, a phosphonic acid salt group, an ammonium group, a siloxane group, a β-dicarbonyl group and a carboxylic acid salt group is preferable.

The functional groups may be used in combination of two or more thereof. The amount of the functional group capable of interacting with the surface of support introduced into the compound having the functional group represented by formula (0) is preferably from 0.01 to 10 mmol/g, more preferably from 0.05 to 5 mmol/g, particularly preferably from 0.1 to 3 mmol/g.

It is preferred that the compound having the functional group represented by formula (0) further has a functional group capable of interacting with the photosensitive layer. By the introduction of the functional group capable of interacting with the photosensitive layer, printing durability is further improved. The functional group capable of interacting with the photosensitive layer can be appropriately selected according to the photosensitive layer used. In the case of using the photosensitive layer of radical polymerization type, as the functional group capable of interacting with the photosensitive layer, a radical polymerizable unsaturated bond is exemplified. In the case of using the positive type photosensitive layer using a novolac resin, as the functional group capable of interacting with the photosensitive layer, a hydrogen-acceptable functional group involved a hydrogen bond, for example, a polyethylene oxide chain, a phenolic hydroxy group or a pyridyl group is exemplified. The functional groups may be used in combination of two or more thereof. The amount of the functional group capable of interacting with the photosensitive layer introduced into the compound having the functional group represented by formula (0) is preferably from 0.01 to 10 mmol/g, more preferably from 0.05 to 5 mmol/g, particularly preferably from 0.1 to 3 mmol/g.

Specific examples of the compound having the functional group represented by formula (0) for use in the invention are set forth below, but the invention should not be construed as being limited thereto.

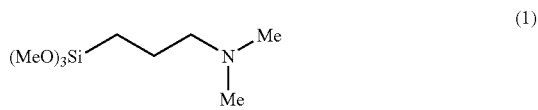

(1)

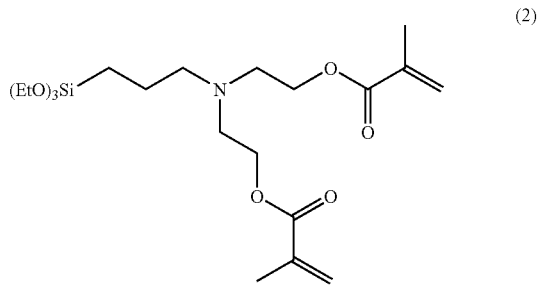

(2)

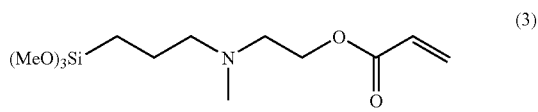

(3)

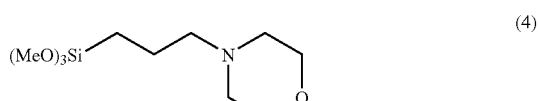

(4)

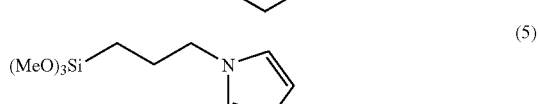

(5)

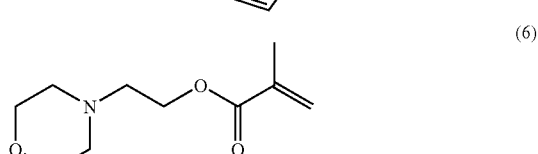

(6)

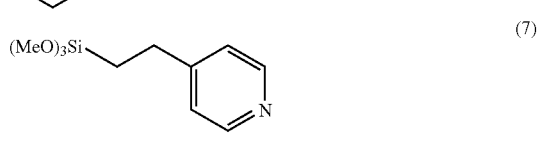

(7)

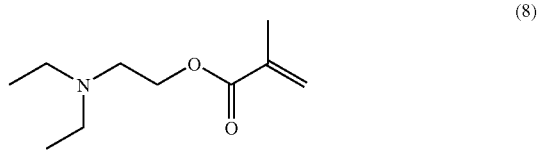

(8)

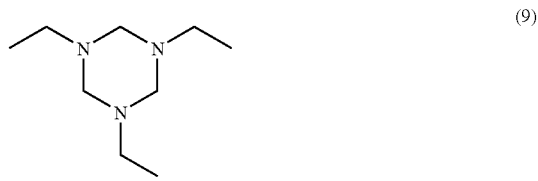

(9)

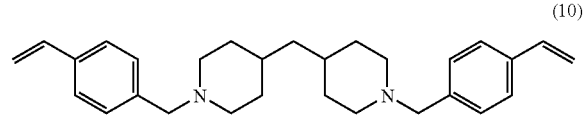

(10)

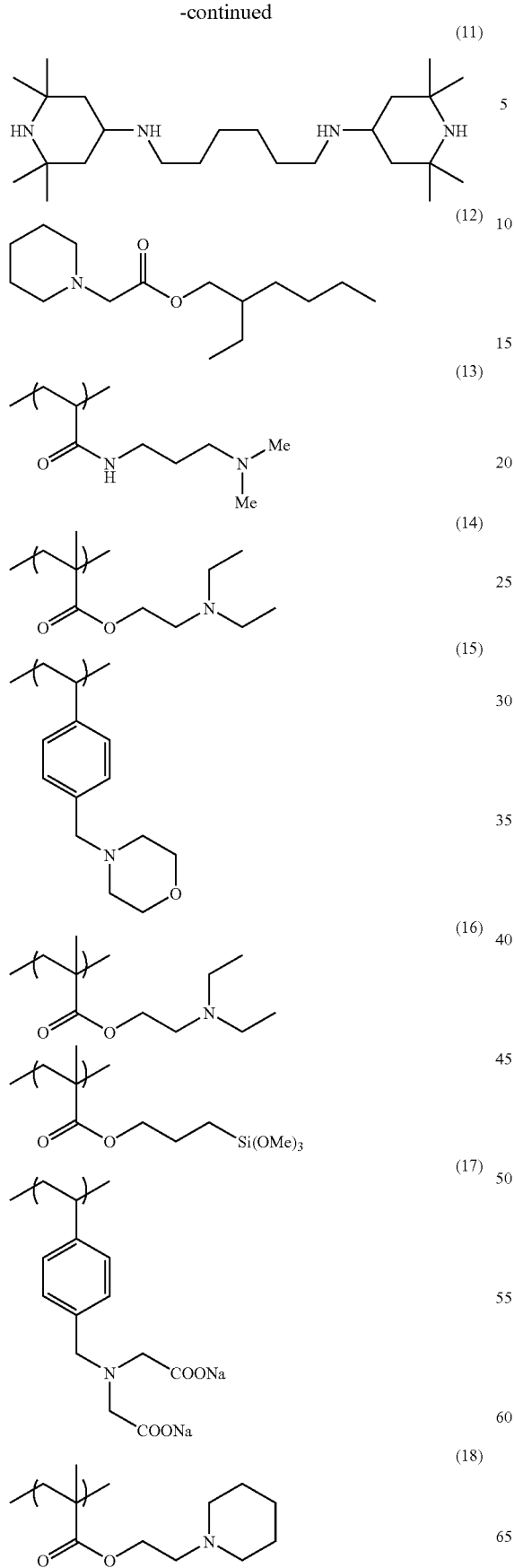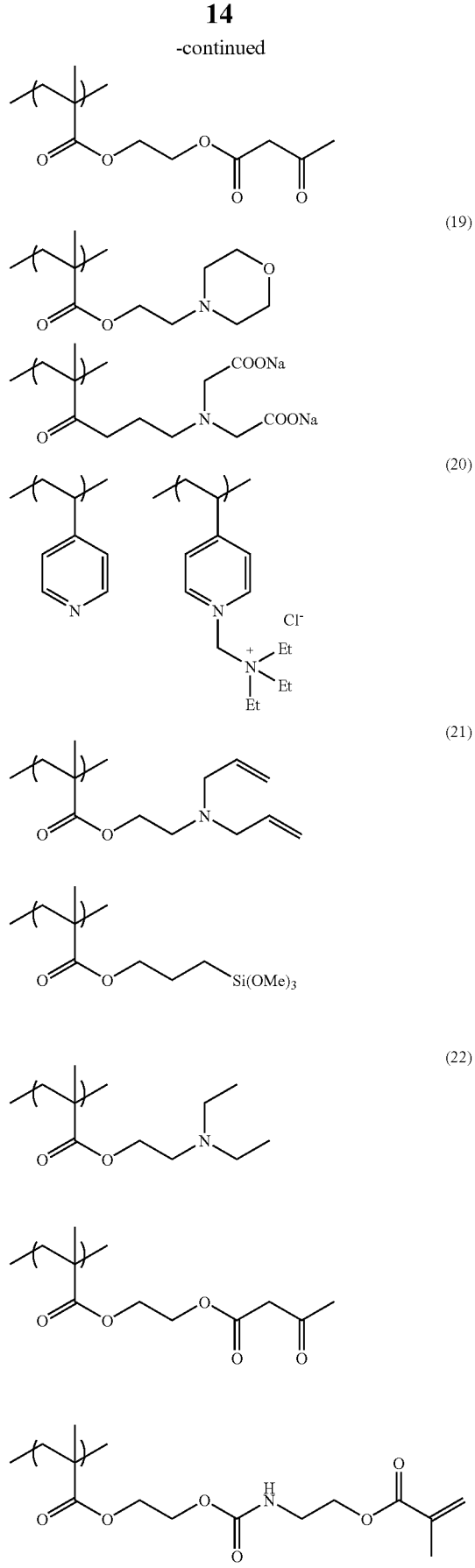

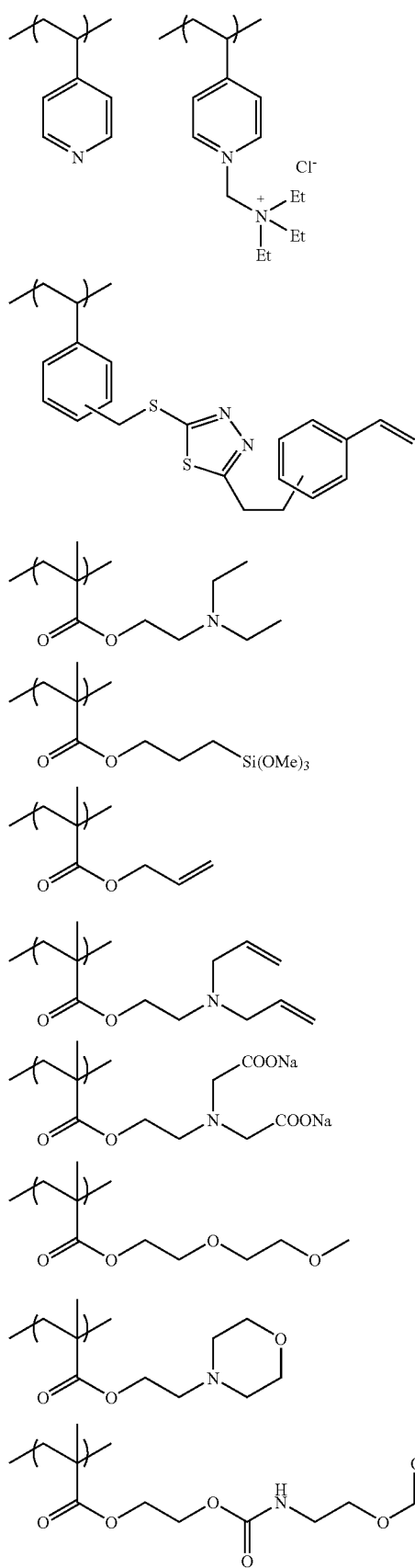
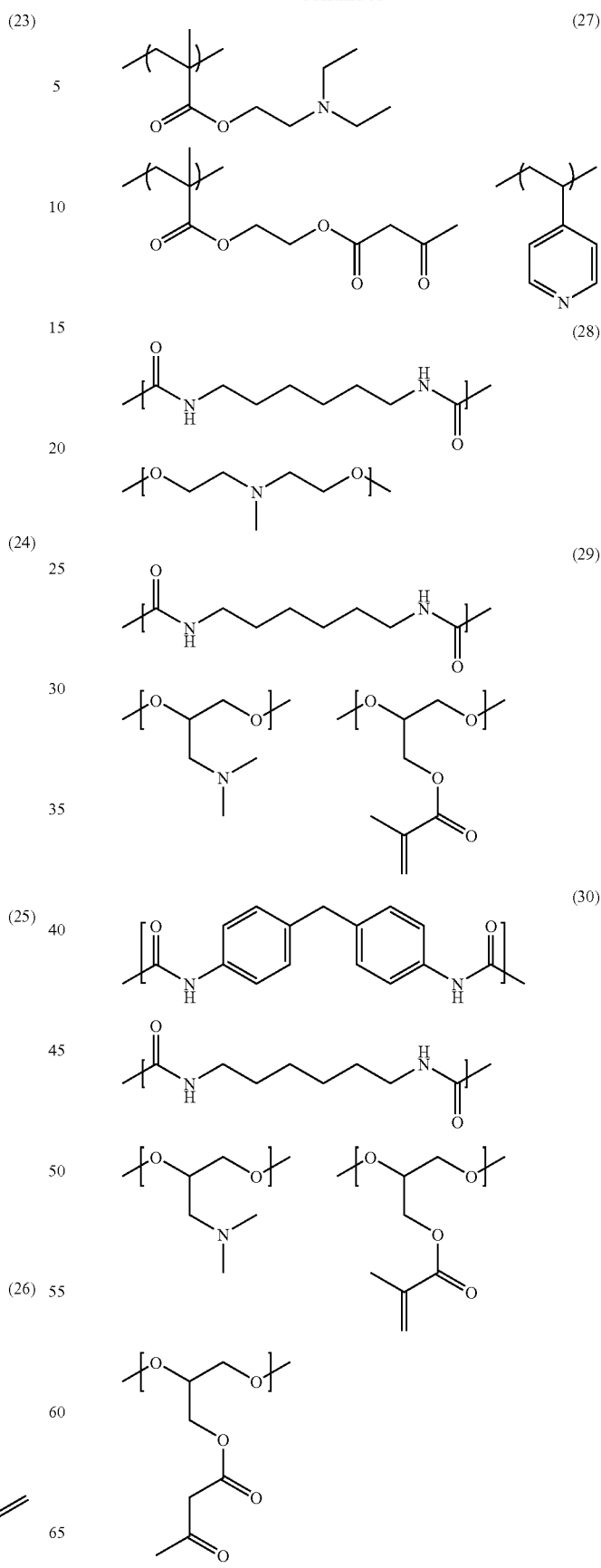

-continued

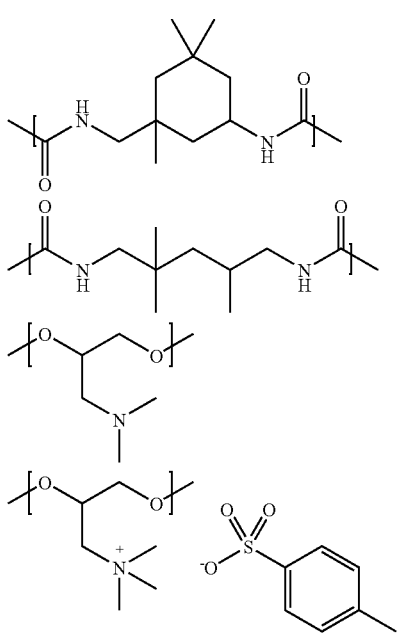
(31)

The compounds having the functional group represented by formula (0) for use in the invention may be used individually or as a mixture of two or more thereof.

The amount of the compound having the functional group represented by formula (0) on the support is preferably from 1 to 100 mg/m², more preferably from 2 to 80 mg/m², particularly preferably from 3 to 50 mg/m² in view of improvements in the printing durability and stain resistance.

As the functional group Y capable of interacting with the functional group X represented by formula (0), specifically, for example, an acidic functional group, for example, —COOH, —SO₃H, —PO(OH)(OM) and —B(OH)(OM) wherein M represents a hydrogen atom, a metal cation, an ammonium group, a phosphonium group, an iodonium group, a sulfonium group, a diazonium group or an azinium group is exemplified. In this case, it is believed that the functional group X and the functional group Y form an ionic bond due to an acid-base interaction and as a result, the compound having the functional group Y is fixed on the support, thereby decreasing the contact angle of water droplet in air on the surface of support.

The method for bringing the compound having the functional group X represented by formula (0) into contact with the compound having the functional group Y will be described in detail hereinafter in connection with the method of preparing a lithographic printing plate.

According to another preferable example of the compound having the functional group X, compounds having a functional group having a positive charge are exemplified. It is believed that the compound having a functional group having a positive charge as the functional group X interacts with a compound having a functional group having a negative charge as the functional group Y to form an ionic bond and as a result, the compound having the functional group Y is fixed on the support, thereby decreasing the contact angle of water droplet in air on the surface of support.

As the compound having a functional group having a positive charge, compounds having a functional group represented by any one of formulae (1) to (5) shown below are exemplified.

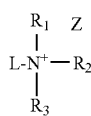
(1)

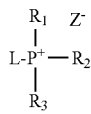
(2)

(3)

L—I⁺—R₁
  |
  Z⁻
(4)

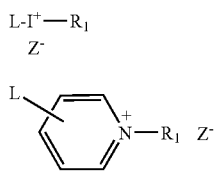
(5)

In formulae (1) to (5), $R_1$ to $R_3$ each independently represents a hydrogen atom, an alkyl group, an aryl group, an alkenyl group or an alkynyl group, L represents a divalent connecting group for connecting to a skeleton of the compound having the functional group X, and $Z^-$ represents a counter anion.

Of the compounds having a functional group represented by any one of formulae (1) to (5), the compounds having a functional group represented by formula (1) or (2) are preferable, and the compounds having a functional group represented by formula (1) are particularly preferable.

The alkyl group, aryl group, alkenyl group and alkynyl group represented by any one of $R_1$ to $R_3$ in formulae (1) to (5) are same as the alkyl group, aryl group, alkenyl group and alkynyl group represented by any one of $R_1$ to $R_3$ in formula (0) described above, respectively.

The divalent connecting group represented by L comprises from 1 to 60 carbon atoms, from 0 to 10 nitrogen atoms, from 0 to 50 oxygen atoms, from 1 to 100 hydrogen atoms and from 0 to 20 sulfur atoms. More specifically, L comprises a combination of structural units shown below.

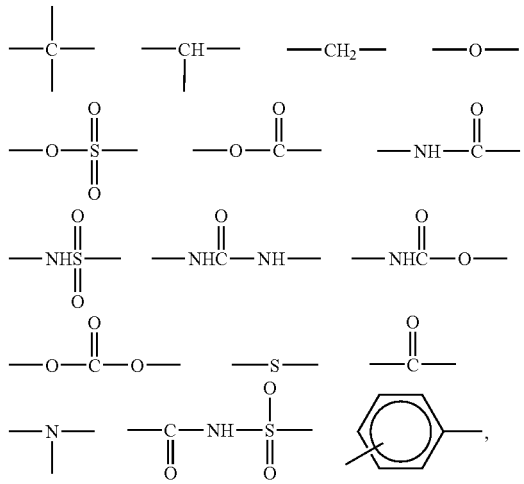

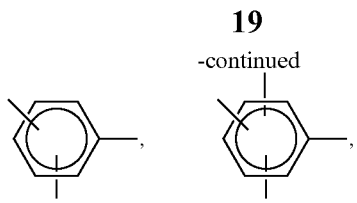

polyvalent naphthalene and polyvalent anthracene

When the divalent connecting group represented by L has a substituent group, examples of the substituent include an alkyl group having from 1 to 20 carbon atoms, for example, a methyl group or an ethyl group, an aryl group having from 6 to 16 carbon atoms, for example, a phenyl group or a naphthyl group, a hydroxy group, a carboxyl group, a sulfonamido group, an N-sulfonamido group, an acyloxy group having from 1 to 6 carbon atoms, for example, an actoxy group, an alkoxy group having from 1 to 6 carbon atoms, for example, a methoxy group or an ethoxy group, a halogen atom, for example, a chlorine atom or a bromine atom, an alkoxycarbonyl group having from 2 to 7 carbon atoms, for example, a methoxycarbonyl group, an ethoxycarbonyl group or a cyclohexyloxycarbonyl group and a cyano group.

As the counter anion represented by $Z^-$, any anion can be preferably used. Specific examples of the counter anion include a halogen ion (for example, $F^-$, $Cl^-$, $Br^-$ or $I^-$), a nitrate ion ($NO_3^-$), a sulfate ion ($SO_4^{2-}$), a hydrogen sulfate ion ($HSO_4^{2-}$), a phosphate ion ($PO_4^{3-}$), a hydrogen phosphate ion ($HPO_4^{2-}$), a dihydrogen phosphate ion ($H_2PO_4^-$), a hypohalite ion (for example, $ClO^-$ or $BrO_3^-$), a halite ion (for example, $ClO_2^-$ or $BrO_2^-$), a halate ion (for example, $ClO_3^-$ or $BrO_3^-$), a perhalate ion (for example, $ClO_4^-$, $BrO_4^-$ or $IO_4^-$), a tetrahalogenoborate ion (for example, $BF_4^-$), a tetraaryl borate ion (for example, $Ph_4B^-$), a hexahalogenophosphate ion (for example, $PF_6^-$), and a carboxylate ion, a benzoate anion, a carbonamide ion, a sulfonate ion, a sulfinate ion, a thiosulfonate ion, a sulfonimide ion, a sulfate ester ion, a sulfate amide ion, a phosphate ester ion, a phosphate diester ion, a phosphonate ion and a phosphonate ester ion represented by structural formulae shown below, respectively. Among them, a perhalate ion, a hexahalogenophosphate ion, a tetrahalogenoborate ion, a tetraaryl borate ion, a sulfonate ion, a sulfinate ion, a carboxylate ion, a halogen ion, a nitrate ion, a sulfate ion and a sulfonimide ion are preferable, and a sulfonate ion, a carboxylate ion, a tetrafluoroborate ion, a hexafluorophosphate ion and a sulfonimide ion are more preferable.

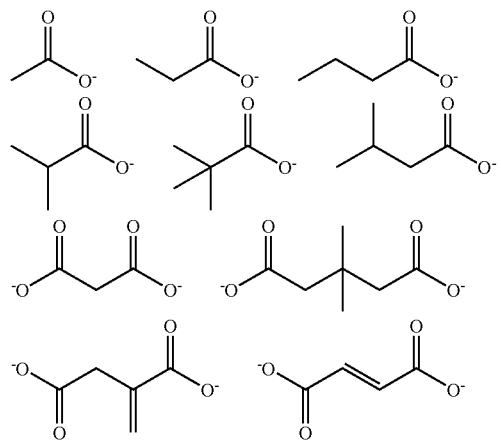

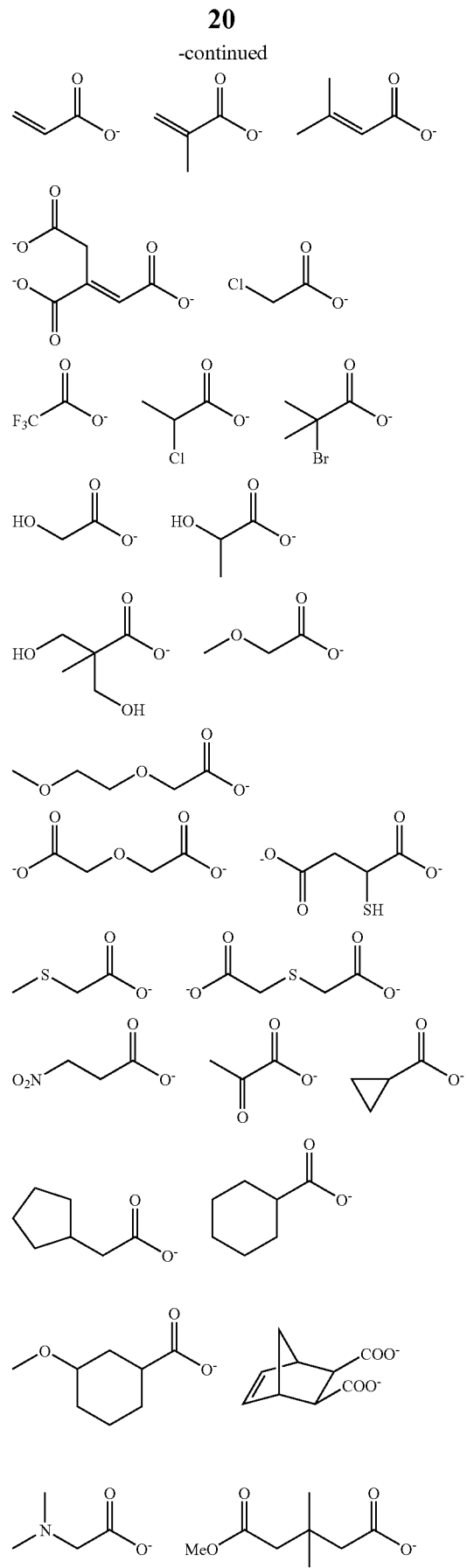

-continued
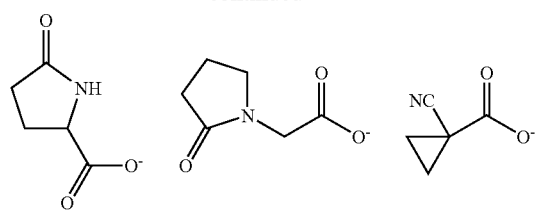
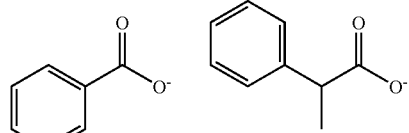
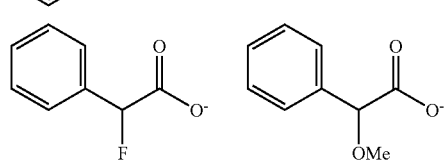
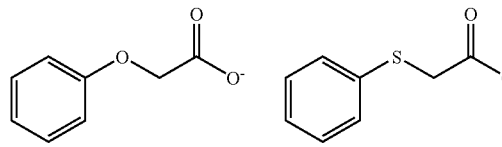
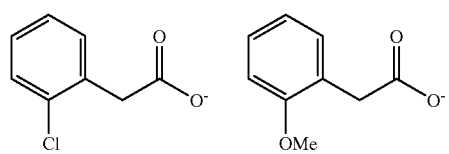
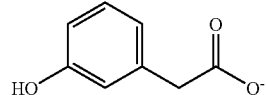
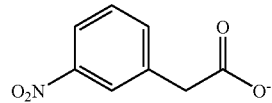
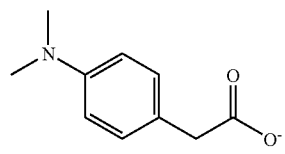
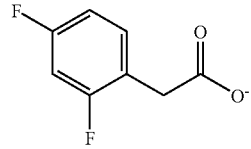
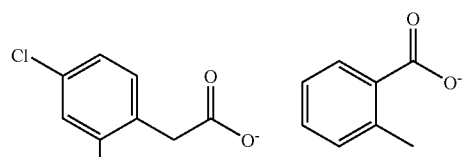
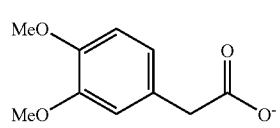
-continued
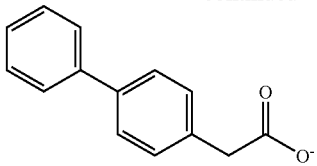
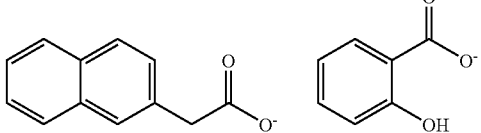
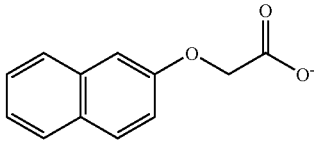
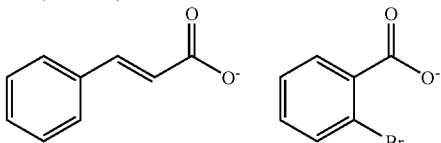
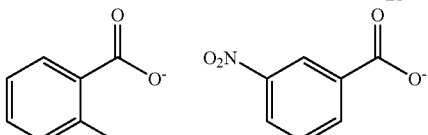
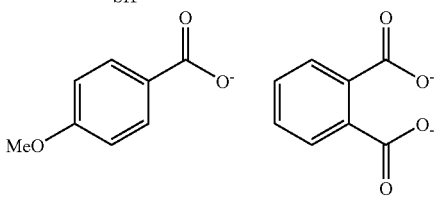
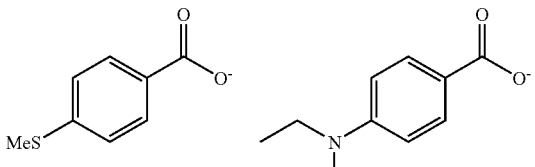
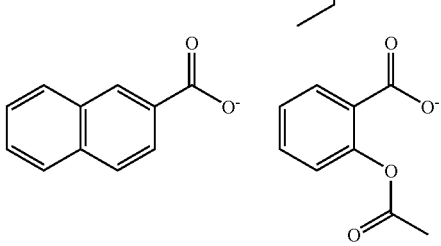
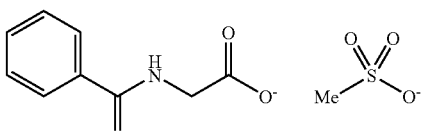
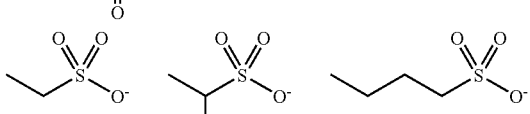
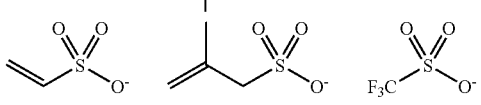

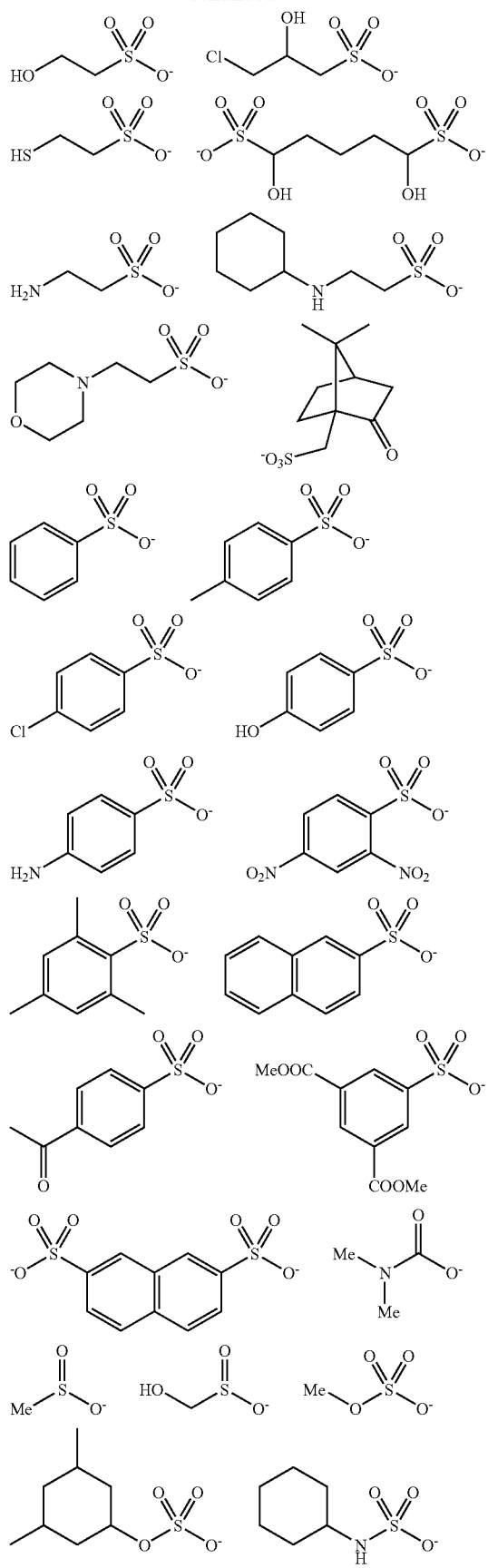
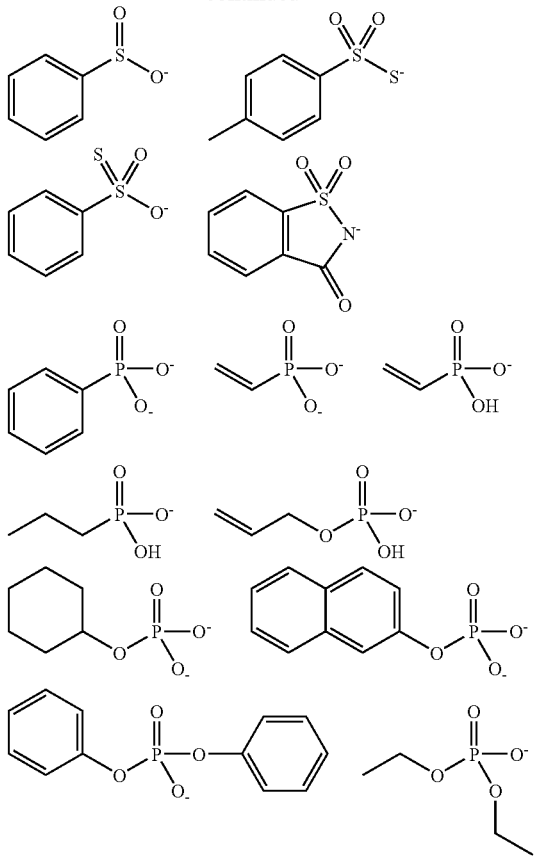

As the skeleton of the compound having the functional group represented by any one of formulae (1) to (5), any skeleton of organic compounds having a molecular weight of 150 or more may be preferably used. A skeleton of a polymer compound having a weight average molecular weight of 1,000 or more is preferable, a skeleton of a polymer compound having a weight average molecular weight of 5,000 or more is more preferable, and a skeleton of a polymer compound having a weight average molecular weight of 10,000 or more is particularly preferable. As the skeleton of a polymer compound, a known resin, for example, an acrylic resin, a methacrylic resin, a styrene resin, an ester resin, an amide resin, a urethane resin, a urea resin, a vinyl resin, a novolac resin, an epoxy resin or a carbonate resin can be used, an acrylic resin, a methacrylic resin, a styrene resin, an ester resin, an amide resin, a urethane resin, a urea resin or a vinyl resin is preferable, and an acrylic resin, a methacrylic resin, a styrene resin or a urethane resin is more preferable.

Of the compound having the functional group represented by any one of formulae (1) to (5), the amount of the functional group represented by any one of formulae (1) to (5) is preferably from 0.01 to 50 mmol/g, more preferably from 0.05 to 25 mmol/g, particularly preferably from 0.1 to 10 mmol/g. Two or more of the functional groups represented by any one of formulae (1) to (5) may be contained in the compound.

It is preferred that the compound having the functional group represented by any one of formulae (1) to (5) further has a functional group capable of interacting with the surface of support. By the introduction of the functional group capable of interacting with the surface of support, printing durability of the image area and stain resistance in the non-image area are further improved. With respect to the functional group capable of interacting with the surface of support, the descriptions on the functional group capable of interacting with the surface of support in the compound having the functional group represented by formula (0) are incorporated.

It is preferred that the compound having the functional group represented by any one of formulae (1) to (5) further has a functional group capable of interacting with the photosensitive layer. By the introduction of the functional group capable of interacting with the photosensitive layer, printing durability is further improved. With respect to the functional group capable of interacting with the photosensitive layer, the descriptions on the functional group capable of interacting with the photosensitive layer in the compound having the functional group represented by formula (0) are incorporated.

Specific examples of the compound having the functional group represented by any one of formulae (1) to (5) for use in the invention are set forth below, but the invention should not be construed as being limited thereto.

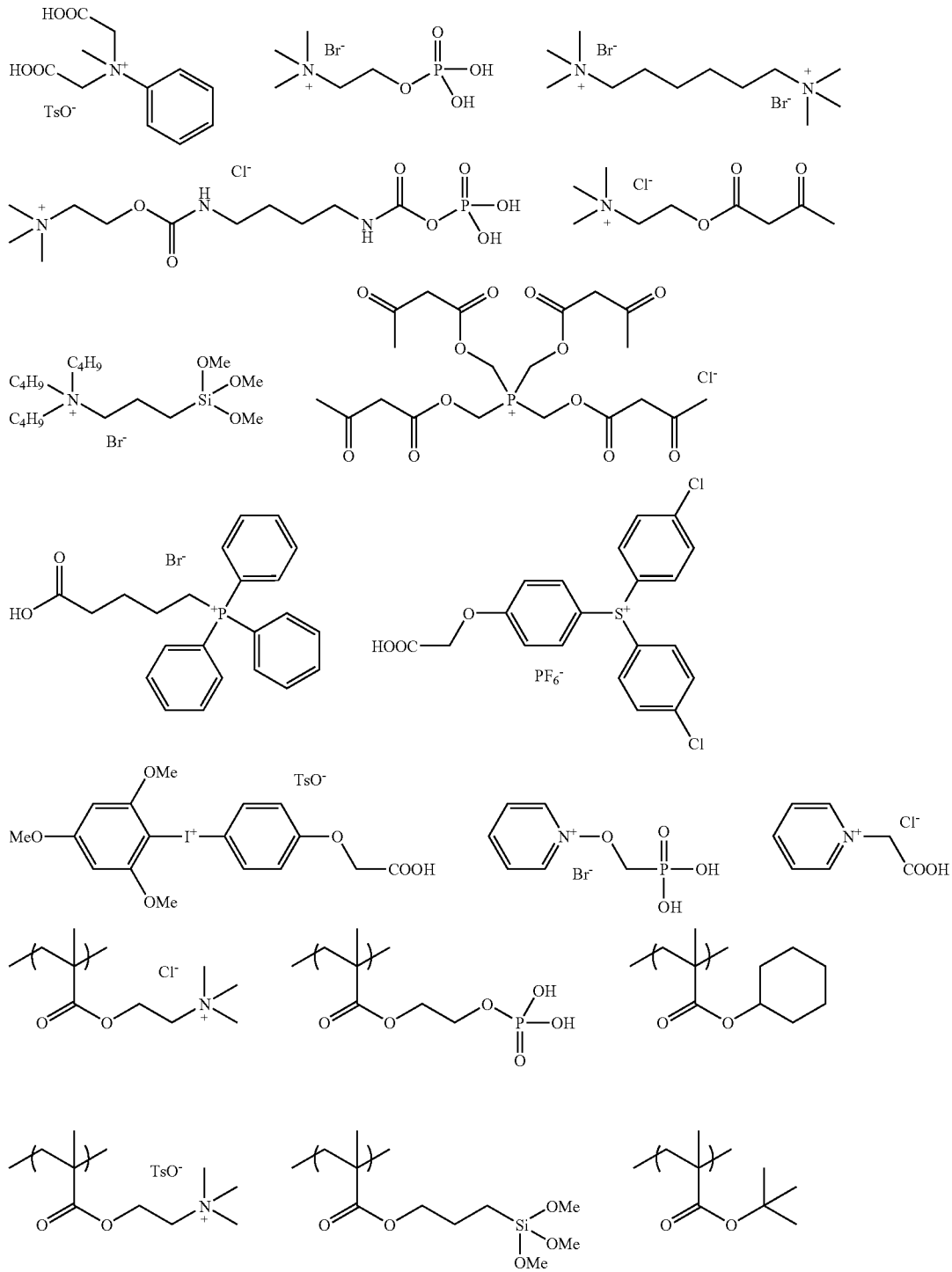

-continued
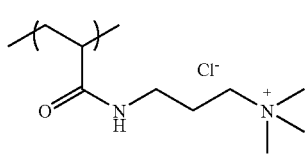 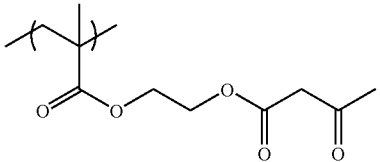
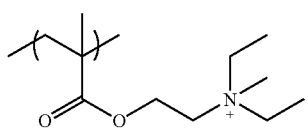 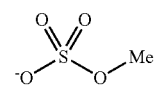 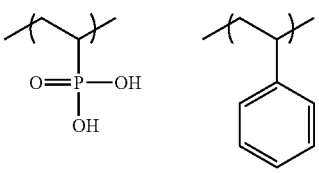 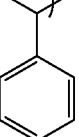
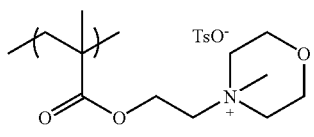 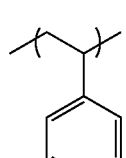 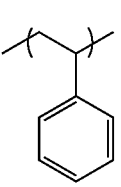
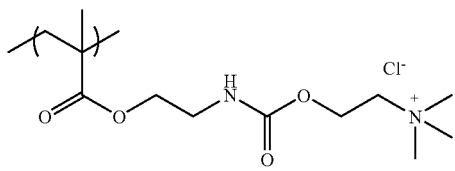 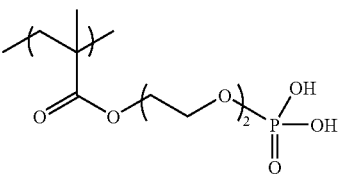 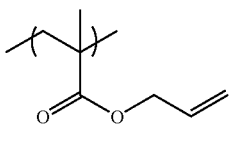
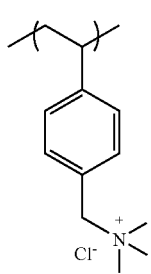 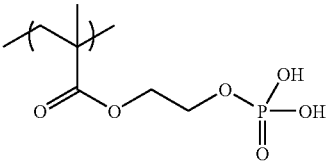 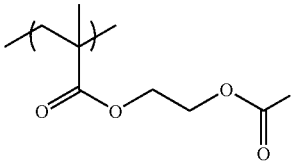
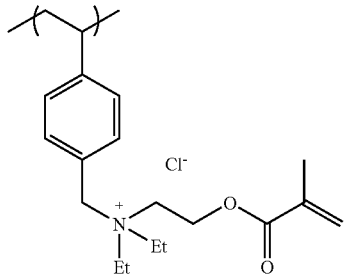 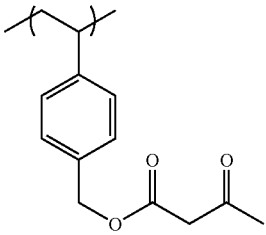
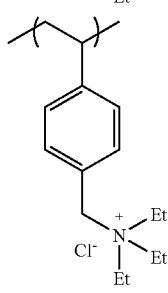 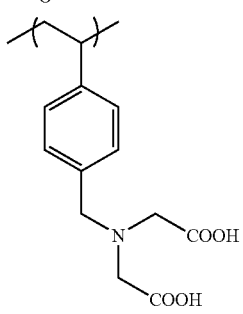 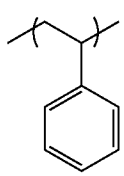

-continued
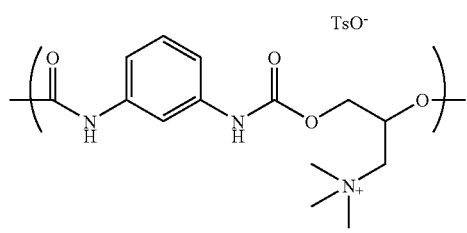
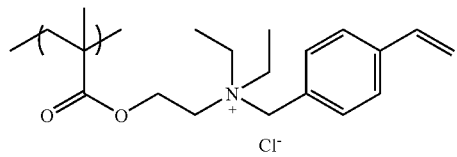
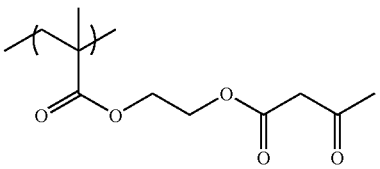
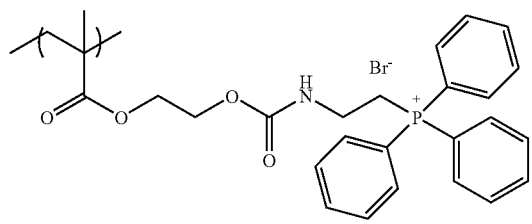
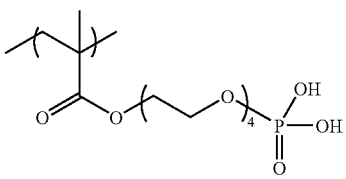
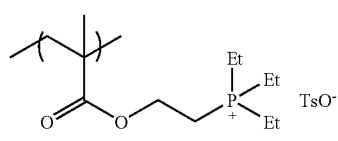
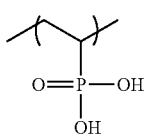
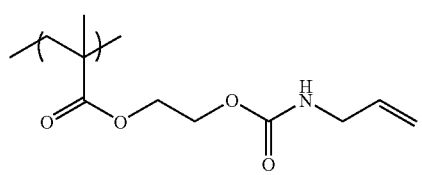
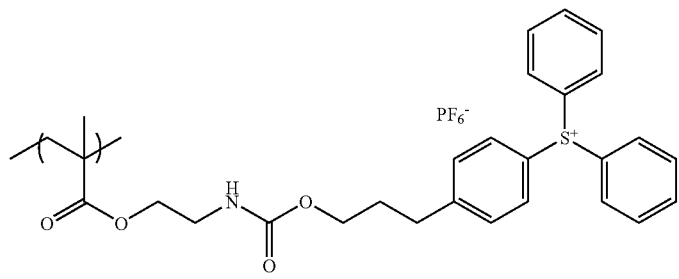
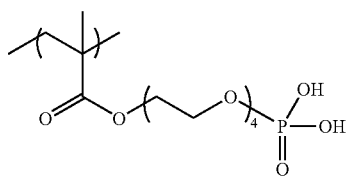
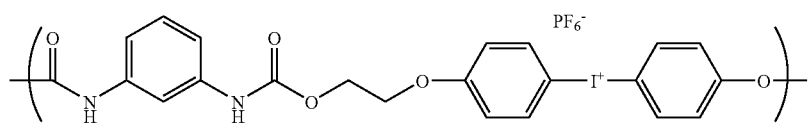
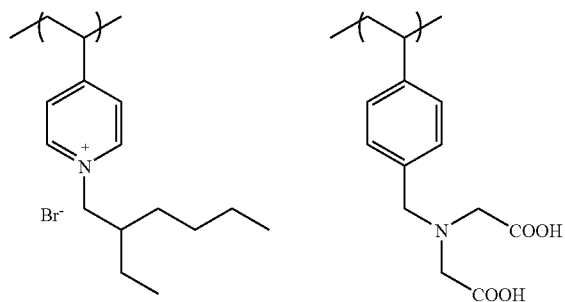

The compounds having the functional group represented by any one of formulae (1) to (5) for use in the invention may be used individually or as a mixture of two or more thereof.

The amount of the compound having the functional group represented by any one of formulae (1) to (5) on the support is preferably from 1 to 100 mg/ml, more preferably from 2 to 80 mg/m$^2$, particularly preferably from 3 to 50 mg/m$^2$ in view of improvements in the printing durability and stain resistance.

As the functional group Y capable of interacting with the functional group X represented by any one of formulae (1) to (5), specifically, for example, functional groups represented by any one of formulae (6) to (8) shown below are exemplified.

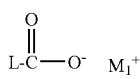
(6)

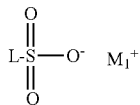
(7)

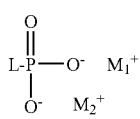
(8)

In formulae (6) to (8), $M_1^+$ and $M_2^+$ each independently represents a counter cation, and L represents a divalent connecting group for connecting to a skeleton of the compound having the functional group Y.

Specific examples of the counter cation represented by any one of $M_1^+$ and $M_2^+$ in formulae (6) to (8) include a hydrogen ion, a metal ion (for example, Na$^+$, K$^+$, Li$^+$, Ca$^{2+}$, Mg$^{2+}$, Fe$^{2+}$ or Cu$^+$), an ammonium ion, an iodonium ion, a phosphonium ion, a sulfonium ion, a diazonium ion and an azinium ion, and a hydrogen ion, a metal ion, an ammonium ion and a phosphonium ion are preferable.

The details of the divalent connecting group represented by L are same as those described for the divalent connecting group represented by L in formulae (1) to (5) above.

The method for bringing the compound having the functional group X represented by any one of formulae (1) to (5) into contact with the compound having the functional group Y represented by any one of formulae (6) to (8) will be described in detail hereinafter in connection with the method of preparing a lithographic printing plate.

According to still another preferable example of the compound having the functional group X, compounds having a functional group having a negative charge are exemplified. It is believed that the compound having a functional group having a negative charge as the functional group X interacts with a compound having a functional group having a positive charge as the functional group Y to form an ionic bond and as a result, the compound having the functional group Y is fixed on the support, thereby decreasing the contact angle of water droplet in air on the surface of support.

As the compound having a functional group having a negative charge, compounds having a functional group represented by any one of formulae (9) to (11) shown below are exemplified.

(9)

(10)

(11)

In formulae (9) to (11), $M_1^+$, $M_2^+$ and L have the same meanings as $M_1^+$, $M_2^+$ and L in formulae (6) to (8), respectively.

The details of the cation represented by any one of $M_1^+$ and $M_2^+$ and the divalent connecting group represented by L are same as those described for the cation represented by any one of $M_1^+$ and $M_2^+$ and the divalent connecting group represented by L in formulae (6) to (8) above, respectively.

As the skeleton of the compound having the functional group represented by any one of formulae (9) to (11), any skeleton of organic compounds having a molecular weight of 150 or more may be preferably used. A skeleton of a polymer compound having a weight average molecular weight of 1,000 or more is preferable, a skeleton of a polymer compound having a weight average molecular weight of 5,000 or more is more preferable, and a skeleton of a polymer compound having a weight average molecular weight of 10,000 or more is particularly preferable. As the skeleton of a polymer compound, a known resin, for example, an acrylic resin, a methacrylic resin, a styrene resin, an ester resin, an amide resin, a urethane resin, a urea resin, a vinyl resin, a novolac resin, an epoxy resin or a carbonate resin can be used, an acrylic resin, a methacrylic resin, a styrene resin, an ester resin, an amide resin, a urethane resin, a urea resin or a vinyl resin is preferable, and an acrylic resin, a methacrylic resin, a styrene resin or a urethane resin is more preferable.

Of the compound having the functional group represented by any one of formulae (9) to (11), the amount of the functional group represented by any one of formulae (9) to (11) is preferably from 0.01 to 50 mmol/g, more preferably from 0.05 to 25 mmol/g, particularly preferably from 0.1 to 10 mmol/g. Two or more of the functional groups represented by any one of formulae (9) to (11) may be contained in the compound.

It is preferred that the compound having the functional group represented by any one of formulae (9) to (11) further has a functional group capable of interacting with the surface of support. By the introduction of the functional group capable of interacting with the surface of support, printing durability of the image area and stain resistance in the non-image area are further improved. With respect to the functional group capable of interacting with the surface of support, the descriptions on the functional group capable of interacting with the surface of support in the compound having the functional group represented by formula (0) are incorporated.

It is preferred that the compound having the functional group represented by any one of formulae (9) to (11) further has a functional group capable of interacting with the photosensitive layer. By the introduction of the functional group capable of interacting with the photosensitive layer, printing durability is further improved. With respect to the functional group capable of interacting with the photosensitive layer, the descriptions on the functional group capable of interacting with the photosensitive layer in the compound having the functional group represented by formula (0) are incorporated.

Specific examples of the compound having the functional group represented by any one of formulae (9) to (11) for use in the invention are set forth below, but the invention should not be construed as being limited thereto.

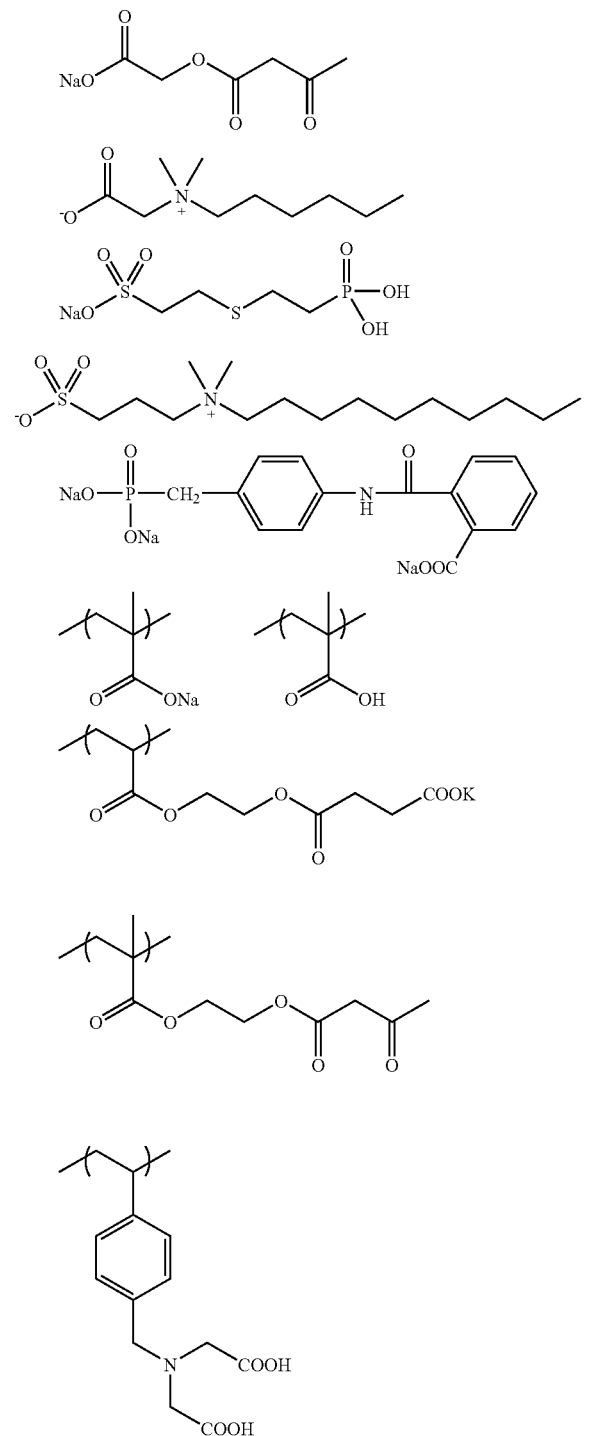

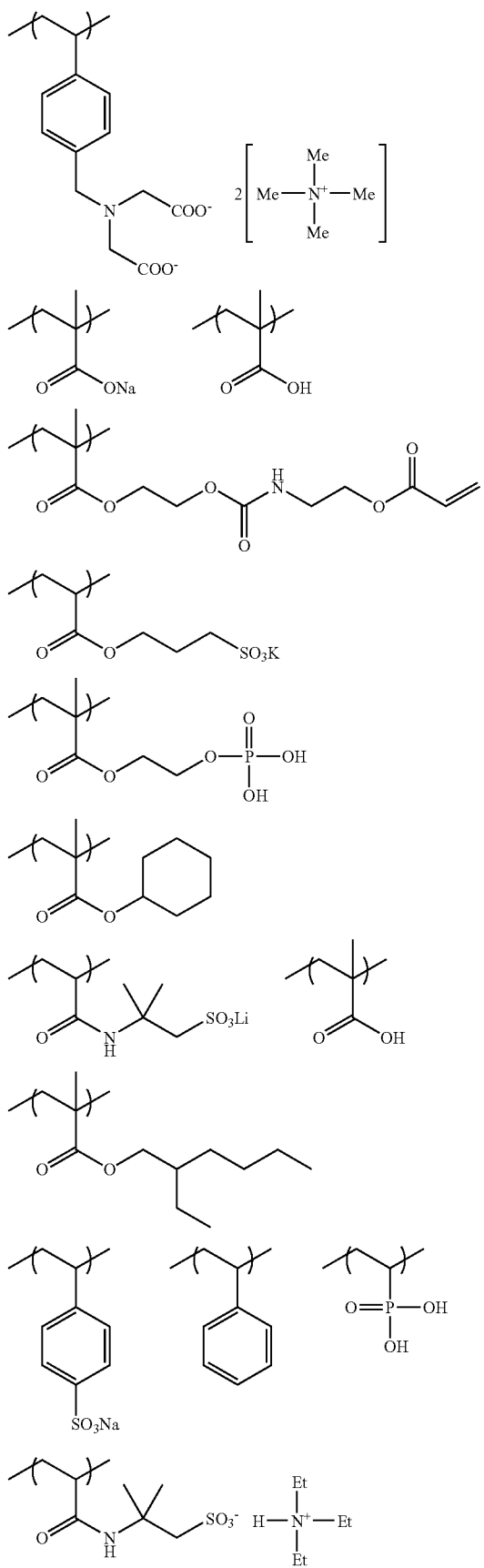

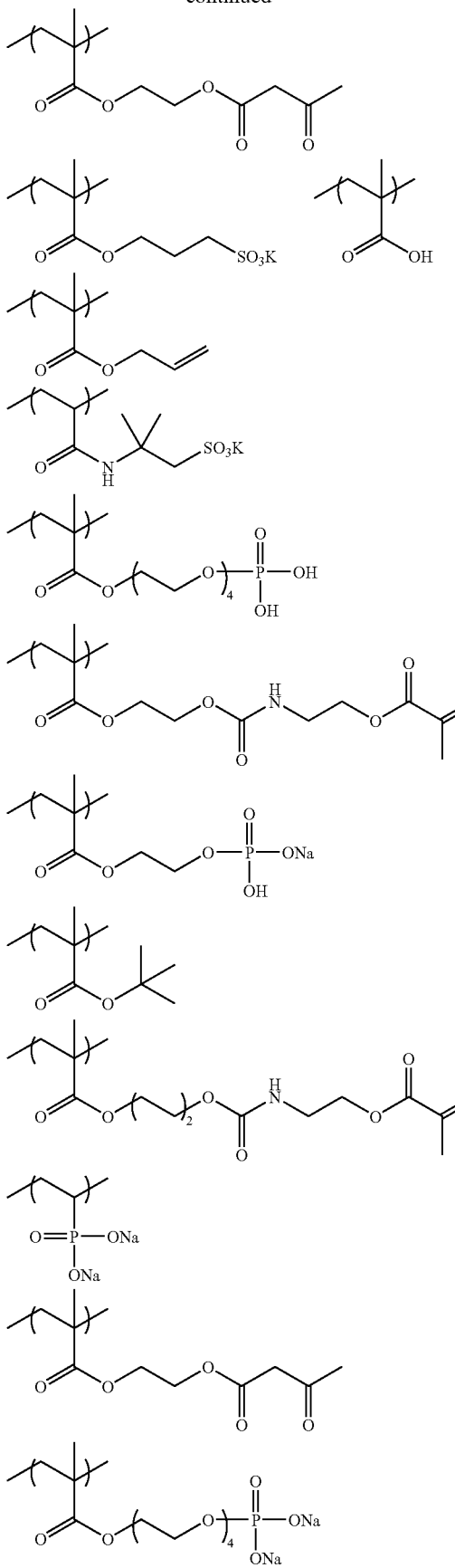
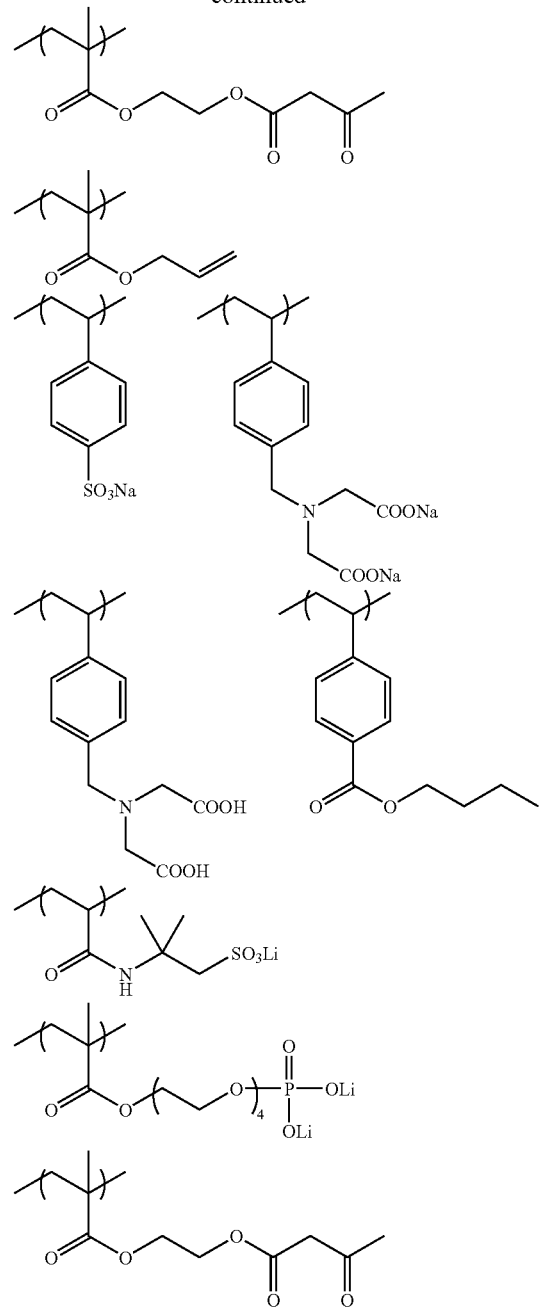

The compounds having the functional group represented by any one of formulae (9) to (11) for use in the invention may be used individually or as a mixture of two or more thereof.

The amount of the compound having the functional group represented by any one of formulae (9) to (11) on the support is preferably from 1 to 100 mg/m$^2$, more preferably from 2 to 80 mg/m$^2$, particularly preferably from 3 to 50 mg/m$^2$ in view of improvements in the printing durability and stain resistance.

As the functional group Y capable of interacting with the functional group X represented by any one of formulae (9) to (11), specifically, for example, functional groups represented by any one of formulae (12) to (16) shown below are exemplified.

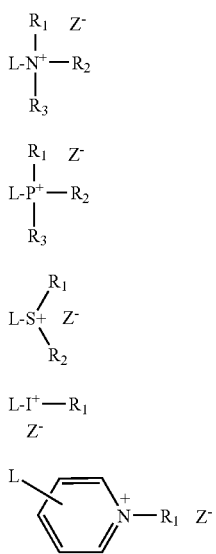

(12)
(13)
(14)
(15)
(16)

In formulae (12) to (16), $R_1$ to $R_3$, L and $Z^-$ have the same meanings as $R_1$ to $R_3$, L and $Z^-$ in formulae (1) to (5), respectively.

The details of the groups represented by any one of $R_1$ to $R_3$ and the divalent connecting group represented by L in formulae (12) to (16) are same as those described for the groups represented by any one of $R_1$ to $R_3$ and the divalent connecting group represented by L in formulae (1) to (5) above, respectively.

As the counter anion represented by $Z^-$, any anion can be preferably used. Specific examples of the counter anion include the anions described with respect to the counter anion in formulae (1) to (5) above. Among them, a perhalate ion, a hexahalogenophosphate ion, a tetrahalogenoborate ion, a tetraaryl borate ion, a sulfonate ion, a sulfinate ion, a carboxylate ion, a halogen ion, a nitrate ion, a sulfate ion and a sulfonimide ion are preferable, and a sulfonate ion, a carboxylate ion, a tetrafluoroborate ion, a hexafluorophosphate ion, a sulfonimide ion, a sulfate ion and a halogen ion are more preferable.

The method for bringing the compound having the functional group X represented by any one of formulae (9) to (11) into contact with the compound having the functional group Y represented by any one of formulae (12) to (16) will be described in detail hereinafter in connection with the method of preparing a lithographic printing plate.

The preparation of the support having on its surface the compound having the functional group X can be performed in a conventional manner, for example, a method of coating the compound having the functional group X on a support substrate or a method of immersing a support substrate in a solution containing the compound having the functional group X. Specifically, a method wherein the compound having the functional group X is dissolved or dispersed in an appropriate solvent, for example, toluene, xylene, benzene, hexane, heptane, cyclohexane, diethyl ether, diisopropyl ether, dimethoxyethane, anisol, tetrahydrofuran, methylene chloride, chloroform, ethylene dichloride, chlorobenzene, ethyl acetate, butyl acetate, methyl lactate, ethyl lactate, acetone, methyl ethyl ketone, cyclohexanone, methanol, ethanol, propanol ethylene glycol monomethyl ether, 1-methoxy-2-propanol, 2-methoxyethyl acetate, 1-methoxy-2-propyl acetate, N,N-dimethylacetamide, N,N-dimethylformamide, tetramethylurea, N-methylpyrrolidone, dimethylsulfoxide, sulfolane, γ-butyrolactone or water, and if desired, a component, for example, a surfactant is added to prepare a coating solution or a immersing solution, and the coating solution is coated on the support or the support is immersed in the immersing solution, followed by drying. The preparation method of the coating solution or immersing solution, coating method, immersing method and drying method and the like can be appropriately determined by the person skilled in the art.

The support having on its surface the compound having the functional group X has a contact angle of water droplet in air of 70° or more on its surface. The measurement of the contact angle of water droplet in air on the surface of support can be carried out according to the following method. Specifically, under atmosphere of 25° C., 1 to 3 μl of distilled water is dropped on a support to be measured and after a lapse of 60 seconds for stabilization, the contact angle of water droplet in air on the surface of support is measured using a contact angle meter DAC-VZ produced by Kyowa Interface Science Co., Ltd.

The contact angle of water droplet in air on the surface of support is preferably 75° or more, more preferably 80° or more.

The support for use in the lithographic printing plate precursor according to the invention is not particularly restricted as long as it has the characteristic described above and it is a dimensionally stable plate-like support. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film) and paper or a plastic film laminated or deposited with the metal described above. Preferable examples of the support include a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials known and used conventionally can be appropriately utilized.

The thickness of the aluminum support is preferably from 0.1 to 0.6 mm, more preferably from 0.15 to 0.4 mm, still more preferably from 0.2 to 0.3 mm.

Prior to the use of aluminum plate, a surface treatment, for example, roughening treatment or anodizing treatment is preferably performed. The surface treatment enlarges the range of change in the contact angle according to the invention, facilitates to ensure adhesion between the photosensitive layer and the support and improve the stain resistance. In advance of the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, a ball grinding method, a brush grinding method, a blast grinding method or a buff grinding method can be used.

The electrochemical roughening treatment method includes, for example, a method of conducting it by passing alternating current or direct current in an electrolyte containing an acid, for example, hydrochloric acid or nitric acid. Also, a method of using a mixed acid described in JP-A-54-63902 can be used.

The aluminum plate after the roughening treatment is then subjected, if desired, to an alkali etching treatment using an aqueous solution, for example, of potassium hydroxide or sodium hydroxide and further subjected to a neutralizing treatment, and then subjected to an anodizing treatment in order to enhance the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions of the anodizing treatment are varied depending on the electrolyte used, they cannot be defined generally. However, it is ordinarily preferred that electrolyte concentration in the solution is from 1 to 80% by weight, liquid temperature is from 5 to 70° C., current density is from 5 to 60 A/dm$^2$, voltage is from 1 to 100 V, and electrolysis time is from 10 seconds to 5 minutes. The amount of the anodized film formed is preferably from 1.0 to 5.0 g/m$^2$ and more preferably from 1.5 to 4.0 g/m$^2$. In the range described above, good printing durability and preferable scratch resistance in the non-image area of lithographic printing plate can be achieved.

The aluminum plate subjected to the surface treatment and having the anodized film is used as it is as the support in the invention. However, in order to more improve adhesion to a layer provided thereon, hydrophilicity after the treatment with an aqueous solution having pH of 2 to 10, resistance to stain, heat insulating property or the like, other treatment, for example, a treatment for enlarging micropores or a sealing treatment of micropores of the anodized film described in JP-A-2001-253181 and JP-A-2001-322365, or a surface hydrophilizing treatment by immersing in an aqueous solution containing a hydrophilic compound, may be appropriately conducted. Needless to say, the enlarging treatment and sealing treatment are not limited to those described in the above-described patents and any conventionally known method may be employed.

As the sealing treatment, as well as a sealing treatment with steam, a sealing treatment with an aqueous solution containing an inorganic fluorine compound, for example, fluorozirconic acid alone or sodium fluoride, a sealing treatment with steam having added thereto lithium chloride or a sealing treatment with hot water may be employed.

Among them, the sealing treatment with an aqueous solution containing an inorganic fluorine compound, the sealing treatment with water vapor and a sealing treatment with hot water are preferred.

The hydrophilizing treatment includes an alkali metal silicate method described in U.S. Pat. Nos. 2,714,066, 3,181,461, 3,280,734 and 3,902,734. In the method, the support is subjected to an immersion treatment or an electrolytic treatment in an aqueous solution, for example, of sodium silicate. In addition, the hydrophilizing treatment includes, for example, a method of treating with potassium fluorozirconate described in JP-B-36-22063 and a method of treating with polyvinylphosphonic acid described in U.S. Pat. Nos. 3,276,868, 4,153,461, and 4,689,272.

Further, in the case of using, for example, a polyester film as the support in the invention, it is preferred to provide an antistatic layer on one side or both sides thereof. When the antistatic layer is provided between the support and the layer containing the compound having the functional group X, it also contributes to improve the adhesion of the layer containing the compound having the functional group X to the support. As the antistatic layer, a polymer layer having fine particles of metal oxide or a matting agent dispersed therein described in JP-A-2002-79772 can be used.

The support preferably has a center line average roughness of 0.10 to 1.2 μm. In the range described above, good adhesion to the photosensitive layer, good printing durability, and good stain resistance can be achieved.

The color density of the support is preferably from 0.15 to 0.65 in terms of the reflection density value. In the range described above, good image-forming property by preventing halation at the image exposure and good aptitude for plate inspection after development can be achieved.

The support according to the invention prepares a lithographic printing plate precursor by forming a photosensitive layer thereon. In particular, when it is used as a support for lithographic printing plate precursor of a simple processing type having a photosensitive layer capable of being developed with an aqueous solution having pH of 2 to 10, the lithographic printing plate precursor exerting excellent printing durability and stain resistance can be provided.

[Lithographic Printing Plate Precursor]

The lithographic printing plate precursor according to the invention comprises a photosensitive layer on the support having a surface, a contact angle of water droplet in air on which is 70° or more described above. Lithographic printing plate precursors may be classified into (1) a radical polymerization type lithographic printing plate precursor, (2) a heat fusion type lithographic printing plate precursor and (3) a polarity conversion type lithographic printing plate precursor mainly depending on the characteristics of the photosensitive layer (hereinafter, also referred to as an "image-forming layer") and the lithographic printing plate precursor according to the invention can be used as any of these types.

First, the radical polymerization type lithographic printing plate precursor is described below.

[Photosensitive Layer]

The photosensitive layer of the radical polymerization type lithographic printing plate precursor contains a polymerizable compound, a polymerization initiator, a binder polymer, a sensitizing dye and other components. The components constituting the photosensitive layer are described below, respectively.

(Polymerizable Compound)

The polymerizable compound for use in the photosensitive layer of the lithographic printing plate precursor according to the invention is an addition-polymerizable compound having at least one ethylenically unsaturated double bond, and it is selected from compounds having at least one, preferably two or more, terminal ethylenically unsaturated double bonds. Such compounds are widely known in the art and they can be used in the invention without any particular limitation. The compound has a chemical form, for example, a monomer, a prepolymer, specifically, a dimer, a trimer or an oligomer, or a copolymer thereof, or a mixture thereof. Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, isocyanuric acid ethylene oxide (EO) modified triacrylate or polyester acrylate oligomer;

methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl] dimethylmethane or bis[p-(methacryloxyethoxy)phenyl] dimethylmethane;

itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate;

crotonic acid esters, for example, ethylene glycol dicrotonate, tetramethylene glycol dicrotonate, pentaerythritol dicrotonate or sorbitol tetracrotonate;

isocrotonic acid esters, for example, ethylene glycol diisocrotonate, pentaerythritol diisocrotonate or sorbitol tetraisocrotonate;

and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferable examples of the amide monomer include amides having a cyclohexylene structure described in JP-B-54-21726.

Urethane type addition-polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B48-41708.

$$CH_2\!=\!C(R_4)COOCH_2CH(R_5)OH \qquad (A)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Further, a photopolymerizable composition having remarkably excellent photo-speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with (meth)acrylic acid, described in JP-A-48-64183, JP-B-49-43191 and JP-B-52-30490. Specific unsaturated compounds described in JP-B-4643946, JP-B-140337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyokaishi* (*Journal of Japan Adhesion Society*), Vol. 20, No. 7, pages 300 to 308 (1984) can also be used.

Details of the method of using the polymerizable compound, for example, selection of the structure, individual or combination use or an amount added, can be appropriately determined in accordance with the characteristic design of the final lithographic printing plate precursor. For instance, the polymerizable compound is selected from the following standpoints.

In view of the sensitivity, a structure having a large content of unsaturated group per molecule is preferred and in many cases, a difunctional or more functional compound is preferred. Also, in order to increase the strength of the image area, that is, hardened layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization initiator or a coloring agent) in the photosensitive layer. For instance, the compatibility may be improved in some cases by using the compound of low purity or using two or more kinds of the compounds in combination. Further, a specific structure may be selected for the purpose of improving an adhesion property to a support, a protective layer or the like described hereinafter.

The polymerizable compound is used preferably in a range from 5 to 80% by weight, more preferably in a range from 25 to 75% by weight, based on the total solid content of the photosensitive layer. The polymerizable compounds may be used individually or in combination of two or more thereof. In the method of using the polymerizable compound, the structure, blend and amount added can be appropriately selected by taking account of the degree of polymerization inhibition due to oxygen, resolution, fogging property, change in refractive index, surface tackiness and the like. Further, depending on the case, a layer construction, for example, an undercoat layer or an overcoat layer, and a coating method, may also be considered.

(Polymerization Initiator)

The polymerization initiator for use in the photosensitive layer according to the invention is a compound which generates a radical with light energy or heat energy to initiate or accelerate polymerization of a compound having a polymerizable unsaturated group. The polymerization initiator is appropriately selected to use, for example, from known polymerization initiators and compounds containing a bond having small bond dissociation energy.

The polymerization initiators include, for example, organic halogen compounds, carbonyl compounds, organic peroxides, azo compounds, azido compounds, metallocene compounds, hexaarylbiimidazole compounds, organic boron compounds, disulfone compounds, oxime ester compounds and onium salt compounds.

The organic halogen compounds described above specifically include, for example, compounds described in Wakabayashi et al., *Bull. Chem. Soc. Japan*, 42, 2924 (1969), U.S. Pat. No. 3,905,815, JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, *Journal of Heterocyclic Chemistry*, 1, No. 3 (1970). Among them, oxazole compounds and s-triazine compounds each substituted with a trihalomethyl group are preferable.

More preferably, s-triazine derivatives in which at least one of mono-, di- or tri-halogen substituted methyl group is connected to the s-triazine ring and oxadiazole derivatives in which at least one of mono-, di- or tri-halogen substituted methyl group is connected to the oxadiazole ring are exemplified. Specific examples thereof include 2,4,6-tris (monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis (trichloromethyl)-s-triazine, 2-(α,α,β-trichloroethyl)-4,6-bis (trichloromethyl)-s-triazine, 2-(3,4-epoxyphenyl)-4,6-bis (trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl-4,6-bis (trichloromethyl)-s-triazine, 2-(p-isopropyloxystyryl-4,6-bis (trichloromethyl)-s-triazine, 2-(p-tolyl)-4,6-bis (trichloromethyl)-s-triazine, 2-(4-methoxynaphthyl)-4,6-bis (trichloromethyl)-s-triazine, 2-phenylthio-4,6-bis (trichloromethyl)-s-triazine, 2-benzylthio-4,6-bis (trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis (tribromomethyl)-s-triazine and compounds shown below.

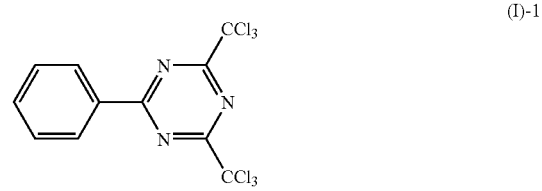

(I)-1

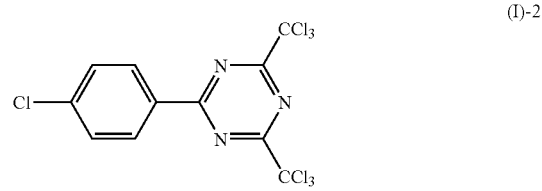

(I)-2

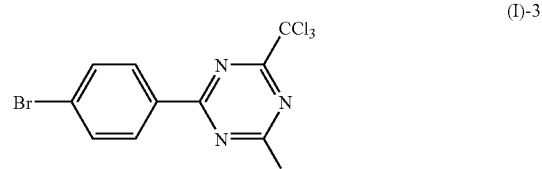

(I)-3

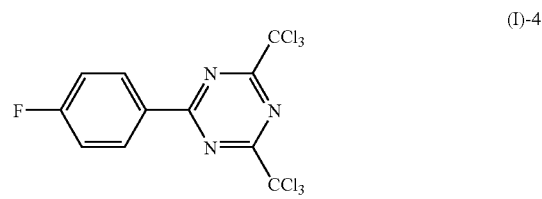

(I)-4

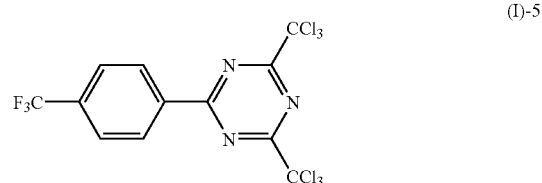

(I)-5

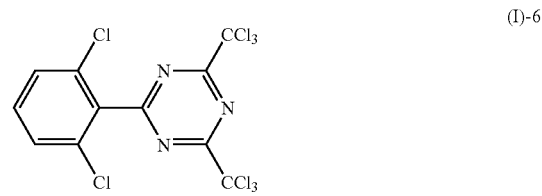

(I)-6

-continued
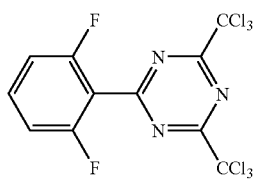
(I)-7
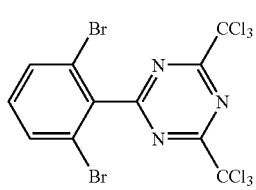
(I)-8
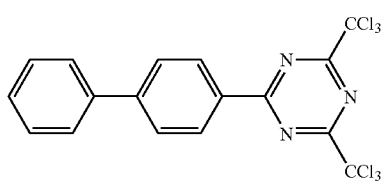
(I)-9
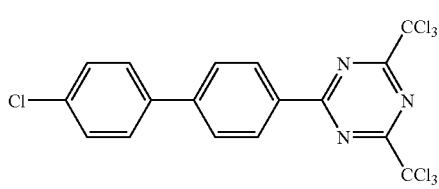
(I)-10
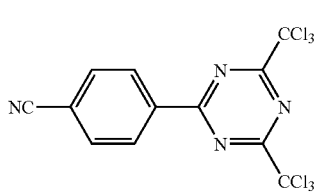
(I)-11
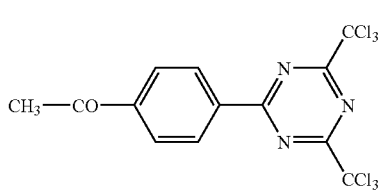
(I)-12
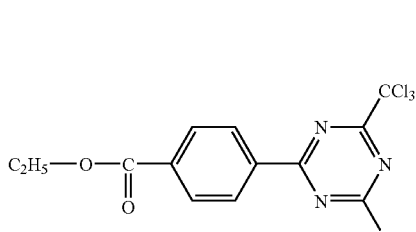
(I)-13
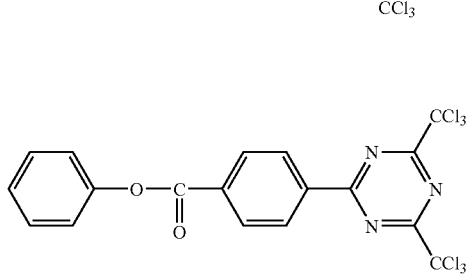
(I)-14
-continued
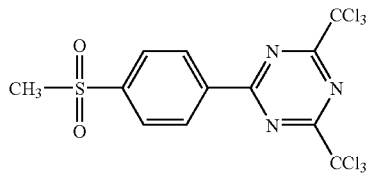
(I)-15
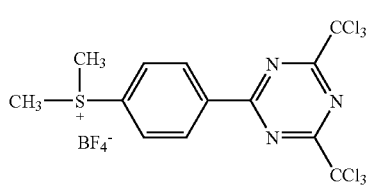
(I)-16
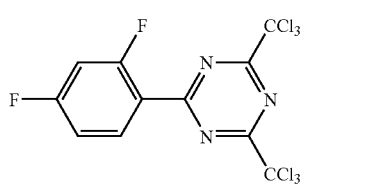
(I)-17
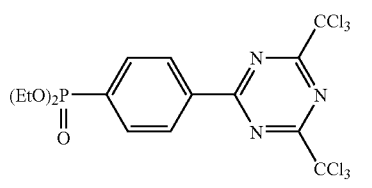
(I)-18
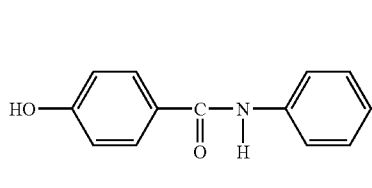
(I)-19
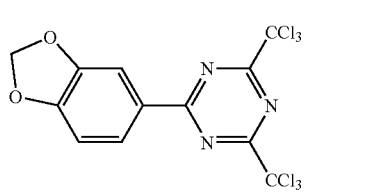
(I)-20
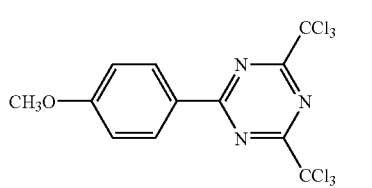
(I)-21
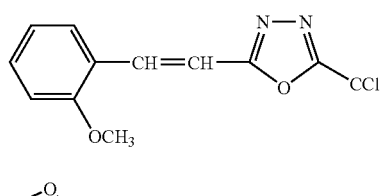
(I)-22
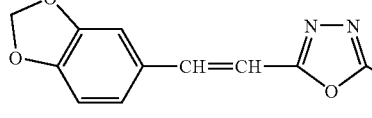
(I)-23

-continued

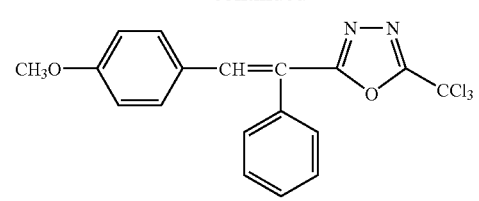
(I)-24

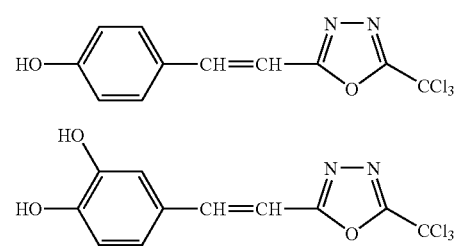
(I)-25

(I)-26

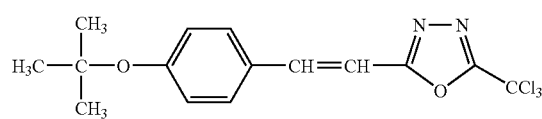
(I)-27

The carbonyl compounds described above include, for example, benzophenone derivatives, e.g., benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, e.g., 2,2-dimethoxy-2-phenylacetophenone, 2,2-diethoxyacetophenone, 1-hydroxycyclohexylphenylketone, α-hydroxy-2-methylphenylpropane, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propane or 1,1,1,-trichloromethyl-(p-butylphenyl)ketone, thioxantone derivatives, e.g., thioxantone, 2-ethylthioxantone, 2-isopropylthioxantone, 2-chlorothioxantone, 2,4-dimethylthioxantone, 2,4-diethylthioxantone or 2,4-diisopropylthioxantone, and benzoic acid ester derivatives, e.g., ethyl p-dimethylaminobenzoate or ethyl p-diethylaminobenzoate.

The azo compounds described above include, for example, azo compounds described in JP-A-8-108621.

The organic peroxides described above include, for example, trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, peroxy succinic acid, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tersyl carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

The metallocene compounds described above include, for example, various titanocene compounds described in JP-A-59-152396, JP-A-61-151197, JP-A-63-41484, JP-A-2-249, JP-A-2-4705 and JP-A-5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl, or bis(cyclopentadienyl)-bis(2,6-difluoro-3-(pyr-1-yl)phenyl) titanium and iron-arene complexes described in JP-A-1-304453 and JP-A-1-152109.

The hexaarylbiimidazole compounds described above include, for example, various compounds described in JP-B-6-29285 and U.S. Pat. Nos. 3,479,185, 4,311,783 and 4,622,286, specifically, for example, 2,2'-bis(o-chlorophenyl)-4,4', 5,5'-tetraphenylbiimidazole, 2,2'-bis(o-bromophenyl)-4,4',5, 5'-tetraphenylbiimidazole, 2,2'-bis(o,p-dichlorophenyl)-4,4', 5,5'-tetraphenylbiimidazole, 2,2'-bis(o-chlorophenyl)-4,4',5, 5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis (o-trifluoromethylphenyl)-4,4',5,5'-tetraphenylbiimidazole.

The organic boron compounds described above include, for example, organic boric acid salts described in JP-A-62-143044, JP-A-62-150242, JP-A-9-188685, JP-A-9-188686, JP-A-9-188710, JP-A-2000-131837, JP-A-2002-107916, Japanese Patent 2764769, JP-A-2002-116539 and Martin Kunz, Rad Tech '98, Proceeding, Apr. 19-22 (1998), Chicago, organic boron sulfonium complexes or organic boron oxosulfonium complexes described in JP-A-6-157623, JP-A-6-175564 and JP-A-6-175561, organic boron iodonium complexes described in JP-A-6-175554 and JP-A-6-175553, organic boron phosphonium complexes described in JP-A-9-188710, and organic boron transition metal coordination complexes described in JP-A-6-348011, JP-A-7-128785, JP-A-7-140589, JP-A-7-306527 and JP-A-7-292014.

The disulfone compounds described above include, for example, compounds described in JP-A-61-166544 and JP-A-2002-328465.

The oxime ester compounds described above include, for example, compounds described in *J. C. S. Perkin II*, 1653-1660 (1979), *J. C. S. Perkin II*, 156-162 (1979), *Journal of Photopolymer Science and Technology*, 202-232 (1995) and JP-A-2000-66385, and compounds described in JP-A-2000-80068. Specific examples thereof include compounds represented by the following structural formulae:

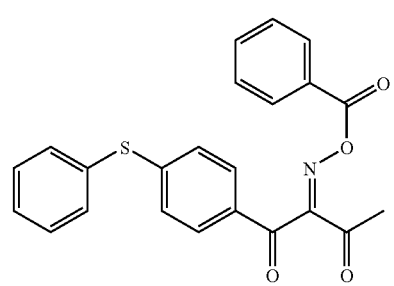

49
-continued
50
-continued
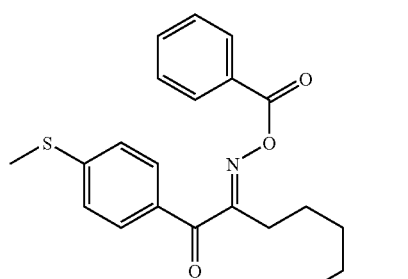
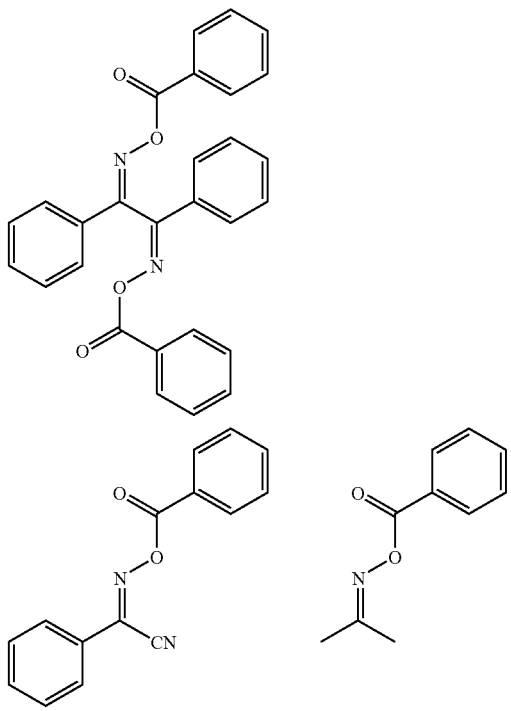
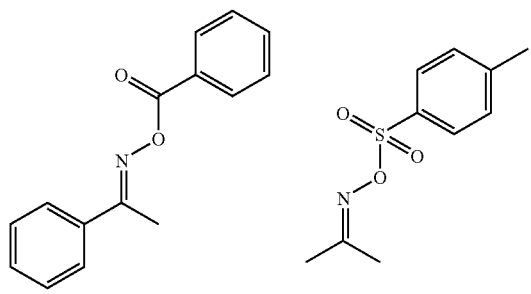
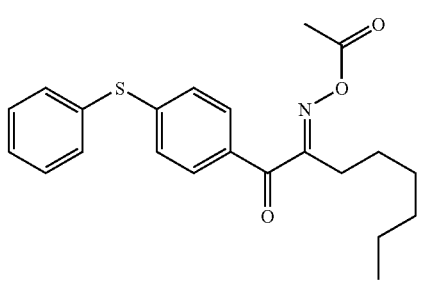
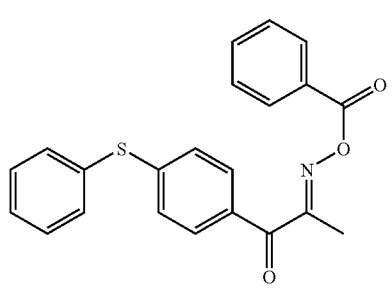
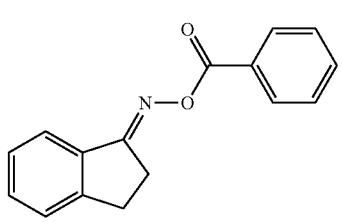
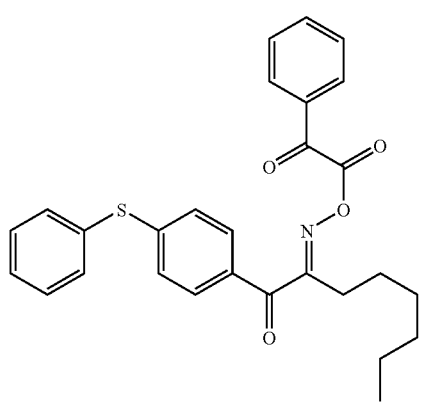
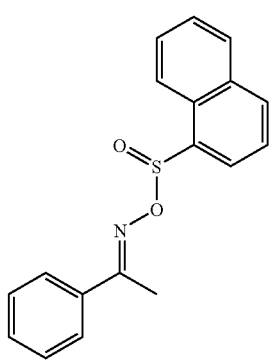

-continued

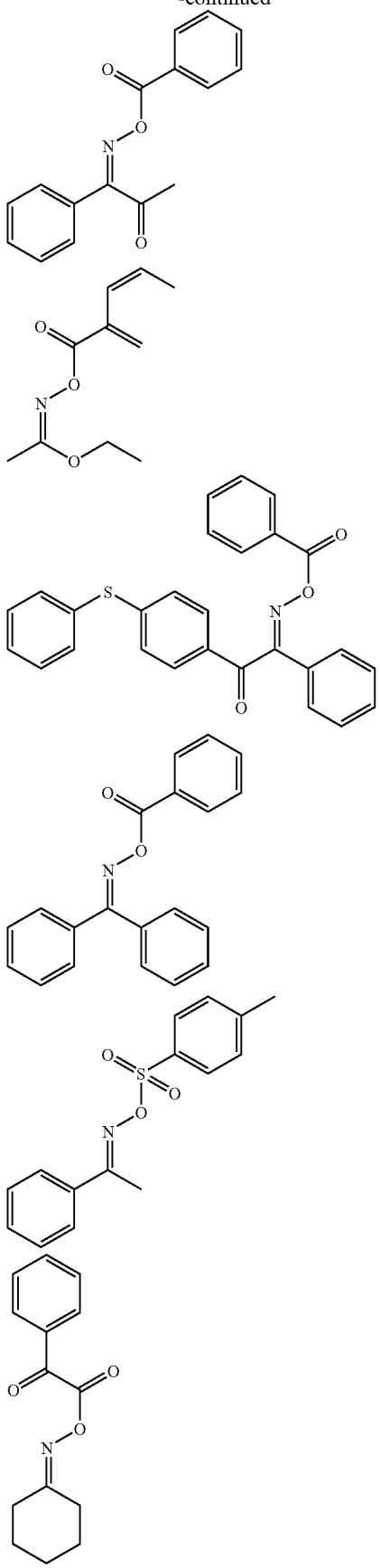

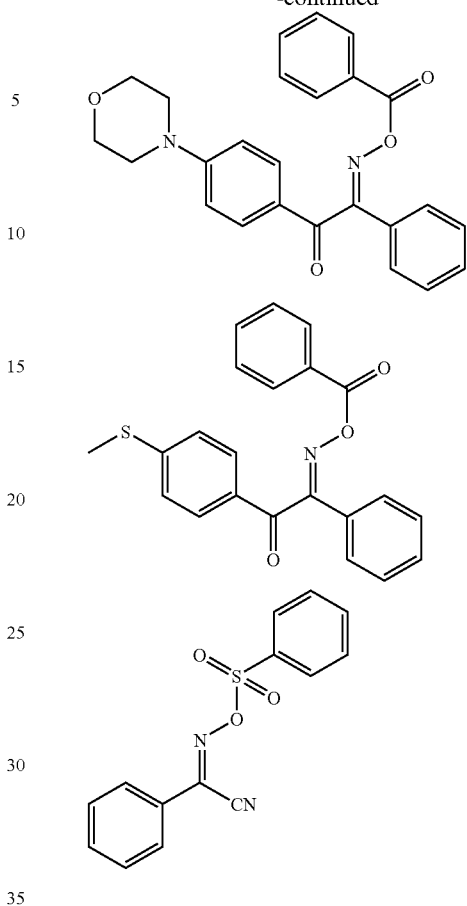

The onium salt compounds described above include onium salts, for example, diazonium salts described in S. I. Schlesinger, *Photogr. Sci. Eng.,* 18, 387 (1974) and T. S. Bal et al., *Polymer,* 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Pat. Nos. 339,049 and 410,201, JP-A-2-150848 and JP-A-2-296514, sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833,827 and German Patents 2,904,626, 3,604,580 and 3,604,581, selenonium salts described in J. V. Crivello et al., *Macromolecules,* 10 (6), 1307 (1977) and J. V. Crivello et al., *J. Polymer Sci., Polymer Chem. Ed.,* 17, 1047 (1979), and arsonium salts described in C. S. Wen et al., *Teh, Proc. Conf. Rad. Curing ASIA*, p. 478, Tokyo, October (1988).

In the invention, the onium salt functions not as an acid generator, but as an ionic radical polymerization initiator.

The onium salts preferably used in the invention include onium salts represented by the following formulae (RI-I) to (RI-III):

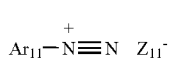  (RI-I)

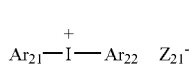  (RI-II)

(RI-III)

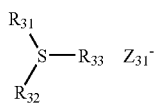

In formula (RI-I), $Ar_{11}$ represents an aryl group having 20 or less carbon atoms, which may have 1 to 6 substituents. Preferable examples of the substituent include an alkyl group having 12 or less carbon atoms, an alkenyl group having 12 or less carbon atoms, an alkynyl group having 12 or less carbon atoms, an aryl group having 12 or less carbon atoms, an alkoxy group having 12 or less carbon atoms, an aryloxy group having 12 or less carbon atoms, a halogen atom, an alkylamino group having 12 or less carbon atoms, a dialkylimino group having 12 or less carbon atoms, an alkylamido group or arylamido having 12 or less carbon atoms, a carbonyl group, a carboxyl group, a cyano group, a sulfonyl group, an thioalkyl group having 12 or less carbon atoms and an thioaryl group having 12 or less carbon atoms. $Z_{11}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion and a sulfate ion. Among them, a perchlorate ion, a hexafluorophosphate ion, a tetrafluoroborate ion, a sulfonate ion and a sulfinate ion are preferred in view of stability.

In the formula (RI-II), $Ar_{21}$ and $Ar_{22}$ each independently represents an aryl group having 20 or less carbon atoms, which may have 1 to 6 substituents. Preferable examples of the substituent include an alkyl group having 12 or less carbon atoms, an alkenyl group having 12 or less carbon atoms, an alkynyl group having 12 or less carbon atoms, an aryl group having 12 or less carbon atoms, an alkoxy group having 12 or less carbon atoms, an aryloxy group having 12 or less carbon atoms, a halogen atom, an alkylamino group having 12 or less carbon atoms, a dialkylimino group having 12 or less carbon atoms, an alkylamido group or arylamido group having 12 or less carbon atoms, a carbonyl group, a carboxyl group, a cyano group, a sulfonyl group, an thioalkyl group having 12 or less carbon atoms and an thioaryl group having 12 or less carbon atoms. $Z_{21}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity.

In the formula (RI-III), $R_{31}$, $R_{32}$ and $R_{33}$ each independently represents an aryl group having 20 or less carbon atoms, which may have 1 to 6 substituents, an alkyl group, an alkenyl group or an alkynyl group. Among them, the aryl group is preferred in view of reactivity and stability. Preferable examples of the substituent include an alkyl group having 12 or less carbon atoms, an alkenyl group having 12 or less carbon atoms, an alkynyl group having 12 or less carbon atoms, an aryl group having 12 or less carbon atoms, an alkoxy group having 12 or less carbon atoms, an aryloxy group having 12 or less carbon atoms, a halogen atom, an alkylamino group having 12 or less carbon atoms, a dialkylimino group having 12 or less carbon atoms, an alkylamido group or arylamido group having 12 or less carbon atoms, a carbonyl group, a carboxyl group, a cyano group, a sulfonyl group, an thioalkyl group having 12 or less carbon atoms and an thioaryl group having 12 or less carbon atoms. $Z_{31}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity. Carboxylate ions described in JP-A-2001-343742 are more preferable, and carboxylate ions described in JP-A-2002-148790 are particularly preferable.

Specific examples of the onium salt are set forth below, but the invention should not be construed as being limited thereto.

(N-1)

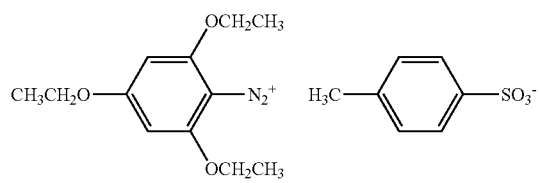

(N-2)

$PF_6^-$ (N-3)

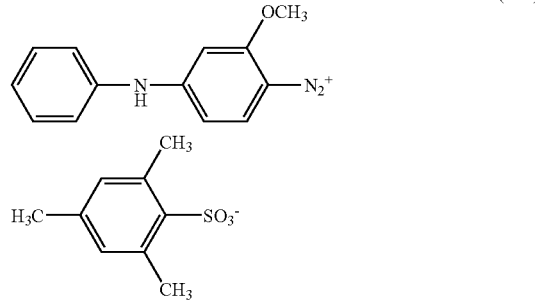

(N-4)

$ClO_4^-$ (N-5)

$PF_6^-$ (N-6)

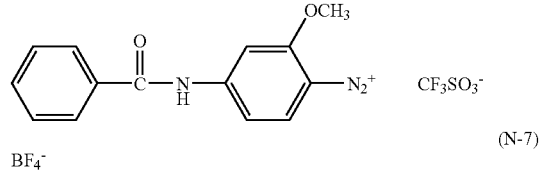

(N-7)

$BF_4^-$ (N-8)

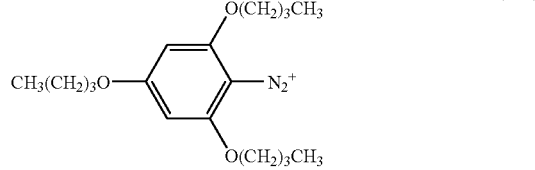

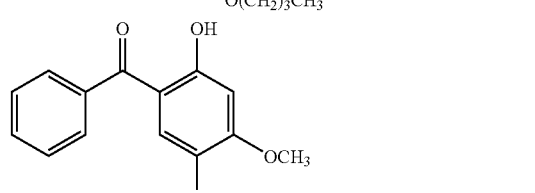

(N-9)

$ClO_4^-$

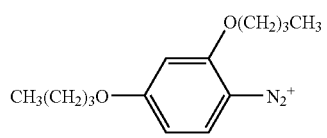 (N-10)
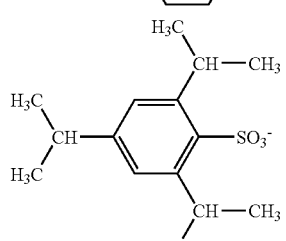
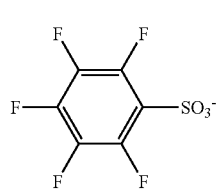 (N-11)
PF$_6^-$
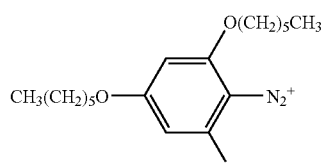 (N-12)
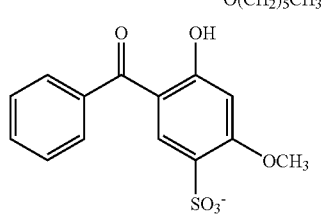
ClO$_4^-$
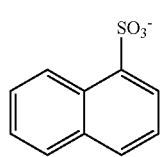 (N-13)
PF$_6^-$
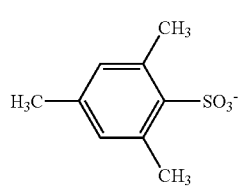 (N-14)
(N-15)
(N-16)
(N-17)
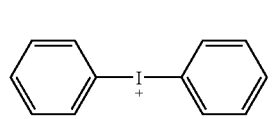 (I-1)
PF$_6^-$
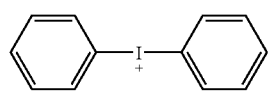 (I-2)
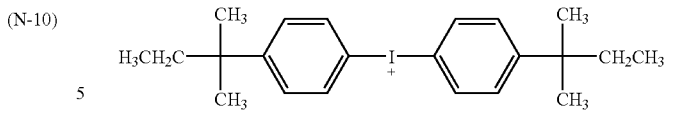 (N-10)
PF$_6^-$ (I-3)
 (I-4)
ClO$_4^-$ (I-5)
 (I-6)
 (I-7)
CF$_3$SO$_3^-$ (I-8)
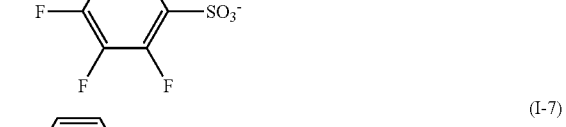 (I-9)
 (I-10)
 (I-11)
 (I-12)
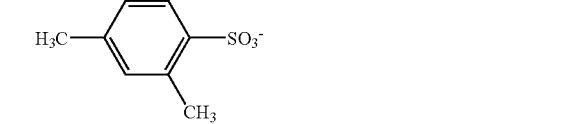 (I-13)
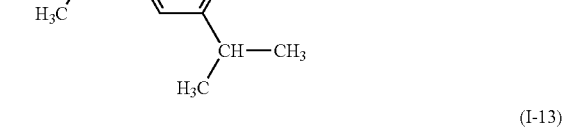

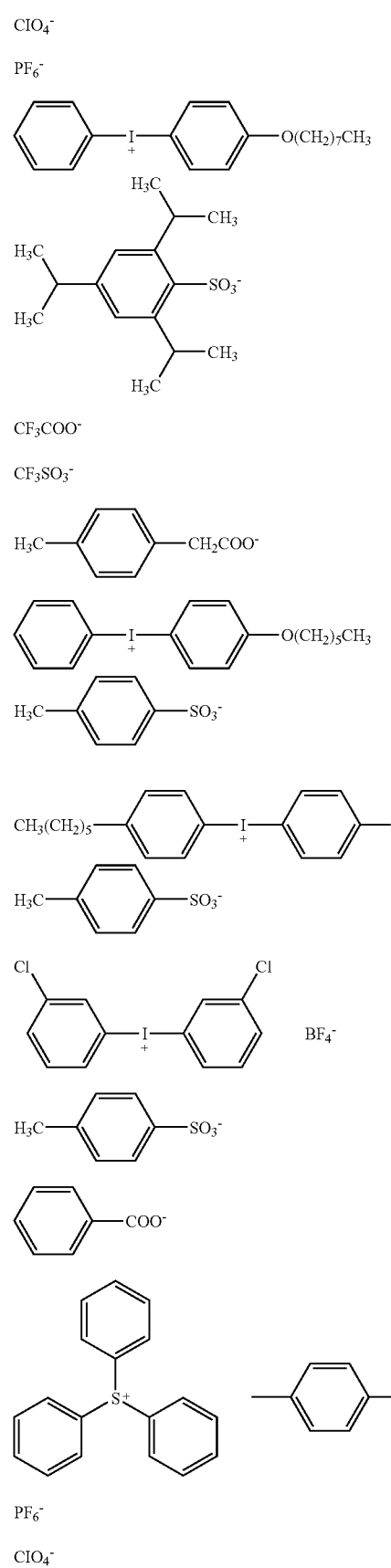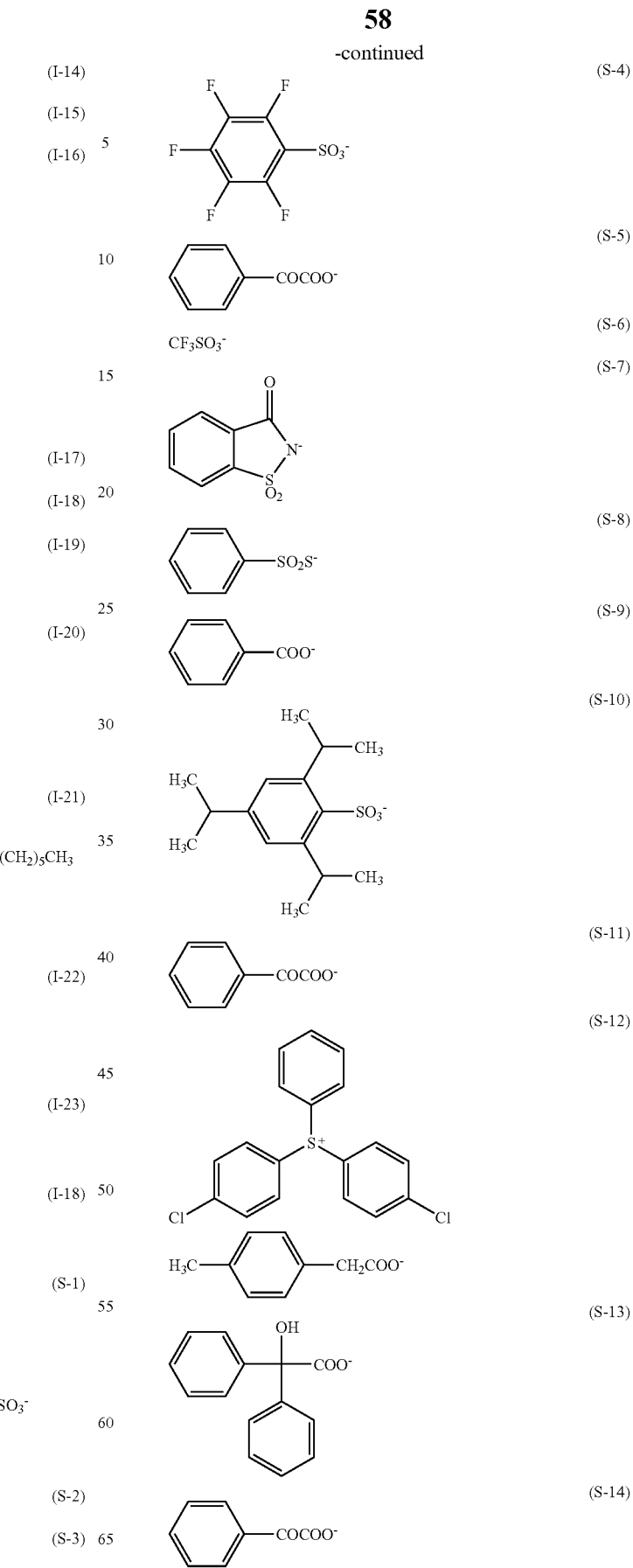

(S-15)

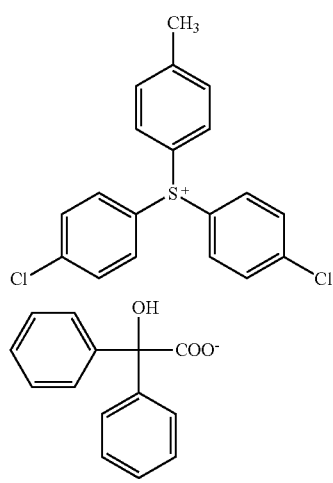

(S-16)

(S-17)

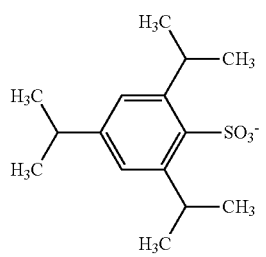

(S-18)

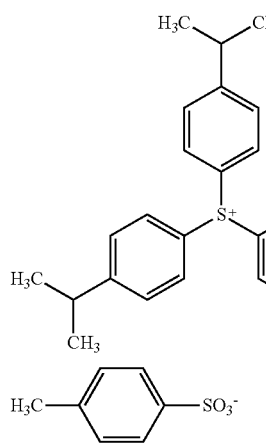

The polymerization initiator is not limited to those described above. In particular, from the standpoint of reactivity and stability, the triazine type initiators, organic halogen compounds, metallocene compounds, hexaarylbiimidazole compounds, oxime ester compounds, diazonium salts, iodonium salts and sulfonium salts are more preferable.

The polymerization initiators may be used individually or in combination of two or more thereof. Also, the polymerization initiator may be added together with other components in one layer or may be added to a different layer separately provided. The polymerization initiator can be added preferably in an amount from 0.1 to 50% by weight, more preferably from 0.5 to 30% by weight, particularly preferably from 0.8 to 20% by weight, based on the total solid content of the photosensitive layer.

(Binder Polymer)

The binder polymer which can be used in the photosensitive layer according to the invention is preferably a water-insoluble polymer. Further, the binder polymer which can be used in the invention preferably does not substantially contain an acid group, for example, a carboxyl group, a sulfonic acid group or a phosphoric acid group. An acid value (acid content per g of polymer, indicated by the chemical equivalent number) of the binder polymer is preferably 0.3 meq/g or less, more preferably 0.1 meq/g or less.

Specifically, the binder polymer which can be used in the invention is preferably insoluble in water and an aqueous solution having a pH of 10 or more. The solubility of the hydrophobic binder polymer in water or an aqueous solution having a pH of 10 or more is preferably 0.5% by weight or less, more preferably 0.1% by weight or less. By using such a binder polymer, film strength, water resistance and ink-receptive property of the photosensitive layer are increased and improvement in printing durability can be achieved.

As for the binder polymer, conventionally known binder polymers preferably having the characteristics in the above-described range can be used without limitation as long as the performances of the lithographic printing plate of the invention are not impaired, and a linear organic polymer having film-forming property is preferred.

Preferable examples of such a binder polymer include a polymer selected from an acrylic resin, a polyvinyl acetal resin, a polyurethane resin, a polyamide resin, an epoxy resin, a methacrylic resin, a styrene resin and a polyester resin. Among them, an acrylic resin is preferred, and a (meth)acrylic acid ester copolymer is more preferred. More specifically, a copolymer of a (meth)acrylic acid alkyl or aralkyl ester with a (meth)acrylic acid ester containing a —CH$_2$CH$_2$O— or —CH$_2$CH$_2$NH— unit in R of the ester residue (—COOR) of the (meth)acrylic acid ester is particularly preferred. The alkyl group in the (meth)acrylic acid alkyl ester is preferably an alkyl group having from 1 to 5 carbon atoms, more preferably a methyl group. Preferable examples of the (meth)acrylic acid aralkyl ester include benzyl (meth)acrylate.

The binder polymer can be imparted with a crosslinking property in order to increase the film strength of the image area.

In order to impart the crosslinking property to the binder polymer, a crosslinkable functional group is introduced into a main chain or side chain of the polymer. The crosslinkable functional group may be introduced by copolymerization or a polymer reaction.

The term "crosslinkable group" as used herein means a group capable of crosslinking the polymer binder in the process of a radical polymerization reaction which is caused in the photosensitive layer, when the lithographic printing plate precursor is exposed to light. The crosslinkable group is not particularly restricted as long as it has such a function and includes, for example, an ethylenically unsaturated bond group, an amino group or an epoxy group as a functional group capable of conducting an addition polymerization reaction. Also, a functional group capable of forming a radical upon irradiation with light may be used and such a crosslinkable group includes, for example, a thiol group, a halogen atom and an onium salt structure. Among them, the ethylenically unsaturated bond group is preferable, and functional groups represented by formulae (1) to (3) shown below are particularly preferable.

Formula (1):

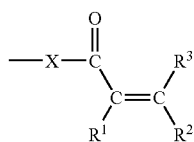

In formula (1), $R^1$ to $R^3$ each independently represents a hydrogen atom or a monovalent organic group. $R^1$ preferably includes, for example, a hydrogen atom or an alkyl group which may have a substituent. Among them, a hydrogen atom or a methyl group is preferable because of high radical reactivity. $R^2$ and $R^3$ each independently preferably includes, for example, a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable because of high radical reactivity.

X represents an oxygen atom, a sulfur atom or $-N(R^{12})-$, and $R^{12}$ represents a hydrogen atom or a monovalent organic group. The monovalent organic group represented by $R^{12}$ includes, for example, an alkyl group which may have a substituent. A hydrogen atom, a methyl group, an ethyl group or an isopropyl group is preferable for $R^{12}$ because of high radical reactivity.

Examples of the substituent introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amido group, an alkylsulfonyl group and an arylsulfonyl group.

Formula (2):

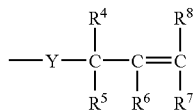

In formula (2), $R^4$ to $R^8$ each independently represents a hydrogen atom or a monovalent organic group. $R^4$ to $R^8$ each independently preferably includes, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable.

Examples of the substituent introduced include those described in Formula (1).

Y represents an oxygen atom, a sulfur atom or $-N(R^{12})-$, and $R^{12}$ has the same meaning as $R^{12}$ defined in Formula (1). Preferable examples for $R^{12}$ are also same as those described in Formula (1).

Formula (3):

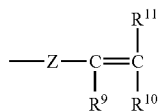

In formula (3), $R^9$ to $R^{11}$ each independently represents a hydrogen atom or a monovalent organic group. The monovalent organic group includes, for example, an alkyl group which may have a substituent. A hydrogen atom or a methyl group is preferable for $R^9$ because of high radical reactivity. $R^{10}$ and $R^{11}$ each independently preferably includes, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable because of high radical reactivity.

Examples of the substituent introduced include those described in Formula (1).

Z represents an oxygen atom, a sulfur atom, $-N(R^{13})-$ or a phenylene group which may have a substituent. $R^{13}$ includes an alkyl group which may have a substituent or the like. Among them, a methyl group, an ethyl group or an isopropyl group is preferable for $R^{13}$ because of high radical reactivity.

Among the polymers, a (meth)acrylic acid copolymer and a polyurethane each having a crosslinkable functional group in the side chain thereof are more preferable.

In the binder polymer having a crosslinking property, for example, a free radical (a polymerization initiating radical or a propagating radical in the process of polymerization of the polymerizable compound) is added to the crosslinkable functional group to cause addition-polymerization between polymers directly or through a polymerization chain of the polymerizable compound, as a result, crosslinking is formed between polymer molecules to effect curing. Alternatively, an atom (for example, a hydrogen atom on the carbon atom adjacent to the functional crosslinkable group) in the polymer is withdrawn by a free radical to produce a polymer radical and the polymer radicals are combined with each other to form crosslinking between polymer molecules to effect curing.

The content of the crosslinkable functional group (content of radical-polymerizable unsaturated double bond determined by iodine titration) in the binder polymer is preferably from 0.1 to 10.0 mmol, more preferably from 1.0 to 7.0 mmol, most preferably from 2.0 to 5.5 mmol, per g of the binder polymer.

In view of improvement in the developing property with an aqueous solution, the binder polymer is preferably hydrophilic. On the other hand, in view of increasing the printing durability, it is important that the binder polymer has good compatibility with the polymerizable compound contained in the photosensitive layer, that is, the binder polymer is preferably oleophilic. From these standpoints, it is also effective in the invention to copolymerize a hydrophilic group-containing component and an oleophilic group-containing component in the binder polymer in order to improve the developing property and printing durability. Preferable examples of the hydrophilic group in the hydrophilic group-containing component include a hydroxy group, a carboxylate group, a hydroxyethyl group, an ethyleneoxy group, a hydroxypropyl group, a polyoxyethyl group, a polyoxypropyl group, an amino group, an aminoethyl group, an aminopropyl group, an ammonium group, an amido group, a carboxymethyl group, a sulfonate group and a phosphonate group.

The binder polymer preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The binder polymer may be any of a random polymer, a block polymer, a graft polymer and the like, and it is preferably a random polymer.

The binder polymers may be used individually or in combination of two or more thereof.

The content of the binder polymer is ordinarily from 5 to 90% by weight, preferably from 10 to 70% by weight, more preferably from 10 to 60% by weight, based on the total solid content of the photosensitive layer. In the range described above, preferable strength of the image area and good image-forming property are obtained.

(Sensitizing Dye)

The photosensitive layer preferably contains a sensitizing dye corresponding to a wavelength of an exposure light source. The sensitizing dye is appropriately selected depending on the use or the like and is not particularly restricted. For instance, a sensitizing dye absorbing light of 350 to 450 nm and an infrared absorbing agent are exemplified.

<Sensitizing Dye Absorbing Light of 350 to 450 nm>

The sensitizing dye absorbing light of 350 to 450 nm for use in the invention preferably has an absorption maximum in a wavelength range of 350 to 450 nm. Such sensitizing dye include, for example, merocyanine dyes represented by formula (I) shown below, benzopyranes or coumarins represented by formula (II) shown below, aromatic ketones represented by formula (III) shown below and anthracenes represented by formula (IV) shown below.

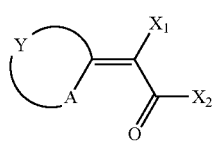

In formula (I), A represents a sulfur atom or $NR_6$, $R_6$ represents a monovalent non-metallic atomic group, Y represents a non-metallic atomic group necessary for forming a basic nucleus of the dye together with adjacent A and the adjacent carbon atom, and $X_1$ and $X_2$ each independently represents a monovalent non-metallic atomic group or $X_1$ and $X_2$ may be combined with each other to form an acidic nucleus of the dye.

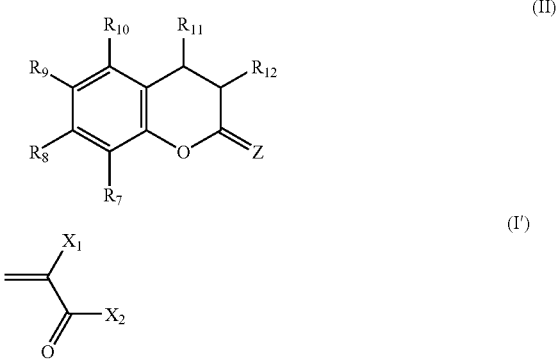

In formula (II), =Z represents an oxo group, a thioxo group, an imino group or an alkylydene group represented by the partial structural formula (I') described above, $X_1$ and $X_2$ have the same meanings as defined in formula (I) respectively, and $R_7$ to $R_{12}$ each independently represents a monovalent non-metallic atomic group.

In formula (III), $Ar_3$ represents an aromatic group which may have a substituent or a heteroaromatic group which may have a substituent, and $R_{13}$ represents a monovalent non-metallic atomic group. $R_{13}$ preferably represents an aromatic group or a heteroaromatic group. $Ar_3$ and $R_{13}$ may be combined with each other to form a ring.

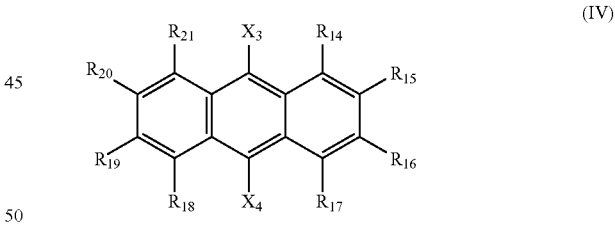

In formula (IV), $X_3$, $X_4$ and $R_{14}$ to $R_{21}$ each independently represents a monovalent non-metallic atomic group. Preferably, $X_3$ and $X_4$ each independently represents an electron-donating group having a negative Hammett substituent constant.

In formulae (I) to (IV), preferable examples of the monovalent non-metallic atomic group represented by any one of $X_1$ to $X_4$ and $R_6$ to $R_{21}$ include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group or a phosphonatophenyl group), a heteroaryl group (for example, a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrine, acridine, perimidine, phenanthroline, phthalazine, phenarsazine, phenoxazine, furazane or phenoxazine), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group and a nitro group. Among the above-described groups, a hydrogen atom, an alkyl group, an aryl group, a halogen atom, an alkoxy group and an acyl group are particularly preferred.

The basic nucleus of the dye formed by Y together with the adjacent A and the adjacent carbon atom in formula (I) includes, for example, a 5-membered, 6-membered or 7-membered, nitrogen-containing or sulfur-containing heterocyclic ring, and is preferably a 5-membered or 6-membered heterocyclic ring.

As the nitrogen-containing heterocyclic ring, those which are known to constitute basic nuclei in merocyanine dyes described in L. G. Brooker et al, *J. Am. Chem. Soc., Vol.* 73, pp. 5326 to 5358 (1951) and references cited therein can be preferably used. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenyl)thiazole or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole or 5-ethoxycarbonylbenzothiazole); naphthothiazoles (for example, naphtho[1,2] thiazole, naphtho[2,1]thiazole, 5-methoxynaphtho[2,1]thiazole, 5-ethoxynaphtho[2,1]thiazole, 8-methoxynaphtho[1,2] thiazole or 7-methoxynaphtho[1,2]thiazole); thianaphtheno-7',6',4,5-thiazoles (for example, 4'-methoxythianaphtheno-7',6',4,5-thiazole); oxazoles (for example, 4-methyloxazole, 5-methyloxazole, 4-phenyloxazole, 4,5-diphenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole or 6-hydroxybenzoxazole); naphthoxazoles (for example, naphth[1,2]oxazole or naphth[2,1]oxazole); selenazoles (for example, 4-methylselenazole or 4-phenylselenazole); benzoselenazoles (for example, benzoselenazole, 5-chlorobenzoselenazole, 5-methoxybenzoselenazole, 5-hydroxybenzoselenazole or tetrahydrobenzoselenazole); naphthoselenazoles (for example, naphtho[1,2]selenazole or naphtho[2,1]selenazole); thiazolines (for example, thiazoline or 4-methylthiazoline); quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline or 8-hydroxyquinoline); isoquinolines (for example, isoquinoline or 3,4-dihydroisoquinoline); benzimidazoles (for example, 1,3-diethylbenzimidazole or 1-ethyl-3-phenylbenzimidazole); 3,3-dialkylindolenines (for example, 3,3-dimethylindolenine, 3,3,5-trimethylindolenine or 3,3,7-trimethylindolenine); and pyridines (for example, pyridine or 5-methylpyridine).

Examples of the sulfur-containing heterocyclic ring include dithiol partial structures in dyes described in JP-A-3-296759.

Specific examples thereof include benzodithiols (for example, benzodithiol, 5-tert-butylbenzodithiol or 5-methylbenzodithiol); naphthodithiols (for example, naphtho[1,2] dithiol or naphtho[2,1]dithiol); and dithiols (for example, 4,5-dimethyldithiol, 4-phenyldithiol, 4-methoxycarbonyldithiol, 4,5-dimethoxycarbonyldithiol, 4,5-ditrifluoromethyldithiol, 4,5-dicyanodithiol, 4-methoxycarbonylmethyldithiol or 4-carboxymethyldithiol).

In the description with respect to the heterocyclic ring above, for convenience and by convention, the names of heterocyclic mother skeletons are used. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-2(3H)-benzothiazolilydene group.

Of the compounds having an absorption maximum in a wavelength range of 350 to 450 nm, dyes represented by formula (V) shown below are more preferable in view of high sensitivity.

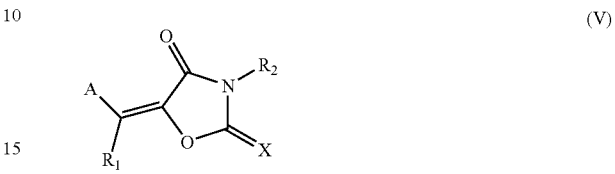

In formula (V), A represents an aromatic cyclic group which may have a substituent or a heterocyclic group which may have a substituent, X represents an oxygen atom, a sulfur atom or =N(R$_3$), and R$_1$, R$_2$ and R$_3$ each independently represents a monovalent non-metallic atomic group, or A and R$_1$ or R$_2$ and R$_3$ may be combined with each other to form an aliphatic or aromatic ring.

The formula (V) will be described in more detail below. R$_1$, R$_2$ and R$_3$ each independently represents a monovalent non-metallic atomic group, preferably a substituted or unsubstituted alkyl group, a substituted or unsubstituted alkenyl group, a substituted or unsubstituted aryl group, a substituted or unsubstituted heteroaryl group, a substituted or unsubstituted alkoxy group, a substituted or unsubstituted alkylthio group, a hydroxy group or a halogen atom.

Preferable examples of R$_1$, R$_2$ and R$_3$ will be specifically described below. Preferable examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferable examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N-alkyl-N-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group, a nitro group, an aryl group, a heteroaryl group, an alkenyl group and an alkynyl group.

In the substituents, specific examples of the alkyl group include those described for the alkyl group above. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group.

Examples of the heteroaryl group include a monocyclic or polycyclic aromatic cyclic group containing at least one of a nitrogen atom, an oxygen atom and a sulfur atom. Examples of especially preferable heteroaryl group include a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine. These groups may be benzo-fused or may have a substituent.

Examples of the alkenyl group include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of G$_1$ in the acyl group (G$_1$CO—) include a hydrogen atom, the above-described alkyl group and aryl group. Of the substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of preferable alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferable substituted alkyl group represented by any one of R$_1$, R$_2$ and R$_3$, which is obtained by combining the above-described substituent with the alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propynylmethyl group, a 2-butenyl group, a 2-methylallyl group, 2-methylpropynylmethyl group, a 2-propynyl group, a 2-butynyl group and a 3-butynyl group.

Preferable examples of the aryl group represented by any one of $R_1$, $R_2$ and $R_3$ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Specific examples of the preferable substituted aryl group represented by any one of $R_1$, $R_2$ and $R_3$ include aryl groups having a monovalent non-metallic atomic group exclusive of a hydrogen atom as a substituent on the ring-forming carbon atom of the above-described aryl group. Preferable examples of the substituent include the above-described alkyl groups and substituted alkyl groups, and the substituents described for the above-described substituted alkyl group. Specific examples of the preferable substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group and a 3-butynylphenyl group.

Examples of the preferable substituted or unsubstituted alkenyl group and the preferable substituted or unsubstituted heteroaryl group represented by any one of $R_1$, $R_2$ and $R_3$ include those described with respect to the alkenyl group and heteroaryl group above, respectively.

Next, A in formula (V) will be described below. A represents an aromatic cyclic group which may have a substituent or heterocyclic group which may have a substituent. Specific examples of the aromatic cyclic group which may have a substituent or heterocyclic group which may have a substituent include those described for the aryl group and heteroaryl group for any one of $R_1$, $R_2$ and $R_3$ in formula (V).

The sensitizing dye represented by formula (V) is obtained by a condensation reaction of the above-described acidic nucleus or an active methyl group-containing acidic nucleus with a substituted or unsubstituted, aromatic ring or hetero ring and can be synthesized with reference to the description of JP-B-59-28329.

Preferable specific examples (D1) to (D41) of the compound represented by formula (V) are set forth below. Further, when isomers with respect to a double bond connecting an acidic nucleus and a basic nucleus are present in each of the compounds, the invention should not be construed as being limited to any one of the isomers.

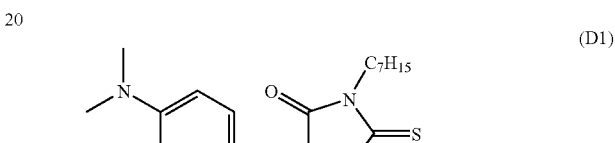

(D1)

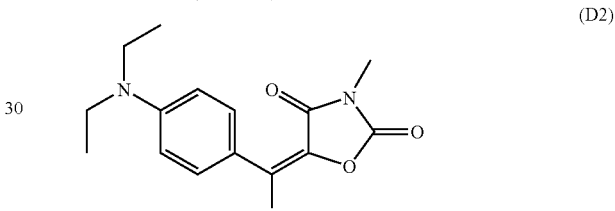

(D2)

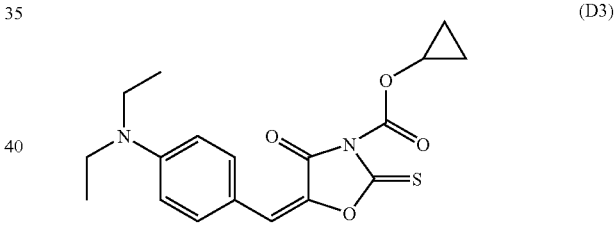

(D3)

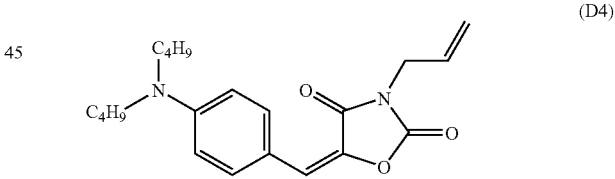

(D4)

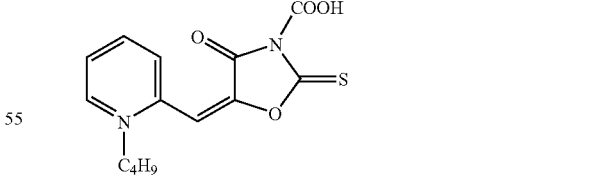

(D5)

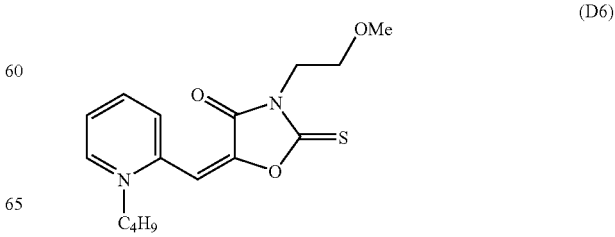

(D6)

-continued
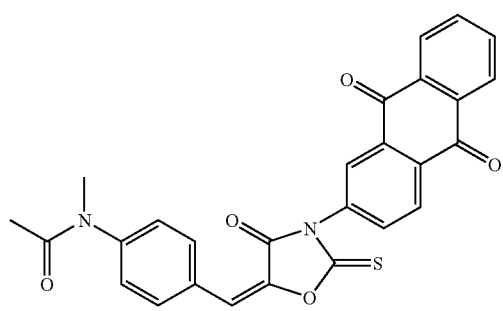
(D7)
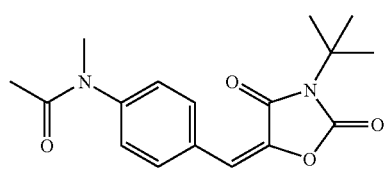
(D8)
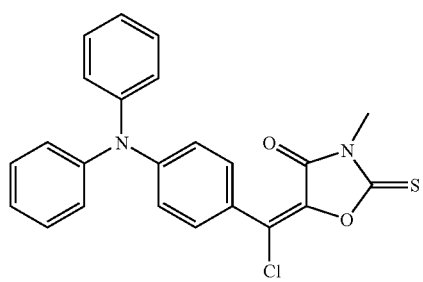
(D9)
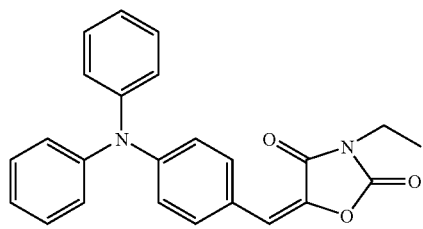
(D10)
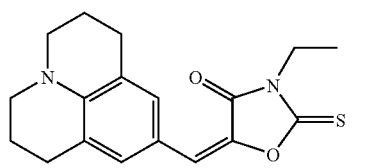
(D11)
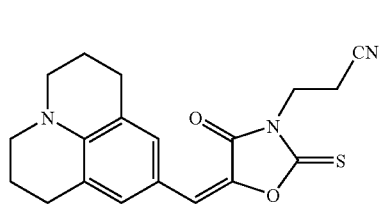
(D12)
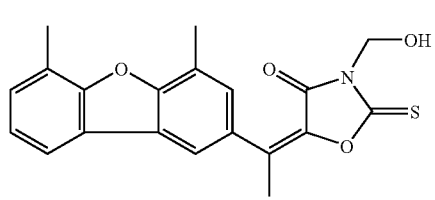
(D13)
-continued
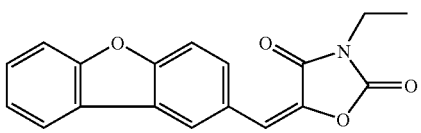
(D14)
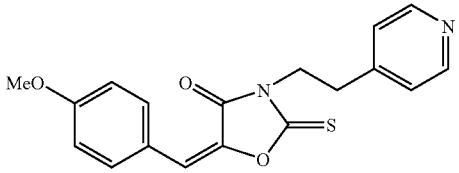
(D15)
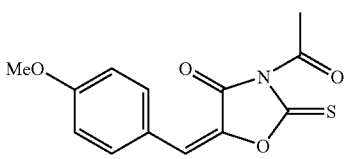
(D16)
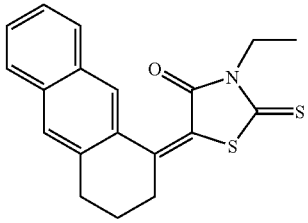
(D17)
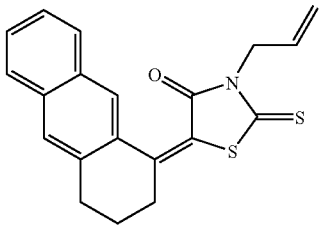
(D18)
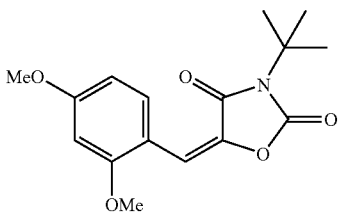
(D19)
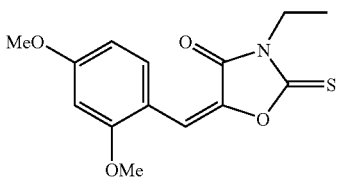
(D20)
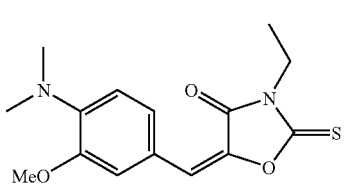
(D21)

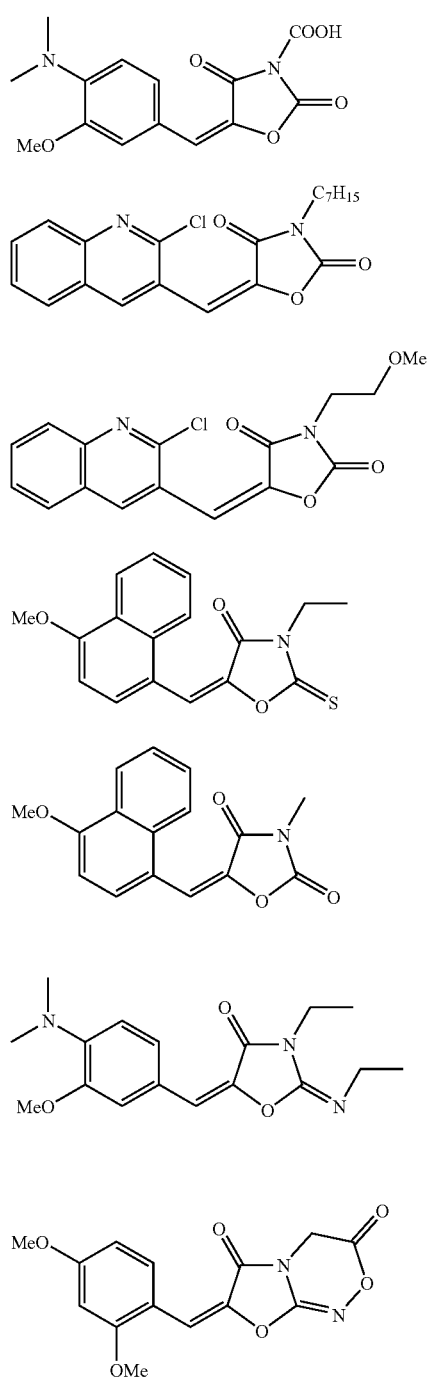
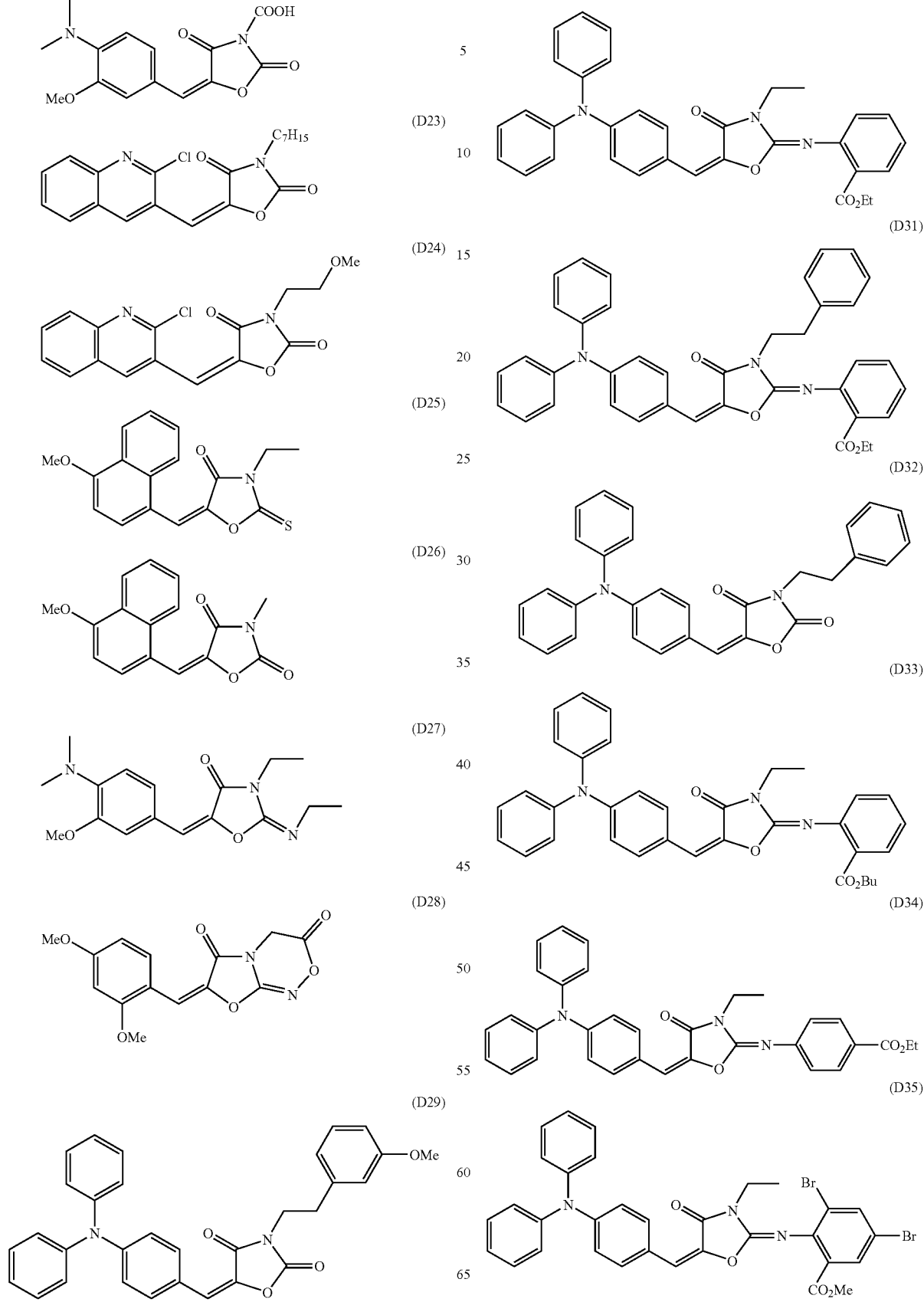

(D36)

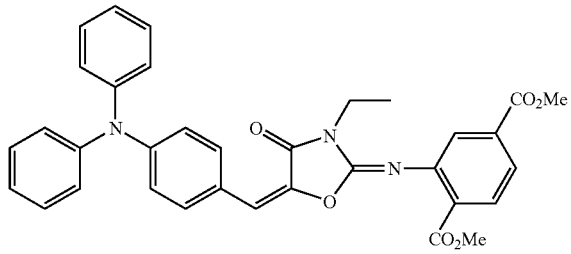

(D37)

(D38)

(D39)

(D40)

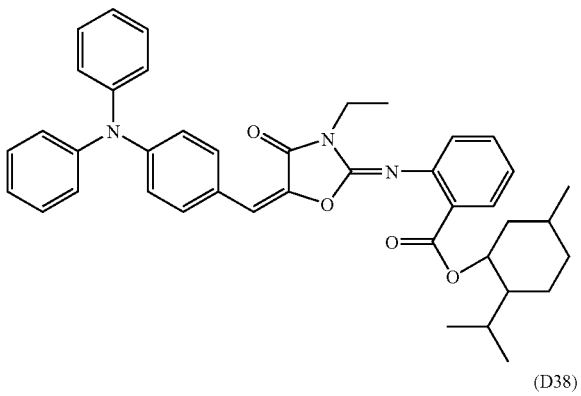

(D41)

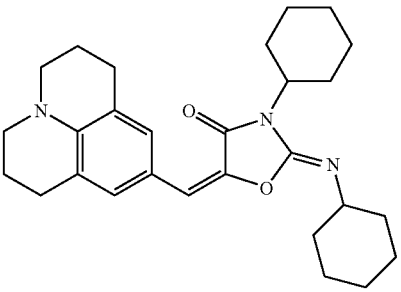

The sensitizing dye absorbing having an absorption maximum in a wavelength range of 350 to 450 nm is used preferably in a range of 1.0 to 10.0% by weight, more preferably in a range of 1.5 to 8.0% by weight, based on the total solid content of the photosensitive layer.

<Infrared Absorbing Agent>

The infrared absorbing agent is a component used for increasing sensitivity to an infrared laser. The infrared absorbing agent has a function of converting the infrared ray absorbed to heat. The infrared absorbing agent for use in the invention is preferably a dye or pigment having an absorption maximum in a wavelength range of 760 to 1,200 nm.

As the dye, commercially available dyes and known dyes described in literatures, for example, Senryo Binran (Dye Handbook) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Examples of preferable dye include cyanine dyes described, for example, in JP-A-58-125246, JP-A-59-84356 and JP-A-60-78787, methine dyes described, for example, in JP-A-58-173696, JP-A-58-181690 and JP-A-58-194595, naphthoquinone dyes described, for example, in JP-A-58-112793, JP-A-58-224793, JP-A-59-48187, JP-A-59-73996, JP-A-60-52940 and JP-A-60-63744, squarylium dyes described, for example, in JP-A-58-112792, and cyanine dyes described, for example, in British Patent 434,875.

Also, near infrared absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 are also preferably used. Other preferred examples of the dye include near infrared absorbing dyes represented by formulae (I) and (II) in U.S. Pat. No. 4,756,993.

Other preferable examples of the infrared absorbing dye include specific indolenine cyanine dyes described in JP-A-2002-278057 as illustrated below.

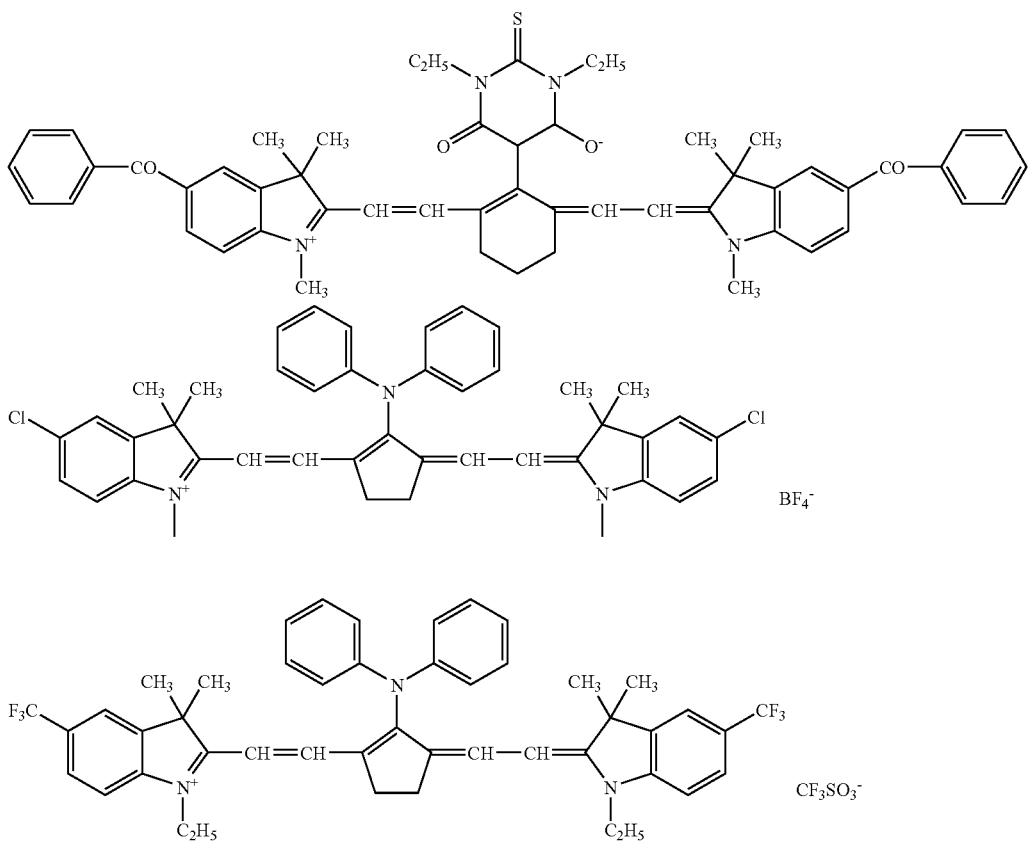

Of the dyes, cyanine dyes, squarylium dyes, pyrylium dyes, nickel thiolate complexes and indolenine cyanine dyes are particularly preferred. Further, cyanine dyes and indolenine cyanine dyes are more preferred. As a particularly preferable example of the dye, a cyanine dye represented by the following formula (I) is exemplified.

Formula (I):

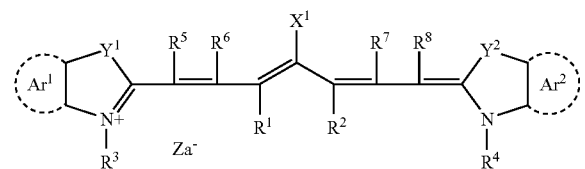

In formula (I), $X^1$ represents a hydrogen atom, a halogen atom, —$NPh_2$, $X^2$-$L^1$ or a group shown below. $X^2$ represents an oxygen atom, a nitrogen atom or a sulfur atom, $L^1$ represents a hydrocarbon group having from 1 to 12 carbon atoms, an aromatic ring containing a hetero atom or a hydrocarbon group having from 1 to 12 carbon atoms and containing a hetero atom. The hetero atom indicates here a nitrogen atom, a sulfur atom, an oxygen atom, a halogen atom or a selenium atom. $Xa^-$ has the same meaning as $Za^-$ defined hereinafter. $R^a$ represents a substituent selected from a hydrogen atom, an alkyl group, an aryl group, a substituted or unsubstituted amino group and a halogen atom.

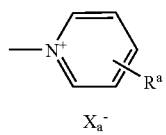

$R^1$ and $R^2$ each independently represents a hydrocarbon group having from 1 to 12 carbon atoms. In view of the preservation stability of a coating solution for photosensitive layer, it is preferred that $R^1$ and $R^2$ each represents a hydrocarbon group having two or more carbon atoms, and it is particularly preferred that $R^1$ and $R^2$ are combined with each other to form a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring and a naphthalene ring. Also, preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (I) has an anionic substituent in the structure thereof and neutralization of charge is not needed. Preferable examples of the counter ion for $Za^-$ include a halogen ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for photosensitive layer.

Specific examples of the cyanine dye represented by formula (I), which can be preferably used in the invention, include those described in Paragraph Nos. [0017] to [0019] of JP-A-2001-133969.

Further, other particularly preferable examples include specific indolenine cyanine dyes described in JP-A-2002-278057 described above.

Examples of the pigment for use in the invention include commercially available pigments and pigments described in *Colour Index (C.I.)*, *Saishin Ganryo Binran (Handbook of the Newest Pigments)* compiled by Pigment Technology Society of Japan (1977), *Saishin Ganryo Oyou Giiutsu (Newest Application on Technologies for Pigments)*, CMC Publishing Co., Ltd. (1986) and *Insatsu Ink Gijutsu (Printing Ink Technology)*, CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of usable pigment include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after the surface treatment. For the surface treatment, a method of coating a resin or wax on the surface, a method of attaching a surfactant and a method of bonding a reactive substance (for example, a silane coupling agent, an epoxy compound or polyisocyanate) to the pigment surface. The surface treatment methods are described in *Kinzoku Sekken no Seishitsu to Oyo (Properties and Applications of Metal Soap)*, Saiwai Shobo, *Insatsu Ink Gijutsu (Printing Ink Technology)*, CMC Publishing Co., Ltd. (1984), and *Saishin Ganrvo Oyo Gijutsu (Newest Application on Technologies for Pigments)*, CMC Publishing Co., Ltd. (1986).

The pigment has a particle size of preferably from 0.01 to 10 μm, more preferably from 0.05 to 1 μm, particularly preferably from 0.1 to 1 μm. In the above-described range, good stability and good uniformity of the pigment dispersion in the photosensitive layer can be obtained.

For dispersing the pigment, a known dispersion technique for use in the production of ink or toner may be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing machines are described in detail in *Saishin Ganryo Oyo Gijutsu (Newest Application on Technologies for Pigments)*, CMC Publishing Co., Ltd. (1986).

The infrared absorbing agent may be added by being incorporated into a micro capsule.

The amount of the infrared absorbing agent added is so controlled that absorbance of the photosensitive layer at the maximum absorption wavelength in the wavelength region of 760 to 1,200 nm measured by reflection measurement is in a range of 0.3 to 1.3, preferably in a range of 0.4 to 1.2. In the above-described range, the polymerization reaction proceeds uniformly in the thickness direction of the photosensitive layer and good film strength of the image area and good adhesion property of the image area to a support are achieved.

The absorbance of the photosensitive layer can be controlled depending on the amount of the infrared absorbing agent added to the photosensitive layer and the thickness of the photosensitive layer. The measurement of the absorbance can be carried out in a conventional manner. The method for measurement includes, for example, a method of forming a photosensitive layer having a thickness determined appropriately in the range necessary for the lithographic printing plate precursor on a reflective support, for example, an aluminum plate, and measuring reflection density of the photosensitive layer by an optical densitometer or a spectrophotometer according to a reflection method using an integrating sphere.

(Co-Sensitizer)

The sensitivity of the photosensitive layer can be further increased by using a certain additive. Such a compound is referred to as a co-sensitizer in the invention. The operation mechanism of the co-sensitizer is not quite clear but may be considered to be mostly based on the following chemical process. Specifically, the co-sensitizer reacts with various intermediate active species (for example, a radical, a peroxide, an oxidizing agent or a reducing agent) generated during the process of photo-reaction initiated by light absorption of the photopolymerization initiation system and subsequent addition-polymerization reaction to produce new active radicals. The co-sensitizers are roughly classified into (a) a compound which is reduced to produce an active radical, (b) a compound which is oxidized to produce an active radical and (c) a compound which reacts with a radical having low activity to convert it into a more highly active radical or acts as a chain transfer agent. However, in many cases, a common view about that an individual compound belongs to which type is not present.

(a) Compound Which is Reduced to Produce an Active Radical

Compound Having Carbon-Halogen Bond:

An active radical is considered to be generated by the reductive cleavage of the carbon-halogen bond. Specific examples of the compound preferably used include a trihalomethyl-s-triazine and a thihalomethyloxadiazole.

Compound Having Nitrogen-Nitrogen Bond:

An active radical is considered to be generated by the reductive cleavage of the nitrogen-nitrogen bond. Specific examples of the compound preferably used include a hexaarylbiimidazole.

Compound Having Oxygen-Oxygen Bond:

An active radical is considered to be generated by the reductive cleavage of the oxygen-oxygen bond. Specific examples of the compound preferably used include an organic peroxide.

Onium Compound:

An active radical is considered to be generated by the reductive cleavage of a carbon-hetero bond or oxygen-nitrogen bond. Specific examples of the compound preferably used include a diaryliodonium salt, a triarylsulfonium salt and an N-alkoxypyridinium (azinium) salt.

Ferrocene and Iron Allene Complex:

An active radical can be reductively generated.

(b) Compound Which is Oxidized to Produce an Active Radical

Alkylate Complex:

An active radical is considered to be generated by the oxidative cleavage of a carbon-hetero bond. Specific examples of the compound preferably used include a triaryl alkyl borate.

Alkylamine Compound:

An active radical is considered to be generated by the oxidative cleavage of a C—X bond on the carbon adjacent to nitrogen, wherein X is preferably a hydrogen atom, a carboxy group, a trimethylsilyl group or a benzyl group. Specific examples of the compound include an ethanolamine, an N-phenylglycine and an N-trimethylsilylmethylaniline.

Sulfur-Containing or Tin-Containing Compound:

A compound in which the nitrogen atom of the above-described amine is replaced by a sulfur atom or a tin atom is considered to generate an active radical in the same manner. Also, a compound having an S—S bond is known to effect sensitization by the cleavage of the S—S bond.

α-Substituted Methylcarbonyl Compound:

An active radical can be generated by the oxidative cleavage of carbonyl-α-carbon bond. The compound in which the carbonyl is converted into an oxime ether also shows the similar function. Specific examples of the compound include an 2-alkyl-1-[4-(alkylthio)phenyl]-2-morpholinopronone-1 and an oxime ether obtained by a reaction of the 2-alkyl-1-[4-(alkylthio)phenyl]-2-morpholinopronone-1 with a hydroxyamine and subsequent etherification of the N—OH.

Sulfinic Acid Salt:

An active radical can be reductively generated. Specific examples of the compound include sodium arylsulfinate.

(c) Compound Which Reacts with a Radical to Convert it into a More Highly Active Radical or Acts as a Chain Transfer Agent:

For example, a compound having SH, PH, SiH or GeH in its molecule is used as the compound which reacts with a radical to convert it into a more highly active radical or acts as a chain transfer agent. The compound donates hydrogen to a low active radical species to generate a radical or is oxidized and deprotonized to generate a radical. Specific examples of the compound include a 2-mercaptobenzimidazole.

A large number of examples of the co-sensitizer are more specifically described, for example, in JP-A-9-236913 as additives for the purpose of increasing sensitivity. Some of them are set forth below, but the invention should not be construed as being limited thereto.

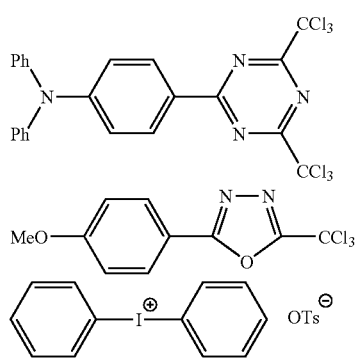

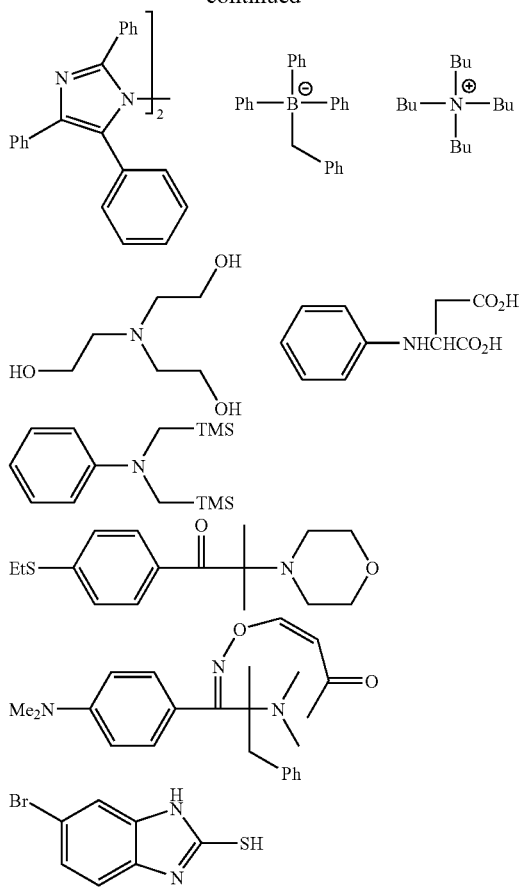

Similarly to the above-described sensitizing dye, the co-sensitizer can be subjected to various chemical modifications so as to improve the characteristics of the photosensitive layer of the lithographic printing plate precursor. For instance, methods, for example, binding to the sensitizing dye, polymerization initiator, polymerizable compound or other radical-generating part, introduction of a hydrophilic site, introduction of a substituent for improving compatibility or inhibiting deposition of crystal, introduction of a substituent for improving adhesion property, and formation of a polymer, may be used. The co-sensitizers may be used individually or in combination of two or more thereof. The amount of the co-sensitizer used is ordinarily from 0.05 to 100 parts by weight, preferably from 1 to 80 parts by weight, more preferably from 3 to 50 parts by weight, per 100 parts by weight of the polymerizable compound.

(Microcapsule)

In the invention, in order to incorporate the above-described constituting components of the photosensitive layer and other constituting components described hereinafter into the photosensitive layer, a part of the constituting components is encapsulated into microcapsules and added to the photosensitive layer as described, for example, in JP-A-2001-277740 and JP-A-2001-277742. In such a case, each constituting component may be present inside or outside the microcapsule in an appropriate ratio.

As a method of microencapsulating the constituting components of the photosensitive layer, known methods can be used. Methods for the production of microcapsules include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by polymerization of monomer described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferable microcapsule wall used in the invention has three-dimensional crosslinking and has a solvent-swellable property. From this point of view, a preferable wall material of the microcapsule includes polyurea, polyurethane, polyester, polycarbonate, polyamide and a mixture thereof, and particularly polyurea and polyurethane are preferred. Further, a compound having a crosslinkable functional group, for example, an ethylenically unsaturated bond, capable of being introduced into the binder polymer described above may be introduced into the microcapsule wall.

The average particle size of the microcapsule is preferably from 0.01 to 3.0 sun, more preferably from 0.05 to 2.0 Sun, particularly preferably from 0.10 to 1.0 μm. In the range described above, preferable resolution and good preservation stability can be achieved.

(Surfactant)

It is preferred to use a surfactant in the polymerizable composition or photosensitive layer in order to progress the developing property and to improve the state of surface coated. The surfactant includes, for example, a nonionic surfactant, an anionic surfactant, a cationic surfactant, an amphoteric surfactant and a fluorine-based surfactant.

The nonionic surfactant used in the invention is not particular restricted, and nonionic surfactants hitherto known can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialylamine oxides, polyethylene glycols, and copolymers of polyethylene glycol and polypropylene glycol.

The anionic surfactant used in the invention is not particularly restricted and anionic surfactants hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the invention is not particularly restricted and cationic surfactants hitherto known can be used. Examples of the cationic surfactant include alkylamine salts, quaternary ammonium salts, polyoxyethylene alkyl amine salts and polyethylene polyamine derivatives.

The amphoteric surfactant used in the invention is not particularly restricted and amphoteric surfactants hitherto known can be used. Examples of the amphoteric surfactant include carboxybetaines, aminocarboxylic acids, sulfobetaines, aminosulfuric esters and imidazolines.

In the surfactants described above, the term "polyoxyethylene" can be replaced with "polyoxyalkylene", for example, polyoxymethylene, polyoxypropylene or polyoxybutylene, and such surfactants can also be used in the invention.

Further, a preferred surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkylphosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The surfactants may be used individually or in combination of two or more thereof.

The content of the surfactant is preferably from 0.001 to 10% by weight, more preferably from 0.01 to 7% by weight, based on the total solid content of the photosensitive layer.

(Hydrophilic Polymer)

In the invention, a hydrophilic polymer may be incorporated into the photosensitive layer in order to improve the developing property and dispersion stability of microcapsule. Preferable examples of the hydrophilic polymer include those having a hydrophilic group, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group.

Specific examples of the hydrophilic polymer include gum arabic, casein, gelatin, a starch derivative, carboxymethyl cellulose or a sodium salt thereof, cellulose acetate, sodium alginate, a vinyl acetate-maleic acid copolymer, a styrene-maleic acid copolymer, polyacrylic acid or a salt thereof, polymethacrylic acid or a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, polyethylene glycol, a hydroxypropylene polymer, polyvinyl alcohol, hydrolyzed polyvinyl acetate having a hydrolysis degree of 60% by mole or more, preferably 80% by mole or more, polyvinyl formal, polyvinyl butyral, polyvinyl pyrrolidone, a homopolymer or polymer of acrylamide, a homopolymer or copolymer of methacrylamide, a homopolymer or copolymer of N-methylolacrylamide, polyvinyl pyrrolidone, an alcohol-soluble nylon, and a polyether of 2,2-bis(4-hydroxyphenyl)propane with epichlorohydrin.

The hydrophilic polymer preferably has a weight average molecular weight of 5,000 or more, more preferably from 10,000 to 300,000. The hydrophilic polymer may be any of a random polymer, a block polymer, a graft polymer or the like.

The content of the hydrophilic polymer in the photosensitive layer is preferably 20% by weight or less, more preferably 10% by weight or less, based on the total solid content of the photosensitive layer.

(Coloring Agent)

In the invention, a dye having large absorption in the visible light region can be used as a coloring agent for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (produced by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000), Methylene Blue (CI52015), and dyes described in JP-A-62-293247. Also, a pigment, for example, phthalocyanine-based pigment, azo-based pigment, carbon black and titanium oxide can be preferably used.

It is preferable to add the coloring agent, because the image area and the non-image area after the image formation can be easily distinguished. The amount of the coloring agent added is preferably from 0.01 to 10% by weight based on the total solid content of the photosensitive layer.

(Print-Out Agent)

In the photosensitive layer according to the invention, a compound capable of undergoing discoloration by the effect of an acid or a radical can be added in order to form a print-out image. As such a compound, for example, various dyes, e.g., diphenylmethane-based, triphenylmethane-based, thiazine-based, oxazine-based, xanthene-based, anthraquinone-based, iminoquinone-based, azo-based and azomethine-based dyes are effectively used.

Specific examples thereof include dyes, for example, Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Paraftichsine, Victoria Pure Blue BOH (produced by Hodogaya Chemical Co., Ltd.), Oil Blue #603 (produced by Orient Chemical Industry Co., Ltd.), Oil Pink #312 (produced by Orient Chemical Industry Co., Ltd.), Oil Red 5B (produced by Orient Chemical Industry Co., Ltd.), Oil Scarlet #308 (produced by Orient Chemical Industry Co., Ltd.), Oil Red OG (produced by Orient Chemical Industry Co., Ltd.), Oil Red RR (produced by Orient Chemical Industry Co., Ltd.), Oil Green #502 (produced by Orient Chemical Industry Co., Ltd.), Spiron Red BEH Special (produced by Hodogaya Chemical Co., Ltd.), m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes, for example, p,p',p''-hexamethyltriaminotriphenyl methane (leuco Crystal Violet) and Pergascript Blue SRB (produced by Ciba Geigy).

Other preferable examples include leuco dyes known as a material for heat-sensitive paper or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl)aminofluorane, 2-anilino-3-methyl-6-(N-ethyl-p-toluidino)fluorane, 3,6-dimethoxyfluorane, 3-(N,N-diethylamino)-5-methyl-7-(N,N-dibenzylamino)fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The dye capable of undergoing discoloration by the effect of an acid or a radical is preferably added in an amount of 0.01 to 15% by weight based on the total solid content of the photosensitive layer.

(Polymerization Inhibitor)

To the photosensitive layer according to the invention, a small amount of a thermal polymerization inhibitor is preferably added in order to prevent the polymerizable compound from undergoing undesirable thermal polymerization during the production or preservation of the photosensitive layer.

Preferable examples of the thermal polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermal polymerization inhibitor added is preferably from about 0.01 to about 5% by weight based on the total solid content of the photosensitive layer.

(Higher Fatty Acid Derivative)

In the photosensitive layer according to the invention, for example, a higher fatty acid derivative, e.g., behenic acid or behenic acid amide may be added and localized on the surface of the photosensitive layer during the process of drying after coating in order to avoid polymerization inhibition due to oxygen. The amount of the higher fatty acid derivative added is preferably from about 0.1 to about 10% by weight based on the total solid content of the photosensitive layer.

(Plasticizer)

The photosensitive layer according to the invention may contain a plasticizer. Preferable examples of the plasticizer include a phthalic acid ester, for example, dimethyl phthalate, diethyl phthalate, dibutyl phthalate, diisobutyl phthalate, diocyl phthalate, octyl capryl phthalate, dicyclohexyl phthalate, ditridecyl phthalate, butyl benzyl phthalate, diisodecyl phthalate or diallyl phthalate; a glycol ester, for example, dimethyl glycol phthalate, ethyl phthalyethyl glycolate, methyl phthalyethyl glycolate, butyl phthalylbutyl glycolate or triethylene glycol dicaprylic acid ester; a phosphoric acid ester, for example, tricresyl phosphate or triphenyl phosphate; an aliphatic dibasic acid ester, for example, diisobutyl adipate, dioctyl adipate, dimethyl sebacate, dibutyl sebacate, dioctyl azelate or dibutyl maleate; polyglycidyl methacrylate, triethyl citrate, glycerin triacetyl ester and butyl laurate. The content of the plasticizer is preferably about 30% by weight or less based on the total solid content of the photosensitive layer.

(Fine Inorganic Particle)

The photosensitive layer according to the invention may contain fine inorganic particle in order to increase strength of the cured layer in the image area. The fine inorganic particle preferably includes, for example, silica, alumina, magnesium oxide, titanium oxide, magnesium carbonate, calcium alginate and a mixture thereof. Even if the fine inorganic particle has no light-to-heat converting property, it can be used, for example, for strengthening the layer or enhancing interfacial adhesion property due to surface roughening. The fine inorganic particle preferably has an average particle size from 5 nm to 10 µm, more preferably from 0.5 to 3 µm. In the range described above, it is stably dispersed in the photosensitive layer, sufficiently maintains the film strength of the photosensitive layer and can form the non-image area excellent in hydrophilicity and preventing from the occurrence of stain at the printing.

The fine inorganic particle described above is easily available as a commercial product, for example, colloidal silica dispersion.

The content of the fine inorganic particle is preferably 20% by weight or less, more preferably 10% by weight or less, based on the total solid content of the photosensitive layer.

(Hydrophilic Low Molecular Weight Compound)

The photosensitive layer according to the invention may contain a hydrophilic low molecular weight compound in order to improve the developing property. The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine or pentaerythritol, an organic amine, e.g., triethanol amine, diethanol amine or monoethanol amine, or a salt thereof, an organic sulfonic acid, e.g., toluene sulfonic acid or benzene sulfonic acid, or a salt thereof, an organic phosphonic acid, e.g., phenyl phosphonic acid, or a salt thereof, an organic carboxylic acid, e.g., tartaric acid, oxalic acid, citric acid, maleic acid, lactic acid, gluconic acid or an amino acid, or a salt thereof, and an organic quaternary ammonium salt, e.g., tetraethyl ammonium hydrochloride.

(Formation of Photosensitive Layer)

The photosensitive layer according to the invention is formed by dispersing or dissolving each of the necessary constituting components described above in a solvent to prepare a coating solution and coating the solution. The solvent used include, for example, ethylene dichloride, cyclohexanone, methyl ethyl ketone, methanol, ethanol, propanol, ethylene glycol monomethyl ether, 1-methoxy-2-propanol, 2-methxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid concentration of the coating solution is preferably from 1 to 50% by weight.

The photosensitive layer according to the invention may also be formed by preparing plural coating solutions by dispersing or dissolving the same or different components described above into the same or different solvents and conducting repeatedly plural coating and drying.

The coating amount (solid content) of the photosensitive layer after the coating and drying on the support may be varied depending on the use but ordinarily, it is preferably from 0.3 to 3.0 g/m$^2$. In the range described above, the preferable sensitivity and good film property of the photosensitive layer can be obtained.

Various methods can be used for the coating. Examples of the method include bar coater coating, spin coating, spray coating, curtain coating, dip coating, air knife coating, blade coating and roll coating.

[Protective Layer]

In the lithographic printing plate precursor according to the invention, a protective layer (oxygen-blocking layer) is preferably provided on the photosensitive layer in order to prevent diffusion and penetration of oxygen which inhibits the polymerization reaction at the time of exposure. The protective layer for use in the invention preferably has oxygen permeability (A) at 25° C. under one atmosphere of $1.0 \leq (A) \leq 20$ (ml/m$^2$·day). When the oxygen permeability (A) is extremely lower than 1.0 (ml/m$^2$·day), problems may occur in that an undesirable polymerization reaction arises during the production or preservation before image exposure and in that undesirable fog or spread of image line occurs at the image exposure. On the contrary, when the oxygen permeability (A) greatly exceeds 20 (ml/m$^2$·day), decrease in sensitivity may be incurred. The oxygen permeability (A) is more preferably in a range of $1.5 \leq (A) \leq 12$ (ml/m$^2$·day), still more preferably in a range of $2.0 \leq (A) \leq 10.0$ (ml/m$^2$·day). Besides the above described oxygen permeability, as for the characteristics required of the protective layer, it is desired that the protective layer does not substantially hinder the transmission of light for the exposure, is excellent in the adhesion property to the photosensitive layer, and can be easily removed during a development step after the exposure. Contrivances on the protective layer have been heretofore made and described in detail in U.S. Pat. No. 3,458,311 and JP-B-55-49729.

As the material of the protective layer, a water-soluble polymer compound relatively excellent in crystallizability is preferably used. Specifically, a water-soluble polymer, for example, polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid or polyacrylamide is enumerated. The water-soluble polymer compounds may be used individually or as a mixture. Of the compounds, when polyvinyl alcohol is used as a main component, the best results can be obtained in the fundamental characteristics, for example, oxygen-blocking property and removability of the protective layer by development.

Polyvinyl alcohol for use in the protective layer may be partially substituted with ester, ether or acetal as long as it contains unsubstituted vinyl alcohol units for achieving the necessary oxygen-blocking property and water solubility. Also, a part of polyvinyl alcohol may have other copolymer component. As specific examples of the polyvinyl alcohol, polyvinyl alcohols having a hydrolysis degree of 71 to 100% and a polymerization repeating unit number of 300 to 2,400 are exemplified. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (produced by Kuraray Co., Ltd.). They can be used individually or as a mixture. According to a preferred embodiment, the content of polyvinyl alcohol in the protective layer is from 20 to 95% by weight, more preferably from 30 to 90% by weight.

Also, known modified polyvinyl alcohol can be preferably used. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are exemplified.

As a component used as a mixture with polyvinyl alcohol, polyvinyl pyrrolidone or a modified product thereof is preferable from the viewpoint of the oxygen-blocking property and removability by development. The content thereof is ordinarily from 3.5 to 80% by weight, preferably from 10 to 60% by weight, more preferably from 15 to 30% by weight, in the protective layer.

The components of the protective layer (selection of PVA and use of additives) and the coating amount are determined taking into consideration fog-preventing property, adhesion property and scratch resistance besides the oxygen-blocking property and removability by development. In general, the higher the hydrolyzing rate of the PVA used (the higher the unsubstituted vinyl alcohol unit content in the protective layer) and the larger the layer thickness, the higher is the oxygen-blocking property, thus it is advantageous in the point of sensitivity. The molecular weight of the polymer compound, for example, polyvinyl alcohol (PVA) is ordinarily from 2,000 to 10,000,000, preferably from 20,000 to 3,000,000.

As other additive of the protective layer, glycerin, dipropylene glycol or the like can be added in an amount corresponding to several % by weight of the polymer compound to provide flexibility. Further, an anionic surfactant, for example, sodium alkylsulfate or sodium alkylsulfonate; an amphoteric surfactant, for example, alkylaminocarboxylate and alkylaminodicarboxylate; or a nonionic surfactant, for example, polyoxyethylene alkyl phenyl ether can be added in an amount corresponding to several % by weight of the polymer compound.

The adhesion property of the protective layer to the photosensitive layer and scratch resistance are also extremely important in view of handling of the printing plate precursor. Specifically, when a hydrophilic layer comprising a water-soluble polymer is laminated on the oleophilic photosensitive layer, layer peeling due to an insufficient adhesion property is liable to occur, and the peeled portion causes such a defect as failure in curing of the photosensitive layer due to polymerization inhibition by oxygen. Various proposals have been made for improving the adhesion property between the photosensitive layer and the protective layer. For example, it is described in U.S. patent application Nos. 292,501 and 44,563 that a sufficient adhesion property can be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on the photosensitive layer. Any of these known techniques can be applied to the protective layer according to the invention. Coating methods of the protective layer are described in detail, for example, in U.S. Pat. No. 3,458,311 and JP-B-55-49729.

Further, it is also preferred to incorporate an inorganic stratiform compound into the protective layer of the lithographic printing plate precursor according to the invention for the purpose of improving the oxygen-blocking property and property for protecting the surface of photosensitive layer.

The inorganic stratiform compound used here is a particle having a thin tabular shape and includes, for instance, mica, for example, natural mica represented by the following formula: $A(B, C)_{2-5}D_4O_{10}(OH, F, O)_2$, (wherein A represents any one of K, Na and Ca, B and C each represents any one of Fe (II), Fe(III), Mn, Al, Mg and V, and D represents Si or Al) or synthetic mica; talc represented by the following formula: $3MgO.4SiO.H_2O$; teniolite; montmorillonite; saponite; hectolite; and zirconium phosphate.

Of the micas, examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilic mica $KMg_{2.5}(Si_4O_{10})F_2$, and swellable mica, for example, Na tetrasilic mica $NaMg_{2.5}(Si_4O_{10})F_2$, Na or Li teniolite $(Na, Li)Mg_2Li(Si_4O_{10})F_2$, or montmorillonite based Na or Li hectolite $(Na, Li)_{1/8}Mg_{2/5}Li_{1/8}(Si_4O_{10})F_2$. Synthetic smectite is also useful.

Of the inorganic stratiform compounds, fluorine based swellable mica, which is a synthetic inorganic stratiform compound, is particularly useful in the invention. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and in order to compensate it, a cation, for example, $Na^+$, $Ca^{2+}$ or $Mg^{2+}$, is adsorbed between the lattice layers. The cation existing between the lattice layers is referred to as an exchangeable cation and is exchangeable with various cations. In particular, in the case where the cation between the lattice layers is Li+ or $Na^+$, because of a small ionic radius, a bond between the stratiform crystal lattices is week, and the inorganic stratiform compound greatly swells upon contact with water. When share is applied under such condition, the stratiform crystal lattices are easily cleaved to form a stable sol in water. The bentnite and swellable synthetic mica have strongly such tendency and are useful in the invention. Particularly, the swellable synthetic mica is preferably used.

With respect to the shape of the inorganic stratiform compound used in the invention, the thinner the thickness or the larger the plain size as long as smoothness of coated surface and transmission of actinic radiation are not damaged, the better from the standpoint of control of diffusion. Therefore, an aspect ratio of the inorganic stratiform compound is ordinarily 20 or more, preferably 100 or more, particularly preferably 200 or more. The aspect ratio is a ratio of thickness to major axis of particle and can be determined, for example, from a projection drawing of particle by a microphotography. The larger the aspect ratio, the greater the effect obtained.

As for the particle size of the inorganic stratiform compound used in the invention, an average major axis is ordinarily from 0.3 to 20 µm, preferably from 0.5 to 10 µm, particularly preferably from 1 to 5 µm. An average thickness of the particle is ordinarily 0.1 µm or less, preferably 0.05 µm or less, particularly preferably 0.01 µm or less. For example, in the swellable synthetic mica that is the representative compound of the inorganic stratiform compounds, thickness is approximately from 1 to 50 nm and plain size is approximately from 1 to 20 µm.

When such an inorganic stratiform compound particle having a large aspect ratio is incorporated into the protective layer, strength of coated layer increases and penetration of oxygen or moisture can be effectively inhibited so that the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

The content of the inorganic stratiform compound in the protective layer is preferably from 5/1 to 1/100 in terms of weight ratio to the amount of binder used in the protective layer. When a plurality of inorganic stratiform compounds is used in combination, it is also preferred that the total amount of the inorganic stratiform compounds fulfills the above-described weight ratio.

An example of common dispersing method for the inorganic stratiform compound used in the protective layer is described below. Specifically, from 5 to 10 parts by weight of a swellable stratiform compound that is exemplified as a preferred inorganic stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having a Polman whistle. A dispersion containing from 5 to 10% by weight of the inorganic stratiform compound thus prepared is highly viscous or gelled and exhibits extremely good preservation stability. In the formation of a coating solution for protective layer using the dispersion, it is preferred that the dispersion is diluted with water, sufficiently stirred and then mixed with a binder solution.

To the coating solution for protective layer can be added known additives, for example, a surfactant for improving coating property or a water-soluble plasticizer for improving physical property of coated layer in addition to the inorganic stratiform compound. Examples of the water-soluble plasticizer include propionamide, cyclohexanediol, glycerin or sorbitol. Also, a water-soluble (meth)acrylic polymer can be added. Further, to the coating solution may be added known additives for increasing adhesion property to the photosensitive layer or for improving preservation stability of the coating solution.

The coating solution for protective layer thus-prepared is coated on the photosensitive layer and dried to form a protective layer. The coating solvent may be appropriately selected in view of the binder used, and when a water-soluble polymer is used, distilled water or purified water is preferably used as the solvent. A coating method of the protective layer is not particularly limited, and known methods, for example, methods described in U.S. Pat. No. 3,458,311 and JP-B-55-49729 can be utilized. Specific examples of the coating method for the protective layer include a blade coating method, an air knife coating method, a gravure coating method, a roll coating method, a spray coating method, a dip coating method and a bar coating method.

The coating amount of the protective layer is preferably in a range of 0.05 to 10 g/m² in terms of the coating amount after drying. When the protective layer contains the inorganic stratiform compound, it is more preferably in a range of 0.1 to 0.5 g/m², and when the protective layer does not contain the inorganic stratiform compound, it is more preferably in a range of 0.5 to 5 g/m².

[Backcoat Layer]

A backcoat layer may be provided on the back surface of the support, if desired. The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

Now, a heat fusion type lithographic printing plate precursor is described below.

<Heat Fusion Type Image-Forming Layer>

The image-forming layer of the heat fusion type lithographic printing plate precursor contains a heat fusible fine particle. The heat fusible fine particle may be a fused form, that is, may have a structure of a latex film.

As the heat fusible fine particle for use in the invention, a heat fusible polymer fine particle is preferable.

Specific examples of the polymer for forming the fine particle include a homopolymer or copolymer obtained from a monomer, for example, ethylene, styrene, vinyl chloride, methyl acrylate, ethyl acrylate, methyl methacrylate, ethyl methacrylate, vinylidene chloride, acrylonitrile or vinyl carbazole and a mixture thereof. Of the polymers, polystyrene and polymethyl methacrylate are preferable.

The fine particle can be produced, for example, by an emulsion polymerization, a suspension polymerization, a method (solvent evaporation method) wherein a polymer is dissolved in an organic solvent, the solution is emulsified and dispersed in water and then the solvent is evaporated or a mechanical dispersion method.

As the heat fusible polymer for forming the heat fusible fine particle for use in the invention, a polymer having a functional group (heat reactive group) reacting by heat is also used. The polymer having the heat reactive group is preferable in view of forming a strong image.

Examples of the heat reactive group include an ethylenically unsaturated group (for example, an acryloyl group, a methacryloyl group, a vinyl group or an allyl group) for conducting a polymerization reaction, an isocyanato group or a blocked isocyanato group and as a reaction partner, a functional group (for example, an amino group, a hydroxy group or a carboxyl group) having an active hydrogen atom for conducting an addition reaction, an epoxy group and as a reaction partner, an amino group, a hydroxy group or a carboxyl group for conducting an addition reaction, a carboxyl group and a hydroxy group or an amino group for conducting a condensation reaction, and an acid anhydride and an amino group or a hydroxy group for conducting a ring-opening addition reaction. However, any functional group for conducting a reaction may be used as long as the functional group can form a chemical bond by heat fusion.

The introduction of the heat reactive group into a polymer particle may be carried out at the time of polymerization of fine particulate polymer or may be carried out using a polymer reaction after the polymerization of fine particulate polymer.

In the case of introducing the heat reactive group at the time of polymerization of fine particulate polymer, it is preferred that a monomer having the heat reactive group is subjected to emulsion polymerization or suspension polymerization. Examples of the monomer having such a functional group include allyl methacrylate, allyl acrylate, vinyl methacrylate, vinyl acrylate, glycidyl methacrylate, glycidyl acrylate, 2-isocyanatoethyl methacrylate or its blocked isocyanato, for example, with an alcohol, 2-isocyanatoethyl acrylate or its blocked isocyanato, for example, with an alcohol, 2-aminoethyl methacrylate, 2-aminoethyl acrylate, 2-hydroxyethyl methacrylate, 2-hydroxyethyl acrylate, acrylic acid, methacrylic acid, maleic anhydride, a difunctional acrylate and a difunctional methacrylate, but the invention should not be construed as being limited thereto.

In the case of introducing the heat reactive group at the time of polymerization, it is also possible to copolymerize a monomer having no such a heat reactive group with the monomer having the heat reactive group. Examples of the copolymerizable monomer having no such a heat reactive group include styrene, alkyl acrylate, alkyl methacrylate, acrylonitrile and vinyl acetate, but the invention should not be construed as being limited thereto and any monomer having no such a heat reactive group may be used.

The polymerization reaction using for the case of introduction of the heat reactive group after the polymerization of fine particulate polymer includes, for example, polymer reactions described in WO 96/34316.

The weight average molecular weight of any of the polymer fine particle having no heat reactive group and the polymer fine particle having heat reactive group is suitably in a range of 2,000 to 1,000,000.

The average particle size of the polymer fine particle is preferably from 0.01 to 20 μm, more preferably from 0.03 to 1.00 μm, particularly preferably from 0.05 to 0.40 μm, from the standpoint of achieving a good balance between the image-forming property and developing property.

In view of the image-formation, it is preferred that the polymer fine particle contains a light-to-heat converting agent because of good heat efficiency at the time of exposure. The polymer fine particle containing a light-to-heat converting agent can be obtained by dissolving the light-to-heat converting agent together with the polymer in a water-insoluble organic solvent in the solvent evaporation method described above.

A hydrophilic resin may be added to the image-forming layer of the heat fusion type lithographic printing plate precursor according to the invention. By the addition of the hydrophilic resin, not only the developing property in an aqueous solution having pH of 2 to 10 but also the film strength of the image-forming layer per se are improved. A hydrophilic resin having no three-dimensional crosslinkage structure is preferable as the hydrophilic resin because of good developing property.

Preferable examples of the hydrophilic resin include resins having a hydrophilic group, for example, a hydroxy group, a carboxyl group, a hydroxyethyl group, a hydroxypropyl group, an amino group, an aminoethyl group, an aminopropyl group and a carboxymethyl group.

Specific examples of the hydrophilic resin include arabic gum, casein, gelatin, a starch derivative, soya gum, hydroxypropyl cellulose, methyl cellulose, carboxymethyl cellulose or sodium salt thereof, cellulose acetate, sodium alginate, a vinyl acetate-maleic acid copolymer, a styrene-maleic acid copolymer, polyacrylic acid or a salt thereof, polymethacrylic acid or a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, polyethylene glycol, a hydroxypropylene polymer, polyvinyl alcohol, hydrolyzed polyvinyl acetate having a hydrolysis degree of 60% by weight or more, preferably 80% by weight or more, polyvinyl formal, polyvinyl butyral, polyvinyl pyrrolidone, a homopolymer or copolymer of acrylamide, a homopolymer or copolymer of methacrylamide, a homopolymer or copolymer of N-methylolacrylamide and 2-acrylamido-2-methylpropanesulfonic acid or a salt thereof.

The amount of the hydrophilic resin added to the image-forming layer is preferably from 2 to 40% by weight, more preferably from 3 to 30% by weight, based on the total solid content of the image-forming layer from the standpoint of good developing property and high printing durability.

To the image-forming layer of the heat fusion type lithographic printing plate precursor according to the invention may be added various compounds, for example, a light-to-heat converting agent which absorbs light to generate heat, an inorganic fine particle, a surfactant, a coloring agent or a plasticizer, if desired, in addition to the resin fine particle and hydrophilic resin, for various purposes, for example, of improving sensitivity, controlling degree of hydrophilicity, improving physical strength of the image-forming layer, improving mutual dispersibility of components constituting the layer, improving coating property, improving printing aptitude, or increasing workability in plate making. The compounds added are described below.

The light-to-heat converting agent may be a substance capable of absorbing light of 700 nm or more and various pigments, dyes and metal fine particles can be used. Specific examples of the light-to-heat converting agent include the inferred absorbing agents described with respect to the photosensitive layer of the radical polymerization type lithographic printing plate precursor.

Preferable examples of the inorganic fine particle include silica, alumina, magnesium oxide, titanium oxide, magnesium carbonate, potassium alginate and a mixture thereof. The inorganic fine particle can be used for strengthening film or increasing an interfacial adhesion property due to surface roughening even if it does not have the light-to-heat converting property.

The average particle size of the inorganic fine particle is preferably from 5 nm to 10 μm, more preferably from 10 nm to 1 μm. In the range of the average particle size described above, the inorganic fine particle is stably dispersed together with the resin fine particle and metal fine particle as the light-to-heat converting agent in the hydrophilic resin to sufficiently maintain the film strength of the image-forming layer and to form the non-image area excellent in the hydrophilicity and prevented from printing stain.

The inorganic fine particle is easily available as a commercial product, for example, colloidal silica dispersion. The content of the inorganic fine particle in the image-forming layer is preferably from 1.0 to 70% by weight, more preferably from 5.0 to 50% by weight, based on the total solid content of the image-forming layer.

To the image-forming layer may be added a surfactant, for example, a nonionic surfactant, an anionic surfactant, a cationic surfactant as described in JP-A-2-195396, a fluorine-containing surfactant or an amphoteric surfactant as described in JP-A-59-121044 and JP-A-4-13149, in order to enlarge stability against the variations of printing conditions.

The content of the surfactant is preferably from 0.05 to 15% by weight, more preferably from 0.1 to 5% by weight, based on the total solid content of the image-forming layer.

In order to easily distinguish the image area and the non-image area after the image formation, a dye having large absorption in the visible light region can be used as a coloring agent for the image in the image-forming layer. Specific examples of the coloring agent include Oil Yellow #101, Oil Yellow #103, Oil Pink #312, Oil Green BG, Oil Blue BOS, Oil Blue #603, Oil Black BY, Oil Black BS, Oil Black T-505 (produced by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000), Methylene Blue (CI52015), and dyes described in JP-A-62-293247. Also, a pigment, for example, phthalocyanine-based pigment, azo-based pigment and titanium oxide can be preferably used. The amount of the coloring agent added is preferably from 0.01 to 10% by weight based on the total solid content of the image-forming layer.

A plasticizer may be added to the image-forming layer in order to impart flexibility or the like of the coated film. For example, polyethylene glycol, tributyl citrate, diethyl phthalate, dibutyl phthalate, dihexyl phthalate, dioctyl phthalate, tricresyl phosphate, tributyl phosphate, trioctyl phosphate or tetrahydrofurfuryl oleate is used.

The image-forming layer is formed by dissolving or dispersing each of the necessary constituting components described above in water or a mixed solvent including an organic solvent, if desired, to prepare a coating solution and coating the solution. The solid concentration of the coating solution is preferably from 1 to 50% by weight.

Various methods can be used for the coating. Examples of the method include bar coater coating, spin coating, spray coating, curtain coating, dip coating, air knife coating, blade coating and roll coating. The coating amount (solid content) of the image-forming layer after the coating and drying on the support may be varied depending on the use but ordinarily, it is preferably from 0.5 to 5.0 g/m$^2$, more preferably from 0.5 to 2.0 g/m$^2$.

The concentration of the solid content of the image-forming layer in the coating solution is more preferably from 2 to 20% by weight, and further more preferably from 5 to 15% by weight. In the range described above, good dispersibility of the fine particle in the coating solution and good fusion of the polymer fine particle after coating and drying the coating solution to from the image-forming layer.

According to the invention, a hydrophilic layer may be provided between the support and the image-forming layer. A preferable hydrophilic layer is a hydrophilic layer which is three-dimensionally crosslinked, is not dissolved in dampening water at lithographic printing using dampening water and/or ink and contains a colloid shown below.

Specifically, a colloid comprising a sol-gel conversion system of an oxide or hydroxide of beryllium, magnesium, aluminum, silicon, titanium, boron, germanium, tin, zirconium, iron, vanadium, antimony or a transition metal is used. A colloid comprising a complex of the elements is also used. The colloid has the structure including the network structure formed by the element described above through an oxygen atom and the unbonded hydroxy group or alkoxy group in mixture.

A hydrophilic overcoat layer can be provided on the image-forming layer of the heat fusion type lithographic printing plate precursor according to the invention for protecting the hydrophilic surface of image-forming layer from contamination due to a lipophilic substance during the preservation or finger mark contamination due to touch with finger at the handling.

As the hydrophilic overcoat layer, a layer same as the protective layer described for the radical polymerization type lithographic printing plate precursor can be used.

In order to enhance the absorption efficiency of infrared ray and to increase sensitivity, it is preferred to add a light-to-heat converting agent which absorbs infrared ray to generate heat to at least one of the image-forming layer, hydrophilic layer and overcoat layer of the heat fusion type lithographic printing plate precursor according to the invention.

Now, a polarity conversion type lithographic printing plate precursor is described below.

<Polarity Conversion Type Image-Forming Layer>

The polarity conversion type image-forming layer is an image-forming layer having a property capable of changing hydrophilicity-hydrophobicity in the exposed area by laser exposure and it includes two types image-forming layers, specifically, (1) a negative type image-forming layer having a property changing from hydrophilic to hydrophobic by the laser exposure and (2) a positive type image-forming layer having a property changing from hydrophobic to hydrophilic by the laser exposure. Each of the image-forming layers will be described below.

As the negative type image-forming layer changing from hydrophilic to hydrophobic by the laser exposure, image-forming layers described, for example, in JP-A-2000-122272 are preferably used. As the image-forming layer of such a type, a layer containing a binder polymer having a specific functional group, particularly, at least any group selected from a carboxylic acid group and carboxylate group capable of undergoing decarboxylation by heat is preferable.

The polymer having at least any group selected from a carboxylic acid group and carboxylate group capable of undergoing decarboxylation by heat is not particularly restricted and polymers represented by formulae (1) and (2) shown below are preferable.

In formulae (1) and (2), X represents a group selected from elements of group 4 to group 6, oxides thereof, sulfides thereof, selenides thereof and tellurides thereof, P represents a polymer main chain, L represents a divalent connecting group, $R^1$ and $R^2$, which may be the same or different, each represents a monovalent group, and M represents a group selected from an alkali metal, an alkaline earth metal and an onium.

$R^1$ and $R^2$ each preferably includes a straight-chain alkyl group having from 1 to 12 carbon atoms, a branched alkyl group having from 3 to 12 carbon atoms and a cyclic alkyl group having from 5 to 10 carbon atoms.

L preferably includes structural units shown below and combinations thereof

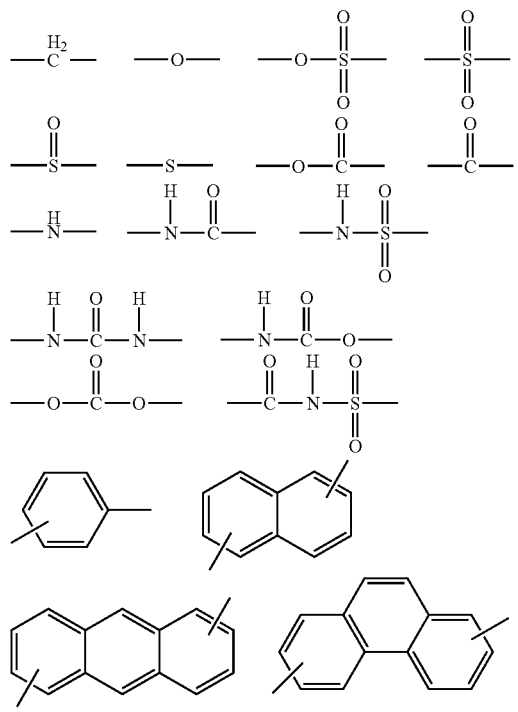

X preferably includes —CO—, —SO— and —SO$_2$—.

M preferably includes a metal cation of monovalent to tetravalent and an ammonium salt represented by formula (3) shown below.

Formula (3):

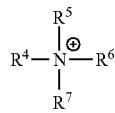

In formula (3), $R^4$, $R^5$, $R^6$ and $R^7$, which may be the same or different, each represents a monovalent group.

The polymer main chain skeleton represented by P is not particularly restricted and preferably includes, for example, a (meth)acrylic resin and a urethane resin.

The binder polymer used in the image-forming layer preferably has a weight average molecular weight of 2,000 or more, more preferably in a range of 5,000 to 300,000, and a number average molecular weight of 800 or more, more preferably in a range of 1,000 to 250,000. The polydispersity (weight average molecular weight/number average molecular weight) is preferably 1 or more, more preferably in a range of 1.1 to 10. The binder polymer may be any of a random polymer, a block polymer, a graft polymer and the like, and it is preferably a random polymer.

The content of the binder polymer is ordinarily from 50 to 95% by weight, preferably from 70 to 90% by weight, based on the total solid content of the image-forming layer. When the content is less than 50% by weight, the printing image may become unclear, whereas the content exceeds 95% by weight, the formation of image by laser exposure may not be sufficiently performed.

The image-forming layer may contain other constituting components, if desired, in addition to the binder polymer described above as long as the effects of the invention are not damaged. Examples of the constituting component other than the binder polymer include various additives, for example, the polymerizable compound, sensitizing dye and polymerization initiator as described with respect to the photosensitive layer of the radical polymerization type lithographic printing plate precursor and the heat fusible fine particle, light-to-heat converting agent, hydrophilic polymer, inorganic fine particle, surfactant, coloring agent and plasticizer as described with respect to the photosensitive layer of the heat fusion type lithographic printing plate precursor.

As the positive type image-forming layer changing from hydrophobic to hydrophilic by the laser exposure, image-forming layers described, for example, in JP-A-11-174685 are preferably used. As the image-forming layer of such a type, a layer containing a hydrophobic binder polymer (hereinafter, also referred to as a "heat-sensitive binder polymer") having a specific functional group and changing to hydrophilic upon energy generated by laser exposure is preferable. The heat-sensitive binder polymer is a binder polymer which ordinarily does not exhibit affinity for water, for example, water-soluble or water-swellable property, but exhibits the affinity for water, for example, water-soluble or water-swellable property, when the its structure is partially or wholly changed by heat. Examples of such a polymer include a hydrophobic binder polymer having a functional group represented by any one of formulae (4) to (8) shown below in its side chain.

 (4)

 (5)

 (6)

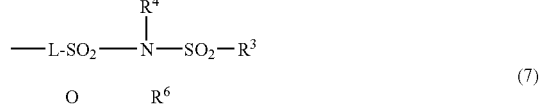 (7)

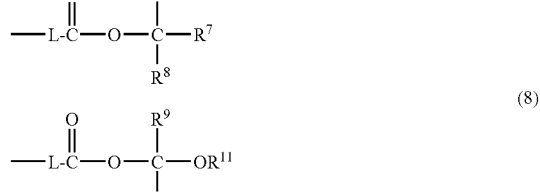 (8)

In formulae (4) to (8), L represents a polyvalent organic group comprising a nonmetallic atom connecting to a main chain of the hydrophobic binder polymer, $R^1$ represents an aryl group, an alkyl group or a cyclic imido group, $R^2$ and $R^3$ each independently represents an aryl group or an alkyl group, $R^4$ represents an aryl group, an alkyl group or a —SO$_2R^5$ group, $R^5$ represents an aryl group or an alkyl group, $R^6$, $R^7$ and $R^8$ each independently represents an aryl group or an alkyl group, or appropriate two or three of $R^6$, $R^7$ and $R^8$ may combined with each other to from a ring, one of $R^9$ and $R^{11}$ represents a hydrogen atom and the other represents a hydrogen atom, an aryl group or an alkyl group, $R^{11}$ represents an alkyl group, or $R^9$ and $R^{11}$ or $R^{10}$ and $R^{11}$ may be combined with each other to from a ring. The polyvalent connecting group comprising a nonmetallic atom for L comprises from 1 to 60 carbon atoms, from 0 to 10 nitrogen atoms, from 0 to 50 oxygen atoms, from 1 to 100 hydrogen atoms and from 0 to 20 sulfur atoms. Specifically, L includes the structural unit described for the preferable examples of L in formula (1) or (2) above and combinations thereof.

The heat-sensitive binder polymer used in the image-forming layer preferably has a weight average molecular weight of 2,000 or more, more preferably in a range of 5,000 to 300,000, and a number average molecular weight of 800 or more, more preferably in a range of 1,000 to 250,000. The polydispersity (weight average molecular weight/number average molecular weight) is preferably 1 or more, more preferably in a range of 1.1 to 10. The binder polymer may be any of a random polymer, a block polymer, a graft polymer and the like, and it is preferably a random polymer.

The content of the heat-sensitive binder polymer is ordinarily from 50 to 95% by weight, preferably from 70 to 90% by weight, based on the total solid content of the image-forming layer. When the content is less than 50% by weight, the printing image may become unclear, whereas the content exceeds 95% by weight, the formation of image by laser exposure may not be sufficiently performed.

The image-forming layer may contain other constituting components, if desired, in addition to the binder polymer described above as long as the effects of the invention are not damaged. Examples of the constituting component other than the binder polymer include various additives, for example, the polymerizable compound, sensitizing dye and polymerization initiator as described with respect to the photosensitive layer of the radical polymerization type lithographic printing plate precursor and the heat fusible fine particle, light-to-heat converting agent, hydrophilic polymer, inorganic fine particle, surfactant, coloring agent and plasticizer as described with respect to the photosensitive layer of the heat fusion type lithographic printing plate precursor.

An overcoat layer can be provided on the image-forming layer of the polarity conversion type lithographic printing plate precursor according to the invention for protecting the surface of image-forming layer from contamination due to a lipophilic substance during the preservation or finger mark contamination due to touch with finger at the handling.

As the overcoat layer, a layer same as the protective layer described for the radical polymerization type lithographic printing plate precursor can be used.

It is believed that in the lithographic printing plate precursor according to the invention, by using the support having a surface, a contact angle value of water droplet in air on which is 70° or more, the adhesion property between the photosensitive layer and the interface of the support is increased so that high printing durability is achieved. On the other hand, in the non-image area after removing the photosensitive layer, the surface of support is treated with an aqueous solution having pH of 2 to 10 to decrease the contact angle value of water droplet in air on the surface of support to 30° or less so that the lithographic printing plate prepared has good stain resistance in the non-image area during printing.

[Method of Preparing Lithographic Printing Plate]

The method of preparing a lithographic printing plate according to the invention is described below. The method of preparing a lithographic printing plate according to the invention mainly comprises exposing imagewise the lithographic printing plate precursor, if desired, heating the entire surface of the exposed lithographic printing plate precursor, and undergoing any one of plate making processes (1) to (3) shown below:

(1) developing the exposed lithographic printing plate precursor using dampening water containing a compound (hereinafter, also referred to as a "hydrophilizing compound") having a functional group Y on a printing machine; (2) developing the exposed lithographic printing plate precursor with a developer having pH of 2 to 10 and containing the hydrophilizing compound; and (3) developing the exposed lithographic printing plate precursor with a developer having pH of 2 to 10 and undergoing a hydrophilization treatment with an aqueous solution having pH of 2 to 10 and containing the hydrophilizing compound.

According to the process, the compound having a functional group Y forms a chemical bond with the compound having a functional group X present on the surface of support to be fixed on the surface of support and as a result, the contact angle of water droplet in air on the surface of support can be decreased to 30° or less. The contact angle value of water droplet in air on the surface of support after the process is preferably 25° or less, more preferably 20° or less.

[Hydrophilizing Compound]

According to the invention, in order to decrease the contact angle of water droplet in air on the surface of support to 30° or less, the compound having a functional group Y is used which can decrease the contact angle of water droplet in air on the surface of support to 30° or less when it is brought into contact with the compound having a functional group X. The compound having a functional group Y may be any compound having a characteristic of decreasing the contact angle of water droplet in air on the surface of support to 30° or less when the compound is brought into contact with the compound having a functional group X.

For instance, in the case wherein the compound having a functional group X present on the surface of support is a compound having the functional group represented by formula (0) described hereinbefore, a compound having at least one acidic functional group selected from —COOH, —SO$_3$H, —PO(OH)(OM) and —B(OH)(OM) wherein M represents a hydrogen atom, a metal cation, an ammonium group, a phosphonium group, an iodonium group, a sulfonium group, a diazonium group or an azinium group is preferably used as the compound having a functional group Y. It is believed that such a hydrophilizing compound is adsorbed on the surface of support by an interaction, for example, an acid-base interaction between the functional group Y and the functional group X present on the surface of support, thereby decreasing the contact angle of water droplet in air on the surface of support.

The hydrophilizing compound used may be any of low molecular weight compound and high molecular weight compound as long as the compound exerts the function as described above, but it is preferably the high molecular weight compound. By using the high molecular weight compound, adsorption power to the support increases and stain resistance is further improved. The high molecular weight compound preferably has a weight average molecular weight of 1,000 or more, more preferably 5,000 or more.

Specific examples of the hydrophilizing compound used include gum arabic, casein, gelatin, a starch derivative, carboxymethyl cellulose or a sodium salt thereof, sodium alginate, a vinyl acetate-maleic acid copolymer, a styrene-maleic acid copolymer, polyacrylic acid or a salt thereof, polymethacrylic acid or a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, polyethylene glycol a hydroxypropylene polymer, polyvinyl alcohol, hydrolyzed polyvinyl acetate having a hydrolysis degree of 60% by mole or more, preferably 80% by mole or more, polyvinyl formal, polyvinyl butyral, polyvinyl pyrrolidone, a copolymer of acrylamide, a copolymer of methacrylamide, a copolymer of N-methylolacrylamide, a homopolymer or copolymer of 1-methyl-3-sulfopropylacrylamide or a salt thereof and a homopolymer or copolymer of methacryloyloxyethylphosphate or a salt thereof, each of which has the acidic functional group. Particularly, polyacrylic acid having the acidic functional group or a salt thereof or polymethacrylic acid having the acidic functional group or a salt thereof is preferably used.

Further, in the case wherein the compound having a functional group X present on the surface of support is a compound having a functional group selected from the functional groups represented by formulae (1) to (5) described hereinbefore, a compound having a functional group selected from the functional groups represented by formulae (6) to (8) described hereinbefore is preferably used as the compound having a functional group Y. The compounds having the functional group represented by formula (6) or (7) are more preferable, and the compounds having the functional group represented by formula (7) are particularly preferable. It is believed that such a hydrophilizing compound is adsorbed on the surface of support by an interaction, for example, an electrostatic interaction between the functional group Y and the functional group X present on the surface of support, thereby decreasing the contact angle of water droplet in air on the surface of support.

The hydrophilizing compound used may be any of low molecular weight compound and high molecular weight compound as long as the compound exerts the function as described above, but it is preferably the high molecular weight compound. By using the high molecular weight compound, adsorption power to the support increases and stain resistance is further improved. The high molecular weight compound preferably has a weight average molecular weight of 1,000 or more, more preferably 5,000 or more, particularly preferably 10,000 or more.

Specific examples of the hydrophilizing compound used include gum arabic, casein, gelatin, a starch derivative, carboxymethyl cellulose or a sodium salt thereof, cellulose acetate, sodium alginate, a vinyl acetate-maleic acid copolymer, a styrene-maleic acid copolymer, polyacrylic acid or a salt thereof, polymethacrylic acid or a salt thereof, polyvinylbenzoic acid or a salt thereof, polyvinylbenzenesulfonic acid or a salt thereof, a homopolymer or copolymer of 2-acrylamido-2-methylpropanesulfonic acid or a salt thereof and a homopolymer or copolymer of methacryloyloxyethylphosphoric acid or a salt thereof.

Of the combinations wherein the functional group X is at least one group selected from the functional groups represented by formulae (1) to (5) and the functional group Y is at least one group selected from the functional groups represented by formulae (6) to (8), a combination wherein the functional group X is the functional group represented by formula (1) or (2) and the functional group Y is the functional group represented by formula (6) or (7) is preferable, and a combination wherein the functional group X is the functional group represented by formula (1) and the functional group Y is the functional group represented by formula (7) is particularly preferable.

Moreover, in the case wherein the compound having a functional group X present on the surface of support is a compound having a functional group selected from the functional groups represented by formulae (9) to (11) described hereinbefore, a compound having a functional group selected from the functional groups represented by formulae (12) to (16) described hereinbefore is preferably used as the compound having a functional group Y. The compounds having the functional group represented by formula (9) or (10) are more preferable, and the compounds having the functional group represented by formula (9) are particularly preferable. It is believed that such a hydrophilizing compound is adsorbed on the surface of support by an interaction, for example, an electrostatic interaction between the functional group Y and the functional group X present on the surface of support, thereby decreasing the contact angle of water droplet in air on the surface of support.

The hydrophilizing compound used may be any of low molecular weight compound and high molecular weight compound as long as the compound exerts the function as described above, but it is preferably the high molecular weight compound. By using the high molecular weight compound, adsorption power to the support increases and stain resistance is further improved. The high molecular weight compound preferably has a weight average molecular weight of 1,000 or more, more preferably 5,000 or more.

Specific examples of the hydrophilizing compound used include a starch derivative, for example, ammonium-modified starch, a homopolymer or copolymer of 3-acrylamidopropyltrimethylammonium chloride, a homopolymer or copolymer of 3-acrylamidopropyltrimethylammonium methylsulfate, a homopolymer or copolymer of 2-methacryloyloxyethyltrimethylammonium chloride, a homopolymer or copolymer of 4-vinylbenzylmethyltriethylammonium chloride and a homopolymer or copolymer of methacryloyloxybutyltriphenylphosphonium chloride.

Of the combinations wherein the functional group X is at least one group selected from the functional groups represented by formulae (9) to (11) and the functional group Y is at least one group selected from the functional groups represented by formulae (12) to (16), a combination wherein the functional group X is the functional group represented by formula (9) or (10) and the functional group Y is the functional group represented by formula (12) or (13) is preferable, and a combination wherein the functional group X is the functional group represented by formula (10) and the functional group Y is the functional group represented by formula (12) is particularly preferable.

The combinations of the functional group X and functional group Y are not restricted to the specific examples described above and any combination of functional groups which can decrease a contact angle of water droplet in air on the surface of support of 70° or more to 30° or less may be used.

Any means may be used in order to bring the compound having the functional group Y into contact with the compound having the functional group X. From the standpoint of efficiently performing the contact of both functional groups, it is preferred to perform the contact in the presence of water. Specifically, for example, a method wherein a support having a compound having the functional group X on its surface is treated with an aqueous solution having pH of 2 to 10 and containing a compound having the functional group Y is used. An embodiment for supplying the aqueous solution includes, for example, dampening water at printing, a developer and a treatment solution after development. Components other than the compound having the functional group Y are appropriately adjusted depending on the embodiment for supplying.

[Exposure]

The lithographic printing plate precursor according to the invention is preferably exposed imagewise with a laser having an oscillation wavelength of 350 to 1,200 mL (1) An infrared laser can be used as the laser light source. The infrared laser used is not particularly restricted and preferably includes a solid laser or semiconductor laser emitting an infrared ray having a wavelength of 760 to 1,200 nm. The output of the infrared laser is preferably 100 mW or more. Further, in order to shorten the exposure time, it is preferred to use a multibeam laser device. The exposure time is preferably 20 microseconds per pixel or less. Also, the irradiation energy is preferably from 10 to 300 mJ/cm$^2$.

(2) A semiconductor laser of 405 nm or 830 nm, an FD-YAG laser or the like is also used as the laser light source. In recent years, a CTP system equipped with a semiconductor laser of 405 nm has become widespread in view of handling properties. For instance, the lithographic printing plate precursor is loaded in the inner drum exposure apparatus equipped with a light source having an oscillation wavelength in a range of 350 to 450 nm (wherein a light beam emitted from the light source is parallel divided into an ordinary beam and an extraordinary beam in an equal amount and these two beam spots are adjacently aligned with a partial overlap in the sub-scanning direction to form a spot shape of light beam) and is subjected to exposure with the spot shape of light beam to perform image recording.

The exposure apparatus for use in the invention may be any of an internal drum system, an external drum system and a flat bed system. Further, the highly accurate image can be recorded at high speed by simultaneously recording the image using a multibeam exposure system.

Moreover, the image-recording can be performed using an FM screen at the exposure of lithographic printing plate precursor according to the invention.

[Heating]

According to the invention, the lithographic printing plate precursor exposed imagewise may be heated overall between the exposure and development, if desired. By the heating, the image-forming reaction in the photosensitive layer is accelerated to achieve advantages, for example, improvement in the sensitivity and printing durability and stabilization of the sensitivity.

In the case where the protective layer is provided on the photosensitive layer, it is also preferred to carry out a water washing treatment before the development processing.

[Plate Making]

The lithographic printing plate precursor according to the invention is exposed imagewise with a semiconductor laser or a solid laser as described above, if desired, heated the entire surface of the exposed lithographic printing plate precursor as described above, and then subjected to printing by supplying oily ink and an aqueous component containing the hydrophilizing compound described above without undergoing the development processing step. Specifically, for example, a method wherein the lithographic printing plate precursor is exposed with a laser, heated the entire surface in an oven and then mounted on a printing machine to conduct printing without undergoing the development processing step or a method wherein the lithographic printing plate precursor is mounted on a printing machine, exposed with a laser on the printing machine, heated the entire surface on the printing machine and then subjected to printing without undergoing the development processing step is exemplified.

For instance, according to one embodiment of negative type lithographic printing plate precursor of on-machine development type, after the imagewise exposure of the lithographic printing plate precursor with a laser, when an aqueous component containing the hydrophilizing compound and oily ink are supplied to conduct printing without undergoing the development processing step, for example, a wet development processing step, in the exposed area of the photosensitive layer, the photosensitive layer cured by the exposure forms the oily ink receptive area having the oleophilic surface. On the other hand, in the unexposed area, the uncured photosensitive layer is removed by dissolution or dispersion with the aqueous component containing the hydrophilizing compound and/or oily ink supplied to reveal the surface of support in the area. As a result, the aqueous component adheres on the revealed surface of support and the oily ink adheres to the exposed area of the photosensitive layer, whereby printing is initiated. While either the aqueous component containing the hydrophilizing compound or oily ink may be supplied at first on the surface of lithographic printing plate precursor, it is preferred to supply the oily ink at first in view of preventing the aqueous component containing the hydrophilizing compound from contamination with the unexposed area of the photosensitive layer. For the aqueous component containing the hydrophilizing compound and oily ink, a solution prepared by adding the hydrophilizing compound to dampening water for conventional lithographic printing and printing ink are used respectively.

Thus, the lithographic printing plate precursor is subjected to the on-machine development on an offset printing machine and used as it is for printing a large number of sheets.

In accordance with another embodiment of the plate making method of the lithographic printing plate precursor according to the invention, the lithographic printing plate precursor is exposed imagewise with a laser, if desired, heated the entire surface of the exposed lithographic printing plate precursor as described above, and then rubbed a surface of the exposed lithographic printing plate precursor with a rubbing member in the presence of a developer having pH of 2 to 10 and containing the hydrophilizing compound in an automatic processor equipped with the rubbing member to remove the unexposed area of the photosensitive layer, thereby preparing a lithographic printing plate.

Further, still another embodiment of the plate making method of the lithographic printing plate precursor according to the invention, the lithographic printing plate precursor is exposed imagewise with a laser, if desired, heated the entire surface of the exposed lithographic printing plate precursor as described above, rubbed a surface of the exposed lithographic printing plate precursor with a rubbing member in the presence of a developer having pH of 2 to 10 in an automatic processor equipped with the rubbing member to remove the unexposed area of the photosensitive layer, and then an aqueous solution (hereinafter, also referred to as a "hydrophilizing aqueous solution") containing the hydrophilizing compound is brought into contact with the surface of support revealed by a method, for example, immersion, spray or coating to prepare a lithographic printing plate.

The developer for use in the invention is preferably, for example, water alone or an aqueous solution containing water as a main component (containing 60% by weight or more of water). Particularly, an aqueous solution having the composition similar to that of conventionally known dampening water, an aqueous solution containing a surfactant (for example, an anionic, nonionic or cationic surfactant) and an aqueous solution containing a water-soluble polymer compound are preferable. An aqueous solution containing both a surfactant and a water-soluble polymer compound is especially preferable. The pH of the developer is more preferably from 3 to 8, and still more preferably from 4 to 7.

The anionic surfactant used in the invention includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated castor oil sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, dialkylsulfosuccinic acid salts, alkyl sulfate ester salts and alkylnaphthalenesulfonic acid salts are particularly preferably used.

The cationic surfactant used in the invention is not particularly limited and conventionally known cationic surfactants can be used. Examples of the cationic surfactant include alkylamine salts, quaternary ammonium salts, polyoxyethylene alkyl amine salts and polyethylene polyamine derivatives.

The nonionic surfactant used in the invention includes, for example, polyethylene glycol type higher alcohol ethylene oxide addacts, alkylphenol ethylene oxide addacts, fatty acid ethylene oxide addacts, polyhydric alcohol fatty acid ester ethylene oxide addacts, higher alkylamine ethylene oxide addacts, fatty acid amide ethylene oxide addacts, ethylene oxide addacts of fat, polypropylene glycol ethylene oxide addacts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines.

In the invention, ethylene oxide addacts of sorbitol and/or sorbitan fatty acid esters, polypropylene glycol ethylene oxide addacts, dimethylsiloxane-ethylene oxide block copolymers, dimethylsiloxane-(propylene oxide-ethylene oxide) block copolymers and fatty acid esters of polyhydric alcohols are more preferable.

Further, from the standpoint of stable solubility in water or opacity, with respect to the nonionic surfactant used in the developer according to the invention, the HLB (hydrophile-lipophile balance) value thereof is preferably 6 or more, more preferably 8 or more.

Furthermore, an oxyethylene adduct of acetylene glycol type or acetylene alcohol type or a surfactant, for example, a fluorine-based surfactant or a silicon-based surfactant can also be used.

Of the surfactants used in the developer, the nonionic surfactant is particularly preferable in view of foam depressing property.

The surfactants may be used individually or as a mixture of two or more thereof. The content of the surfactant in the developer is preferably from 0.01 to 10% by weight, more preferably from 0.01 to 5% by weight.

The water-soluble polymer compound for use in the developer according to the invention includes, for example, soybean polysaccharide, modified starch, gum arabic, dextrin, a cellulose derivative (for example, carboxymethyl cellulose, carboxyethyl cellulose or methyl cellulose) or a modified product thereof, pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, those known can be used. For example, as a commercial product, Soyafive (trade name, produced by Fuji Oil Co., Ltd.) is available and various grade products can be used. The soybean polysaccharide preferably used has viscosity in a range from 10 to 100 mPa/sec in a 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more of the water-soluble polymer compounds may be used in combination. The content of the water-soluble polymer compound in the developer is preferably from 0.1 to 20% by weight, more preferably from 0.5 to 10% by weight, in the developer.

The developer according to the invention may contain an organic solvent. The organic solvent that can be contained in the developer include, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or monochlorobenzene) and a polar solvent.

Examples of the polar solvent include an alcohol (e.g., methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine or N-phenyldiethanolamine).

When the organic solvent is insoluble in water, it may be employed by being solubilized in water using a surfactant or the like. In the case where the developer contains the organic solvent, the concentration of the organic solvent is desirably less than 40% by weight in view of safety and inflammability.

Into the developer, an antiseptic agent, a chelating agent, a defoaming agent, an organic acid, an inorganic acid, an inorganic salt or the like can be incorporated in addition to the above components.

As the antiseptic agent, for example, phenol or a derivative thereof, formalin, an imidazole derivative, sodium dehydroacetate, a 4-isothiazolin-3-one derivative, benzisothiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative and a nitro bromo alcohol, e.g., 2-bromo-2-nitropropane-1,3-diol, 1,1-dibromo-1-nitro-2-ethanol or 1,1-dibromo-1-nitro-2-propanol are preferably used.

As the chelating agent, for example, ethylenediaminetetraacetic acid, potassium salt thereof, sodium salt thereof; diethylenetriaminepentaacetic acid, potassium salt thereof sodium salt thereof; triethylenetetraminehexaacetic acid, potassium salt thereof, sodium salt thereof, hydroxyethylethylenediaminetriacetic acid, potassium salt thereof, sodium salt thereof, nitrilotriacetic acid, sodium salt thereof, organic phosphonic acids, for example, 1-hydroxyethane-1,1-diphosphonic acid, potassium salt thereof, sodium salt thereof; aminotri(methylenephosphonic acid), potassium salt thereof, sodium salt thereof; and phosphonoalkanetricarboxylic acids are illustrated. A salt of an organic amine is also effectively used in place of the sodium salt or potassium salt in the chelating agents.

As the defoaming agent, for example, a conventional silicone-based self-emulsifying type or emulsifying type defoaming agent, and a nonionic surfactant having HLB of 5 or less are used. The silicone defoaming agent is preferably used. Any of emulsifying dispersing type and solubilizing type can be used.

As the organic acid, for example, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid and an organic phosphonic acid are illustrated. The organic acid can also be used in the form of an alkali metal salt or an ammonium salt.

As the inorganic acid and inorganic salt, for example, phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate and nickel sulfate are illustrated.

The developer described above can be used as a developer and a development replenisher for an exposed lithographic printing plate precursor, and it is preferably applied to an automatic processor described hereinafter. In the case of conducting the development processing using an automatic processor, the developer becomes fatigued in accordance with the processing amount, and hence the processing ability may be restored using a replenisher or a fresh developer. Such a replenishment system can be preferably applied to the plate making method of the lithographic printing plate precursor according to the invention.

The development processing using the aqueous solution having pH of 2 to 10 according to the invention is preferably performed by an automatic processor equipped with a supplying means for a developer and a rubbing member. As the automatic processor, there are illustrated an automatic processor in which a lithographic printing plate precursor after image exposure is subjected to a rubbing treatment while it is transporting described in JP-A-2-220061 and JP-A-60-59351, and an automatic processor in which a lithographic printing plate precursor after image-recording placed on a cylinder is subjected to a rubbing treatment while rotating the cylinder described in U.S. Pat. Nos. 5,148,746 and 5,568,768 and British Patent 2,297,719. Among them, the automatic processor using a rotating brush roll as the rubbing member is particularly preferred.

The rotating brush roller which can be preferably used in the invention can be appropriately selected by taking account, for example, of scratch resistance of the image area and nerve strength of the support of the lithographic printing plate precursor. As for the rotating brush roller, a known rotating brush roller produced by implanting a brush material in a plastic or metal roller can be used. For example, a rotating brush roller described in JP-A-58-159533 and JP-A-3-100554, or a brush roller described in JP-U-B-62-167253 (the term "JP-UM-B" as used herein means an "examined Japanese utility model publication"), in which a metal or plastic groove-type member having implanted therein in rows a brush material is closely radially wound around a plastic or metal roller acting as a core, can be used.

As the brush material, a plastic fiber (for example, a polyester-based synthetic fiber, e.g., polyethylene terephthalate or polybutylene terephthalate; a polyamide-based synthetic fiber, e.g., nylon 6.6 or nylon 6.10; a polyacrylic synthetic fiber, e.g., polyacrylonitrile or polyalkyl (meth)acrylate; and a polyolefin-based synthetic fiber, e.g., polypropylene or polystyrene) can be used. For instance, a brush material having a fiber bristle diameter of 20 to 400 μm and a bristle length of 5 to 30 mm can be preferably used. The outer diameter of the rotating brush roller is preferably from 30 to 200 mm, and the peripheral velocity at the tip of the brush rubbing the plate surface is preferably from 0.1 to 5 m/sec. It is preferred to use a plurality, that is, two or more of the rotating brush rollers.

The rotary direction of the rotating brush roller for use in the invention may be the same direction or the opposite direction with respect to the transporting direction of the lithographic printing plate precursor according to the invention, but when two or more rotating brush rollers are used in an automatic processor as shown in FIG. 1, it is preferred that at least one rotating brush roller rotates in the same direction and at least one rotating brush roller rotates in the opposite direction with respect to the transporting direction. By such arrangement, the photosensitive layer in the non-image area can be more steadily removed. Further, a technique of rocking the rotating brush roller in the rotation axis direction of the brush roller is also effective.

The developer can be used at an appropriate temperature, and is preferably used from 10 to 50° C.

The hydrophilizing aqueous solution for use in the invention is preferably, for example, an aqueous solution containing water as a main component (containing 60% by weight or more of water) and the hydrophilizing compound. The content of the hydrophilizing compound is preferably from 1 to 40% by weight, more preferably from 2 to 30% by weight, particularly preferably from 3 to 20% by weight, in the hydrophilizing aqueous solution. The hydrophilizing aqueous solution may contain a surfactant, an organic solvent, an antiseptic agent, a chelating agent, a defoaming agent, an organic acid, an inorganic acid, an inorganic salt or the like as described above as the component other than the hydrophilizing compound. Such a component is used by appropriately adjusting its content. The pH of the hydrophilizing aqueous solution is preferably from 2 to 10, more preferably from 3 to 8, still preferably from 4 to 7.

In the invention, the lithographic printing plate after the treatment described above may be subsequently subjected to water washing, a drying treatment and an oil-desensitization treatment, if desired. In the oil-desensitization treatment, a known oil-desensitizing solution can be used.

EXAMPLES

The present invention will be described in more detail with reference to the following examples, but the invention should not be construed as being limited thereto.

Examples 1 to 66 and Comparative Examples 1 to 46

(Preparation of Aluminum Support 1)

An aluminum plate (material: JIS A1050) having a thickness of 0.3 mm was subjected to a degrease treatment with an aqueous 10% by weight sodium aluminate solution at 50° C. for 30 seconds in order to remove rolling oil on the surface thereof. Thereafter, the aluminum plate surface was grained using three nylon brushes implanted with bundled bristles having a diameter of 0.3 mm and an aqueous suspension (specific gravity: 1.1 g/cm$^3$) of pumice having a median diameter of 25 μm, and then thoroughly washed with water. The plate was etched by dipping it in an aqueous 25% by weight sodium hydroxide solution at 45° C. for 9 seconds and after washing with water, dipped in an aqueous 20% by weight nitric acid solution at 60° C. for 20 seconds, followed by washing with water. The etching amount of the grained surface was about 3 g/m$^2$.

Subsequently, the aluminum plate was subjected to a continuous electrochemical surface roughening treatment using alternate current voltage of 60 Hz. The electrolytic solution used was an aqueous 1% by weight nitric acid solution (containing 0.5% by weight of aluminum ion) at a liquid temperature of 50° C. The electrochemical surface roughening treatment was performed using a rectangular wave alternate current having a trapezoidal waveform such that the time TP necessary for the current value to reach the peak from zero was 0.8 msec and the duty ratio was 1:1, and disposing a carbon electrode as the counter electrode. The auxiliary anode used was a ferrite. The current density was 30 A/dm$^2$ in terms of the peak value of current, and 5% of the current flowing from the power source was divided to the auxiliary anode. The quantity of electricity at the nitric acid electrolysis was 175 C/dm$^2$ when the aluminum plate was serving as the anode. Then, the aluminum plate was washed with water by spraying.

Then, the aluminum plate was subjected to an electrochemical surface roughening treatment in the same manner as in the nitric acid electrolysis above using, as the electrolytic solution, an aqueous 0.5% by weight hydrochloric acid solution (containing 0.5% by weight of aluminum ion) at a liquid temperature of 50° C. under the conditions that the quantity of electricity was 50 C/dm$^2$ when the aluminum plate was serving as the anode, and then washed with water by spraying. The plate was then treated in an aqueous 15% by weight sulfuric acid solution (containing 0.5% by weight of aluminum ion) as the electrolytic solution at a current density of 15 A/dm$^2$ to provide a direct current anodic oxide film of 2.5 g/m$^2$, thereafter washed with water and dried, thereby preparing Aluminum support 1.

The center line average roughness (Ra) of the thus-obtained aluminum support was measured using a stylus having a diameter of 2 μm and found to be 0.51 μm.

<Preparation of Supports 1 to 8 for Lithographic Printing Plate Precursor>

Surface treatment solution 1 having the composition shown below was coated on Aluminum support 1 obtained above and dried at 100° C. for 3 minutes. The coating amount of the surface treatment layer was 10 mg/m$^2$.

| (Surface treatment solution 1) | |
|---|---|
| Surface treatment compound shown in Table 1 below | 0.50 g |
| N-Methylpyrrolidone | 49.00 g |
| Methanol | 450.00 g |
| Water | 1.50 g |
| Phosphoric acid | 0.01 g |

<Preparation of Supports 9 to 16 for Lithographic Printing Plate Precursor>

Surface treatment solution 2 having the composition shown below was coated on Aluminum support 1 obtained above and dried at 100° C. for 3 minutes. The coating amount of the surface treatment layer was 7 mg/m$^2$.

| (Surface treatment solution 2) | |
|---|---|
| Surface treatment compound shown in Table 1 below | 0.50 g |
| N-Methylpyrrolidone | 49.00 g |
| Methanol | 450.00 g |
| Water | 1.50 g |

The contact angle of water droplet in air of each of Supports 1 to 16 for lithographic printing plate precursor thus-obtained was measured according to the method described hereinbefore. The results are shown in Table 1.

Each of Supports 1 to 16 for lithographic printing plate precursor was cut in size 3 cm×3 cm, and immersed in 20 ml of each of Aqueous Solutions 1 to 7 (each having pH of 4.5 to 5.5) at 25° C. for one minute. Then, the support was washed with distilled water and dried at 100° C. for one minute to obtain a support for lithographic printing plate precursor treated with the hydrophilizing compound.

| (Aqueous Solutions 1 to 7) | |
|---|---|
| Water | 100.00 g |
| Benzyl alcohol | 1.00 g |
| Polyoxyethylene naphthyl ether (average number of oxyethylene: n = 13) | 1.00 g |
| Sodium salt of dioctylsulfosuccinic acid ester | 0.50 g |
| Hydrophilizing compound shown in Table 1 | 1.00 g |
| Ethylene glycol | 0.50 g |
| Ammonium primary phosphate | 0.05 g |
| Citric acid | 0.05 g |
| Tetrasodium salt of ethylenediaminetetraacetate | 0.05 g |

The contact angle of water droplet in air of each of the supports for lithographic printing plate precursor thus-treated was measured according to the same method as described above. The results are shown in Table 1.

TABLE 1

| | | Contact Angle of Water Droplet in Air (degree) | Contact Angle of Water Droplet in Air after Treatment (degree) | | | | | | |
|---|---|---|---|---|---|---|---|---|---|
| | Surface Treatment | Angle of Water Droplet in | Aqueous Solution 1 | Aqueous Solution 2 | Aqueous Solution 3 | Aqueous Solution 4 | Aqueous Solution 5 | Aqueous Solution 6 | Aqueous Solution 7 |
| | | | | | Hydrophilizing Compound | | | | |
| Support | Compound | Air (degree) | Gum Arabic | Polyacrylic Acid | Polymer (1) | Polymer (2) | O-5 | Polymer (3) | None |
| 1 | F-1 | 72 | 9 | 11 | 8 | 8 | 5 | 15 | 72 |
| 2 | F-1 + O-1 (3/1 mol/mol) | 85 | 11 | 15 | 10 | 9 | 7 | 20 | 85 |
| 3 | F-2 | 93 | 15 | 15 | 11 | 10 | 9 | 22 | 93 |

TABLE 1-continued

| | Surface Treatment | Contact Angle of Water Droplet in Air (degree) | Contact Angle of Water Droplet in Air after Treatment (degree) | | | | | | |
|---|---|---|---|---|---|---|---|---|---|
| | | | Aqueous Solution 1 | Aqueous Solution 2 | Aqueous Solution 3 | Aqueous Solution 4 | Aqueous Solution 5 | Aqueous Solution 6 | Aqueous Solution 7 |
| | | | | | Hydrophilizing Compound | | | | |
| Support | Compound | | Gum Arabic | Polyacrylic Acid | Polymer (1) | Polymer (2) | O-5 | Polymer (3) | None |
| 4 | F-3 | 95 | 18 | 19 | 12 | 11 | 10 | 20 | 95 |
| 5 | F-4 | 96 | 16 | 16 | 14 | 13 | 11 | 21 | 96 |
| 6 | F-1 + O-2 (3/1 mol/mol) | 81 | 13 | 13 | 10 | 10 | 6 | 15 | 81 |
| 7 | O-1 | 101 | 98 | 99 | 96 | 94 | 90 | 99 | 101 |
| 8 | O-2 | 110 | 95 | 96 | 90 | 90 | 92 | 110 | 110 |
| 9 | F-5 | 71 | 26 | 25 | 20 | 18 | 15 | 28 | 71 |
| 10 | F-6 | 80 | 21 | 20 | 18 | 17 | 13 | 25 | 80 |
| 11 | F-7 | 97 | 16 | 17 | 14 | 14 | 11 | 20 | 97 |
| 12 | F-8 | 99 | 13 | 14 | 11 | 10 | 8 | 16 | 99 |
| 13 | F-9 | 108 | 19 | 20 | 16 | 16 | 11 | 22 | 108 |
| 14 | O-3 | 86 | 80 | 85 | 77 | 76 | 75 | 80 | 86 |
| 15 | O-4 | 88 | 79 | 80 | 75 | 75 | 60 | 80 | 88 |
| 16 | O-5 | 15 | 12 | 30 | 12 | 12 | 12 | 20 | 15 |

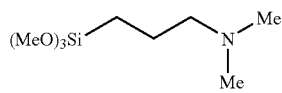
(F-1)

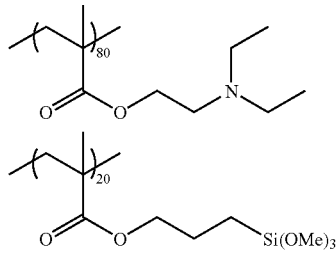
(F-2)

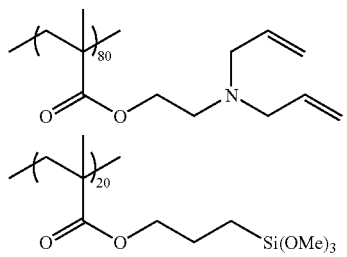
(F-3)

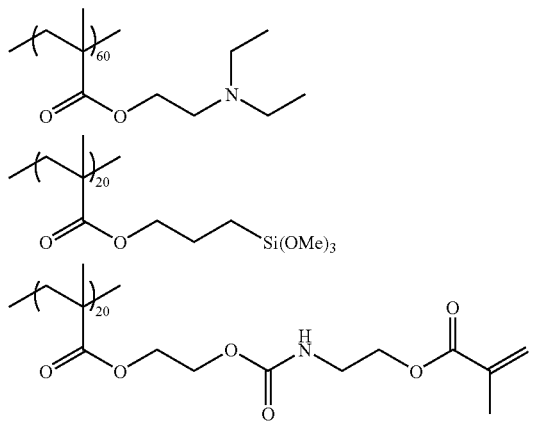
(F-4)

TABLE 1-continued

| | | Contact Angle of Water Droplet in Air (degree) | Contact Angle of Water Droplet in Air after Treatment (degree) | | | | | | |
| | Surface Treatment | | Aqueous Solution 1 | Aqueous Solution 2 | Aqueous Solution 3 | Aqueous Solution 4 | Aqueous Solution 5 | Aqueous Solution 6 | Aqueous Solution 7 |
| | | | | | Hydrophilizing Compound | | | | |
| Support | Compound | Air (degree) | Gum Arabic | Polyacrylic Acid | Polymer (1) | Polymer (2) | O-5 | Polymer (3) | None |

(F-5)
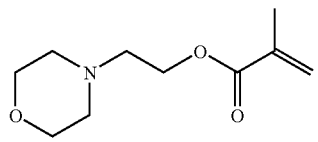

(F-6)
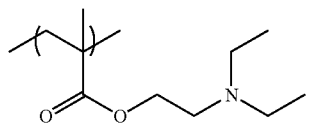

(F-7)
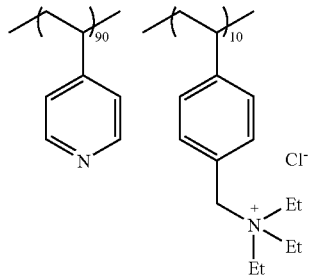

(F-8)
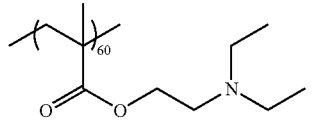
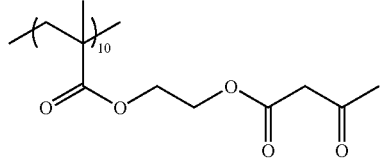
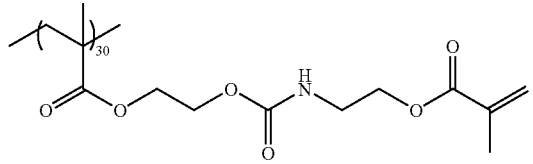

(F-9)
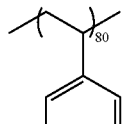
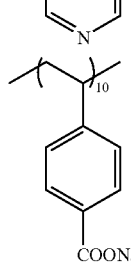

TABLE 1-continued

| Support | Surface Treatment Compound | Contact Angle of Water Droplet in Air (degree) | Contact Angle of Water Droplet in Air after Treatment (degree) | | | | | | |
|---|---|---|---|---|---|---|---|---|---|
| | | | Aqueous Solution 1 | Aqueous Solution 2 | Aqueous Solution 3 | Aqueous Solution 4 | Aqueous Solution 5 | Aqueous Solution 6 | Aqueous Solution 7 |
| | | | | | Hydrophilizing Compound | | | | |
| | | | Gum Arabic | Polyacrylic Acid | Polymer (1) | Polymer (2) | O-5 | Polymer (3) | None |

(O-1)

(O-2)

(O-3)

(O-4)

(O-5)

Polymer (1)

TABLE 1-continued

| Support | Surface Treatment Compound | Contact Angle of Water Droplet in Air (degree) | Contact Angle of Water Droplet in Air after Treatment (degree) | | | | | | |
|---|---|---|---|---|---|---|---|---|---|
| | | | Aqueous Solution 1 Gum Arabic | Aqueous Solution 2 Polyacrylic Acid | Aqueous Solution 3 Hydrophilizing Compound Polymer (1) | Aqueous Solution 4 Polymer (2) | Aqueous Solution 5 O-5 | Aqueous Solution 6 Polymer (3) | Aqueous Solution 7 None |

Polymer (2)

[Structure: two repeat units (50/50) of acrylamide derivatives with -C(CH₃)₂-CH₂-SO₃H and -C(CH₃)₂-CH₂-SO₃Na pendant groups]

Polymer (3)

[Structure: three repeat units (15/15/70) — styrene with para-B(OH)₂; acrylic acid; and acrylate ester with -O-(CH₂)₃-SO₃Na]

As is apparent from the results shown in Table 1, with respect to the support for lithographic printing plate precursor (having the compound having the functional group X on its surface) according to the invention, the contact angle of water droplet in air on the surface is decreased from 70° or more to 30° or less by the treatment with the aqueous solution containing the hydrophilizing compound (the compound having the functional group Y). On the contrary, in the case of the treatment with the aqueous solution not containing the hydrophilizing compound, the decrease in the contact angle of water droplet in air is not recognized at all. Further, as to the support not having the compound having the functional group X on its surface, the contact angle of water droplet in air is decreased only to around 60° by the treatment with the aqueous solution containing the hydrophilizing compound, although the support itself exhibits the contact angle of water droplet in air of 70° or more.

<Preparation of Lithographic Printing Plate Precursors 1 to 16>

Coating Solution 1 for Photosensitive Layer having the composition shown below was coated on each of the supports for lithographic printing plate precursor and dried at 80° C. for one minute. The coating amount of the photosensitive layer formed was 1.2 g/m².

| (Coating Solution 1 for Photosensitive Layer) | |
|---|---|
| Binder Polymer (1) shown below | 0.54 g |
| Polymerizable Compound (1) | 0.48 g |
| Isocyanuric acid EO-modified triacrylate (Aronics M-315, produced by Toa Gosei Co., Ltd.) | |
| Sensitizing Dye (1) shown below | 0.06 g |
| Polymerization Initiator (1) shown below | 0.10 g |
| Co-sensitizer (1) shown below | 0.07 g |
| Dispersion of ε-phthalocyanine pigment | 0.40 g |
| [pigment: 15 parts by weight; dispersing agent (allyl methacrylate/methacrylic acid (80/20) copolymer): 10 parts by weight; solvent (cyclohexanone/methoxypropyl acetate/1-methoxy-2-propanol = 15 parts by weight/20 parts by weight/40 parts by weight)] | |
| Methyl ethyl ketone | 4.80 g |
| Dimethylsulfoxide | 4.80 g |

Binder Polymer (1)

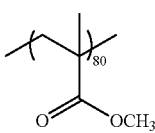

-continued (Coating Solution 1 for Photosensitive Layer)

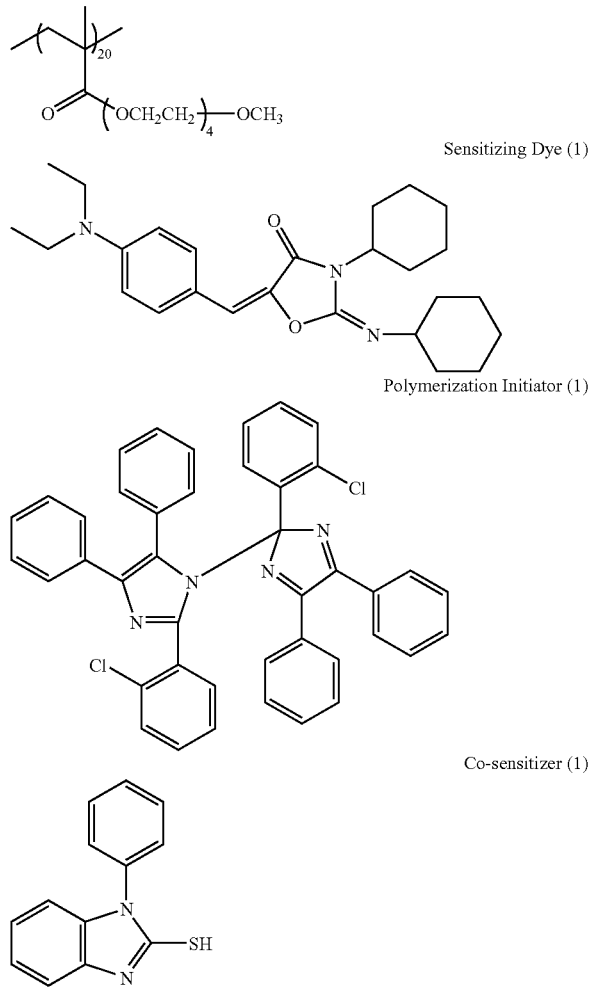

Sensitizing Dye (1)

Polymerization Initiator (1)

Co-sensitizer (1)

Coating Solution 1 for Protective Layer having the composition shown below was coated on the photosensitive layer using a bar so as to have a dry coating amount of 0.75 g/m² and dried at 125° C. for 70 seconds to form a protective layer, thereby preparing Lithographic Printing Plate Precursors 1 to 16, respectively.

| (Coating Solution 1 for Protective Layer) | |
|---|---|
| Polyvinyl alcohol (saponification degree: 98% by mole; polymerization degree: 500) | 40 g |
| Polyvinyl pyrrolidone (molecular weight: 50,000) | 5 g |
| Vinyl pyrrolidone/vinyl acetate (1/1) copolymer (molecular weight: 70,000) | 0.5 g |
| Surfactant (Emalex 710, produced by Nihon-Emulsion Co., Ltd.) | 0.5 g |
| Water | 950 g |

(1) Exposure, Development and Printing

Each of Lithographic Printing Plate Precursors 1 to 16 was subjected to imagewise exposure using a semiconductor laser of 405 nm having an output of 100 mW with varying energy density.

Then, development processing was performed in an automatic development processor having a structure shown in FIG. 1 using each of Aqueous Solutions 1 to 7 shown above to prepare a lithographic printing plate (without heating). The automatic development processor had two rotating brush rollers. The first brush roller was a brush roller having an outer diameter of 90 mm and being implanted with fiber of polybutylene terephthalate (bristle diameter: 200 μm, bristle length: 17 mm), and the brush roller was rotated at 200 rpm (peripheral velocity at the tip of brush: 0.94 n/sec) in the same direction as the transporting direction. The second brush roller was a brush roller having an outer diameter of 60 mm and being implanted with fiber of polybutylene terephthalate (bristle diameter: 200 μm, bristle length: 17 mm), and the brush roller was rotated at 200 rpm (peripheral velocity at the tip of brush: 0.63 m/sec) in the opposite direction to the transporting direction. The transportation of the lithographic printing plate precursor was performed at transporting speed of 100 cm/min.

The aqueous solution was supplied on the surface of the lithographic printing plate precursor by showering from a spray pipe using a circulation pump. The tank volume for the aqueous solution was 10 liters.

On the other hand, within 30 seconds after the laser imagewise exposure, the exposed lithographic printing plate precursor was put in an oven and heated the entire surface of the lithographic printing plate precursor by blowing hot air to maintain at 110° C. for 15 seconds and then the development processing was performed within 30 seconds in the same manner as described above to prepare a lithographic printing plate (with heating).

Then, each of the lithographic printing plate (without heating) and the lithographic printing plate (with heating) was mounted on a printing machine, SOR-M, produced by Heidelberg, and printing was performed at a printing speed of 6,000 sheets per hour using dampening water (EU-3 (etching solution, produced by Fuji Film Co., Ltd.))/water/isopropyl alcohol=1/89/10 (by volume ratio)) and TRANS-G(N) black ink (produced by Dainippon Ink & Chemicals, Inc.).

(2) Evaluation

With respect to the lithographic printing plates prepared above, the printing durability and stain resistance were evaluated in the following manner. The results are shown in Table 2.

<Printing Durability>

As increase in the number of printing sheets, the photosensitive layer was gradually abraded to cause decrease in the ink receptivity, resulting in decrease of ink density on a printed material. With respect to the lithographic printing plate obtained by the exposure in the same exposure amount (energy density), a number of printed materials obtained until the ink density (reflection density) decreased by 0.1 from that at the initiation of printing was determined to relatively evaluate the printing durability. Specifically, the printing durability was calculated according to the formula shown below using Comparative Example 7 as the criterion (100). As the value increases, the printing durability becomes higher.

Printing durability=(Number of printed materials of subject lithographic printing plate)/(Number of printed materials of criterion lithographic printing plate)×100

<Stain Resistance>

The 500th sheet of the printed material from the initiation of printing was picked up and the density of ink adhered on the non-image area was measured to relatively evaluate the stain resistance. Specifically, the stain resistance was calculated according to the formula shown below using Comparative Example 7 as the criterion (100). As the value increases, the density of ink adhered on the non-image area decreases, that is, the stain resistance becomes better.

Stain resistance=(Ink density of non-image area on printed material of criterion lithographic printing plate)/(Ink density of non-image area on printed material of subject lithographic printing plate)×100

TABLE 2

| | Lithographic Printing Plate Precursor | Support | Aqueous Solution | Printing Durability Without Heating | Printing Durability With Heating | Stain Resistance Without Heating | Stain Resistance With Heating |
|---|---|---|---|---|---|---|---|
| Example 1 | 1 | 1 | 1 | 110 | 110 | 1,500 | 1,500 |
| Example 2 | | | 2 | 110 | 110 | 1,500 | 1,500 |
| Example 3 | | | 3 | 110 | 110 | 1,500 | 1,500 |
| Example 4 | | | 4 | 110 | 110 | 1,500 | 1,500 |
| Example 5 | | | 5 | 110 | 110 | 1,500 | 1,500 |
| Example 6 | | | 6 | 110 | 110 | 1,500 | 1,500 |
| Comparative Example 1 | | | 7 | 110 | 110 | 250 | 250 |
| Example 7 | 2 | 2 | 1 | 150 | 150 | 1,500 | 1,500 |
| Example 8 | | | 2 | 150 | 150 | 1,500 | 1,500 |
| Example 9 | | | 3 | 150 | 150 | 1,500 | 1,500 |
| Example 10 | | | 4 | 150 | 150 | 1,500 | 1,500 |
| Example 11 | | | 5 | 150 | 150 | 1,500 | 1,500 |
| Example 12 | | | 6 | 150 | 150 | 1,400 | 1,400 |
| Comparative Example 2 | | | 7 | 150 | 150 | 200 | 200 |
| Example 13 | 3 | 3 | 1 | 110 | 110 | 1,500 | 1,500 |
| Example 14 | | | 2 | 110 | 110 | 1,500 | 1,500 |
| Example 15 | | | 3 | 110 | 110 | 1,500 | 1,500 |
| Example 16 | | | 4 | 110 | 110 | 1,500 | 1,500 |
| Example 17 | | | 5 | 110 | 110 | 1,500 | 1,500 |
| Example 18 | | | 6 | 110 | 110 | 1,400 | 1,400 |
| Comparative Example 3 | | | 7 | 110 | 110 | 140 | 140 |
| Example 19 | 4 | 4 | 1 | 130 | 130 | 1,400 | 1,400 |
| Example 20 | | | 2 | 130 | 130 | 1,400 | 1,400 |
| Example 21 | | | 3 | 130 | 130 | 1,500 | 1,500 |
| Example 22 | | | 4 | 130 | 130 | 1,500 | 1,500 |
| Example 23 | | | 5 | 130 | 130 | 1,500 | 1,500 |
| Example 24 | | | 6 | 130 | 130 | 1,400 | 1,400 |
| Comparative Example 4 | | | 7 | 130 | 130 | 140 | 140 |
| Example 25 | 5 | 5 | 1 | 150 | 150 | 1,400 | 1,400 |
| Example 26 | | | 2 | 150 | 150 | 1,400 | 1,400 |
| Example 27 | | | 3 | 150 | 150 | 1,500 | 1,500 |
| Example 28 | | | 4 | 150 | 150 | 1,500 | 1,500 |
| Example 29 | | | 5 | 150 | 150 | 1,500 | 1,500 |
| Example 30 | | | 6 | 150 | 150 | 1,400 | 1,400 |
| Comparative Example 5 | | | 7 | 150 | 150 | 100 | 100 |
| Example 31 | 6 | 6 | 1 | 110 | 110 | 1,500 | 1,500 |
| Example 32 | | | 2 | 110 | 110 | 1,500 | 1,500 |
| Example 33 | | | 3 | 110 | 110 | 1,500 | 1,500 |
| Example 34 | | | 4 | 110 | 110 | 1,500 | 1,500 |
| Example 35 | | | 5 | 110 | 110 | 1,500 | 1,500 |
| Example 36 | | | 6 | 110 | 110 | 1,500 | 1,500 |
| Comparative Example 6 | | | 7 | 110 | 110 | 200 | 200 |
| Comparative Example 7 | 7 | 7 | 1 | 100 | 100 | 100 | 100 |
| Comparative Example 8 | | | 2 | 100 | 100 | 100 | 100 |
| Comparative Example 9 | | | 3 | 100 | 100 | 100 | 100 |
| Comparative Example 10 | | | 4 | 100 | 100 | 140 | 140 |
| Comparative Example 11 | | | 5 | 100 | 100 | 140 | 140 |
| Comparative Example 12 | | | 6 | 100 | 100 | 100 | 100 |
| Comparative Example 13 | | | 7 | 100 | 100 | 100 | 100 |
| Comparative Example 14 | 8 | 8 | 1 | 95 | 95 | 140 | 140 |
| Comparative Example 15 | | | 2 | 95 | 95 | 100 | 100 |
| Comparative Example 16 | | | 3 | 95 | 95 | 140 | 140 |
| Comparative Example 17 | | | 4 | 95 | 95 | 140 | 140 |
| Comparative Example 18 | | | 5 | 95 | 95 | 140 | 140 |

TABLE 2-continued

| Lithographic Printing Plate Precursor | Support | Aqueous Solution | Printing Durability Without Heating | Printing Durability With Heating | Stain Resistance Without Heating | Stain Resistance With Heating |
|---|---|---|---|---|---|---|
| Comparative Example 19 | | 6 | 95 | 95 | 80 | 80 |
| Comparative Example 20 | | 7 | 95 | 95 | 80 | 80 |
| Example 37 | 9 | 9 | 1 | 100 | 100 | 1,300 | 1,300 |
| Example 38 | | | 2 | 100 | 100 | 1,400 | 1,400 |
| Example 39 | | | 3 | 100 | 100 | 1,400 | 1,400 |
| Example 40 | | | 4 | 100 | 100 | 1,400 | 1,400 |
| Example 41 | | | 5 | 100 | 100 | 1,500 | 1,500 |
| Example 42 | | | 6 | 100 | 100 | 1,300 | 1,300 |
| Comparative Example 21 | | 7 | 100 | 100 | 250 | 250 |
| Example 43 | 10 | 10 | 1 | 110 | 110 | 1,400 | 1,400 |
| Example 44 | | | 2 | 110 | 110 | 1,400 | 1,400 |
| Example 45 | | | 3 | 110 | 110 | 1,400 | 1,400 |
| Example 46 | | | 4 | 110 | 110 | 1,400 | 1,400 |
| Example 47 | | | 5 | 110 | 110 | 1,500 | 1,500 |
| Example 48 | | | 6 | 110 | 110 | 1,400 | 1,400 |
| Comparative Example 22 | | 7 | 110 | 110 | 200 | 200 |
| Example 49 | 11 | 11 | 1 | 120 | 120 | 1,400 | 1,400 |
| Example 50 | | | 2 | 120 | 120 | 1,400 | 1,400 |
| Example 51 | | | 3 | 120 | 120 | 1,500 | 1,500 |
| Example 52 | | | 4 | 120 | 120 | 1,500 | 1,500 |
| Example 53 | | | 5 | 120 | 120 | 1,500 | 1,500 |
| Example 54 | | | 6 | 120 | 120 | 1,400 | 1,400 |
| Comparative Example 23 | | 7 | 120 | 120 | 100 | 100 |
| Example 55 | 12 | 12 | 1 | 150 | 150 | 1,500 | 1,500 |
| Example 56 | | | 2 | 150 | 150 | 1,500 | 1,500 |
| Example 57 | | | 3 | 150 | 150 | 1,500 | 1,500 |
| Example 58 | | | 4 | 150 | 150 | 1,500 | 1,500 |
| Example 59 | | | 5 | 150 | 150 | 1,500 | 1,500 |
| Example 60 | | | 6 | 150 | 150 | 1,400 | 1,400 |
| Comparative Example 24 | | 7 | 150 | 150 | 100 | 100 |
| Example 61 | 13 | 13 | 1 | 140 | 140 | 1,400 | 1,400 |
| Example 62 | | | 2 | 140 | 140 | 1,400 | 1,400 |
| Example 63 | | | 3 | 140 | 140 | 1,400 | 1,400 |
| Example 64 | | | 4 | 140 | 140 | 1,400 | 1,400 |
| Example 65 | | | 5 | 140 | 140 | 1,500 | 1,500 |
| Example 66 | | | 6 | 140 | 140 | 1,400 | 1,400 |
| Comparative Example 25 | | 7 | 140 | 140 | 80 | 80 |
| Comparative Example 26 | 14 | 14 | 1 | 85 | 85 | 200 | 200 |
| Comparative Example 27 | | | 2 | 85 | 85 | 200 | 200 |
| Comparative Example 28 | | | 3 | 85 | 85 | 200 | 200 |
| Comparative Example 29 | | | 4 | 85 | 85 | 200 | 200 |
| Comparative Example 30 | | | 5 | 85 | 85 | 250 | 250 |
| Comparative Example 31 | | | 6 | 85 | 85 | 200 | 200 |
| Comparative Example 32 | | | 7 | 85 | 85 | 140 | 140 |
| Comparative Example 33 | 15 | 15 | 1 | 95 | 95 | 200 | 200 |
| Comparative Example 34 | | | 2 | 95 | 95 | 200 | 200 |
| Comparative Example 35 | | | 3 | 95 | 95 | 250 | 250 |
| Comparative Example 36 | | | 4 | 95 | 95 | 250 | 250 |
| Comparative Example 37 | | | 5 | 95 | 95 | 400 | 400 |
| Comparative Example 38 | | | 6 | 95 | 95 | 200 | 200 |
| Comparative Example 39 | | | 7 | 95 | 95 | 140 | 140 |
| Comparative Example 40 | 16 | 16 | 1 | 5 | 5 | 1,500 | 1,500 |

TABLE 2-continued

| Lithographic Printing Plate Precursor | Support | Aqueous Solution | Printing Durability | | Stain Resistance | |
| --- | --- | --- | --- | --- | --- | --- |
| | | | Without Heating | With Heating | Without Heating | With Heating |
| Comparative Example 41 | | 2 | 5 | 5 | 1,300 | 1,300 |
| Comparative Example 42 | | 3 | 5 | 5 | 1,500 | 1,500 |
| Comparative Example 43 | | 4 | 5 | 5 | 1,500 | 1,500 |
| Comparative Example 44 | | 5 | 5 | 5 | 1,500 | 1,500 |
| Comparative Example 45 | | 6 | 5 | 5 | 1,400 | 1,400 |
| Comparative Example 46 | | 7 | 5 | 5 | 1,500 | 1,500 |

As is apparent from the results shown in Table 2, the lithographic printing plate precursor according to the invention can provide the lithographic printing plate having both high printing durability and excellent stain resistance by the simple processing.

Examples 67 to 77 and Comparative Examples 47 to 51

<Preparation of Lithographic Printing Plate Precursors 17 to 32>

Lithographic Printing Plate Precursors 17 to 32 were prepared in the same manner as in Preparation of Lithographic Printing Plate Precursors 1 to 16 except for changing Coating Solution 1 for Photosensitive Layer to Coating Solution 2 for Photosensitive Layer shown below, respectively.

| (Coating Solution 2 for Photosensitive Layer) | |
| --- | --- |
| Binder Polymer (2) shown below | 0.54 g |
| Polymerizable Compound (2) shown below | 0.48 g |
| Sensitizing Dye (1) shown above | 0.06 g |
| Polymerization Initiator (1) shown above | 0.18 g |
| Co-sensitizer (1) shown above | 0.07 g |
| Dispersion of ε-phthalocyanine pigment [pigment: 15 parts by weight; dispersing agent (allyl methacrylate/methacrylic acid (80/20) copolymer): 10 parts by weight; solvent (cyclohexanone/methoxypropyl acetate/1-methoxy-2-propanol = 15 parts by weight/20 parts by weight/40 parts by weight)] | 0.40 g |
| Thermal polymerization inhibitor N-nitrosophenylhydroxylamine aluminum salt | 0.01 g |
| Fluorine-Based Surfactant (1) shown below | 0.001 g |
| Polyoxyethylene-polyoxypropylene condensate (Pluronic L44, produced by ADEKA Corp.) | 0.04 g |
| Tetraethylamine hydrochloride | 0.01 g |
| 1-Methoxy-2-propanol | 3.5 g |
| Methyl ethyl ketone | 8.0 g |

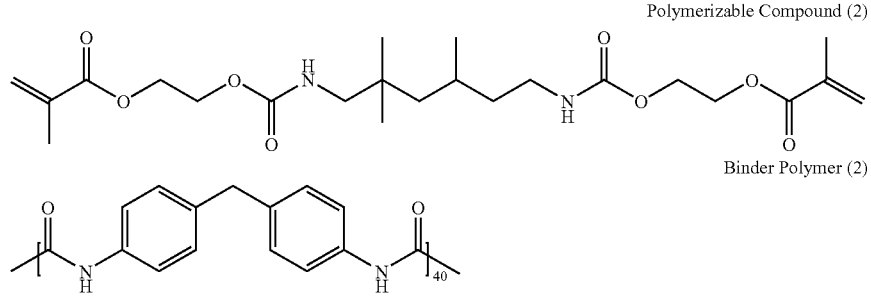

Polymerizable Compound (2)

Binder Polymer (2)

(Coating Solution 2 for Photosensitive Layer)

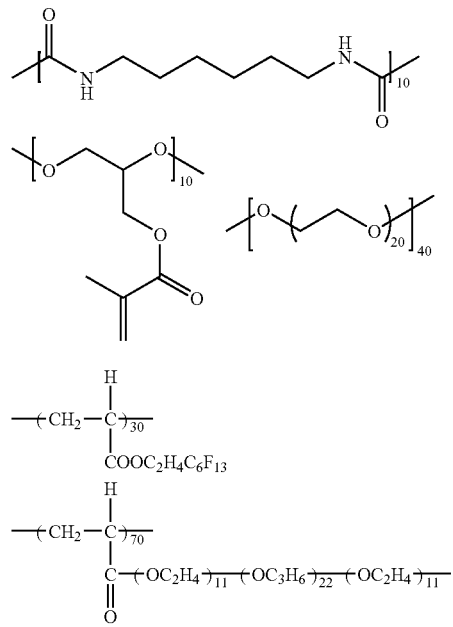

Fluorine-Based Surfactant (1)

Lithographic Printing Plate Precursors 17 to 32 thus-obtained were subjected to the exposure, development and printing in the same manner as in Example 1 except for using Aqueous solution 5 and evaluated in the same manner as in Example 1. As the criterion lithographic printing plate for the evaluation, the lithographic printing plate of Comparative Example 47 was used. The results are shown in Table 3.

Examples 78 to 88 and Comparative Examples 52 to 56

(Preparation of Aluminum Support 2)

An aluminum plate (material: JIS A1050) having a thickness of 0.3 mm was subjected to surface treatment by performing processes (a) to (k) shown below in this order.

TABLE 3

| | Lithographic Printing Plate | | Printing Durability | | Stain Resistance | |
|---|---|---|---|---|---|---|
| | Precursor | Support | Without Heating | With Heating | Without Heating | With Heating |
| Example 67 | 17 | 1 | 105 | 105 | 1,100 | 1,100 |
| Example 68 | 18 | 2 | 160 | 160 | 1,100 | 1,100 |
| Example 69 | 19 | 3 | 110 | 110 | 1,100 | 1,100 |
| Example 70 | 20 | 4 | 140 | 140 | 1,100 | 1,100 |
| Example 71 | 21 | 5 | 150 | 150 | 1,100 | 1,100 |
| Example 72 | 22 | 6 | 120 | 120 | 1,100 | 1,100 |
| Comparative Example 47 | 23 | 7 | 100 | 100 | 100 | 100 |
| Comparative Example 48 | 24 | 8 | 110 | 110 | 100 | 100 |
| Example 73 | 25 | 9 | 110 | 110 | 1,100 | 1,100 |
| Example 74 | 26 | 10 | 120 | 120 | 1,100 | 1,100 |
| Example 75 | 27 | 11 | 130 | 130 | 1,100 | 1,100 |
| Example 76 | 28 | 12 | 150 | 150 | 1,100 | 1,100 |
| Example 77 | 29 | 13 | 140 | 140 | 1,100 | 1,100 |
| Comparative Example 49 | 30 | 14 | 85 | 85 | 180 | 180 |
| Comparative Example 50 | 31 | 15 | 95 | 95 | 290 | 290 |
| Comparative Example 51 | 32 | 16 | 5 | 5 | 1,100 | 1,100 |

As is apparent from the results shown in Table 3, the lithographic printing plate precursor according to the invention can provide the lithographic printing plate having both high printing durability and excellent stain resistance by the simple processing.

(a) Mechanical Surface Roughening Treatment

Mechanical surface roughening of the aluminum plate was conducted by means of rotating roller-form nylon brushes while supplying a suspension (having specific gravity of 1.12) of an abrasive (silica sand) in water as an abrasion slurry solution to the surface of the aluminum plate. The average particle size of the abrasive was 8 μm and the maximum particle size was 50 μm. The material of the nylon brush was 610 nylon, and the brush has a bristle length of 50 mm and a bristle diameter of 0.3 mm. The nylon brush was made by making holes in a stainless steel cylinder having a diameter of 300 mm and densely filling the brush bristles. Three of the rotating nylon brushes were used. Two supporting rollers (each having a diameter of 200 mm) provided under the brush rollers were spaced 300 mm. The brush rollers were pressed against the aluminum plate till the load applied to a driving motor for rotating the brush became 7 kw greater than the load before pressing the brush rollers against the aluminum plate. The rotating direction of the brushes was the same as the moving direction of the aluminum plate. The rotation number of the brushes was 200 rpm.

(b) Alkali Etching Treatment

Etching treatment of the aluminum plate was conducted by spraying an aqueous sodium hydroxide solution (sodium hydroxide concentration: 26% by weight, aluminum ion concentration: 6.5% by weight) having temperature of 70° C. to dissolve the aluminum plate in an amount of 6 g/m$^2$, followed by washing by spraying well water.

(c) Desmut Treatment

Desmut treatment of the aluminum plate was conducted by spraying an aqueous 1% by weight nitric acid solution (containing 0.5% by weight of aluminum ion) having temperature of 30° C., followed by washing with water by spraying. The aqueous nitric acid solution used for the desmut treatment was a waste solution of the electrolytic solution from the process of (d) described below.

(d) Electrochemical Surface Roughening Treatment

Electrochemical surface roughening treatment of the aluminum plate was continuously conducted by applying 60 Hz alternating current voltage. The electrolytic solution used was an aqueous solution containing 10.5 g/liter of nitric acid (containing 5 g/liter of aluminum ion) and the solution temperature was 50° C. The electrochemical surface roughening treatment was conducted using an alternating current source, which provided a trapezoidal rectangular wave alternating current where time (TP) for reaching the current to its peak from zero was 0.8 msec and a duty ratio was 1:1, and using a carbon electrode as a counter electrode. A ferrite was used as an auxiliary anode. The electrolytic cell used was a radial cell type. The current density was 30 A/dm$^2$ at the peak current, and the electric amount was 220 C/dm$^2$ in terms of the total electric quantity during the aluminum plate functioning as an anode. To the auxiliary anode, 5% of the current from the electric source was divided. Subsequently, the plate was washed by spraying well water.

(e) Alkali Etching Treatment

Etching treatment of the aluminum plate was conducted at 32° C. by spraying an aqueous solution having a sodium hydroxide concentration of 26% by weight and an aluminum ion concentration of 6.5% by weight to dissolve the aluminum plate in an amount of 0.20 g/m$^2$. Thus, the smut component mainly comprising aluminum hydroxide formed in the precedent process of (d) was removed and an edge portion of the pit formed was dissolved to smoothen the edge portion. Subsequently, the plate was washed by spraying well water. The amount of etching was 3.5 g/m$^2$.

(f) Desmut Treatment

Desmut treatment of the aluminum plate was conducted by spraying an aqueous 15% by weight nitric acid solution (containing 4.5% by weight of aluminum ion) having temperature of 30° C., followed by washing by spraying well water. The aqueous nitric acid solution used for the desmut treatment was a waste solution of the electrolytic solution from the process of (d) described above.

(g) Electrochemical Surface Roughening Treatment

Electrochemical surface roughening treatment of the aluminum plate was continuously conducted by applying 60 Hz alternating current voltage. The electrolytic solution used was an aqueous solution containing 7.5 g/liter of hydrochloric acid (containing 5 g/liter of aluminum ion) and the solution temperature was 35° C. The electrochemical surface roughening treatment was conducted using an alternating current source which provided a rectangular wave alternating current and using a carbon electrode as a counter electrode. A ferrite was used as an auxiliary anode. The electrolytic cell used was a radial cell type. The current density was 25 A/dm$^2$ at the peak current, and the electric amount was 50 C/dm$^2$ in terms of the total electric quantity during the aluminum plate functioning as an anode. Subsequently, the plate was washed by spraying well water.

(h) Alkali Etching Treatment

Etching treatment of the aluminum plate was conducted at 32° C. by spraying an aqueous solution having a sodium hydroxide concentration of 26% by weight and an aluminum ion concentration of 6.5% by weight to dissolve the aluminum plate in an amount of 0.10 g/m$^2$. Thus, the smut component mainly comprising aluminum hydroxide formed in the precedent process of (g) was removed and an edge portion of the pit formed was dissolved to smoothen the edge portion. Subsequently, the plate was washed by spraying well water.

(i) Desmut Treatment

Desmut treatment of the aluminum plate was conducted by spraying an aqueous 25% by weight sulfuric acid solution (containing 0.5% by weight of aluminum ion) having temperature of 60° C., followed by washing by spraying well water.

(j) Anodizing Treatment

Anodizing treatment of the aluminum plate was conducted using as an electrolyte, an aqueous solution having sulfuric acid concentration of 170 g/liter (containing 0.5% by weight of aluminum ion) at 43° C. The current density was about 30 A/dm$^2$. Subsequently, the plate was washed by spraying well water. The amount of the final anodic oxide film was 2.7 g/m$^2$.

(k) Alkali Metal Silicate Treatment

Alkali metal silicate treatment (silicate treatment) of the aluminum plate was conducted by immersing the aluminum plate in an aqueous 1% by weight sodium silicate No. 3 solution having temperature of 30° C. for 10 seconds. Subsequently, the plate was washed by spraying well water, whereby Aluminum support 2 was prepared. The adhesion amount of the silicate was 3.6 mg/m$^2$.

<Preparation of Supports 17 to 24 for Lithographic Printing Plate Precursor>

Surface treatment solution 3 having the composition shown below was coated on Aluminum support 2 obtained above and dried at 100° C. for 3 minutes. The coating amount of the surface treatment layer was 10 mg/m$^2$.

| (Surface treatment solution 3) | |
|---|---|
| Surface treatment compound shown in Table 4 below | 0.50 g |
| N-Methylpyrrolidone | 49.00 g |
| Methanol | 450.00 g |
| Water | 1.50 g |
| Phosphoric acid | 0.01 g |

<Preparation of Supports 25 to 32 for Lithographic Printing Plate Precursor>

Surface treatment solution 4 having the composition shown below was coated on Aluminum support 2 obtained above and dried at 100° C. for 3 minutes. The coating amount of the surface treatment layer was 7 mg/m².

| (Surface treatment solution 4) | |
|---|---|
| Surface treatment compound shown in Table 4 below | 0.50 g |
| N-Methylpyrrolidone | 49.00 g |
| Methanol | 450.00 g |
| Water | 1.50 g |

The contact angle of water droplet in air of each of Supports 17 to 32 for lithographic printing plate precursor thus-obtained was measured according to the method described hereinbefore. The results are shown in Table 4.

Each of Supports 17 to 32 for lithographic printing plate precursor was cut in size 3 cm×3 cm, and immersed in 20 ml of Aqueous solution 1 at 25° C. for one minute. Then, the support was washed with distilled water and dried at 100° C. for one minute to obtain a support for lithographic printing plate precursor treated with the hydrophilizing compound.

The contact angle of water droplet in air of each of the supports for lithographic printing plate precursor thus-treated was measured according to the same method as described above. The results are shown in Table 4.

<Preparation of Lithographic Printing Plate Precursors 33 to 48>

Coating Solution 3 for Photosensitive Layer having the composition shown below was coated on each of the supports for lithographic printing plate precursor using a bar and dried in an oven at 70° C. for 60 seconds to form a photosensitive layer having a dry coating amount of 1.0 g/m².

Coating Solution 3 for Photosensitive Layer was prepared by mixing Photosensitive Solution (1) shown below with Microcapsule Solution (1) shown below just before coating.

| Photosensitive Solution (1) | |
|---|---|
| Binder Polymer (3) shown below | 0.162 g |
| Polymerization Initiator (2) shown below | 0.160 g |
| Polymerization Initiator (3) shown below | 0.180 g |
| Infrared Absorbing Agent (1) shown below | 0.020 g |
| Polymerizable compound (Aronics M-215, produced by Toa Gosei Co., Ltd.) | 0.385 g |
| Fluorine-Based Surfactant (1) shown above | 0.044 g |
| Methyl ethyl ketone | 1.091 g |
| 1-Methoxy-2-propanol | 8.210 g |

Binder Polymer (3)

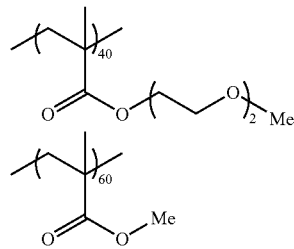

Polymerization Initiator (2)

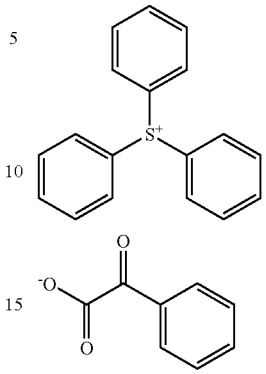

Polymerization Initiator (3)

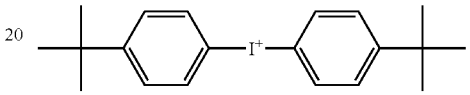

$C_4F_9$—$SO_3^-$

Infrared Absorbing Agent (1)

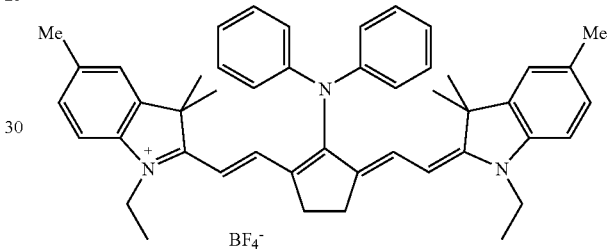

| Microcapsule Solution (1) | |
|---|---|
| Microcapsule (1) prepared as shown below | 2.640 g |
| Water | 2.425 g |

Preparation of Microcapsule (1)

As an oil phase component, 10 g of adduct of trimethylolpropane and xylene diisocyanate (Takenate D-110N, produced by Mitsui Takeda Chemicals, Inc., 75% by weight ethyl acetate solution), 6.00 g of Aronics SR-399 (produced by To a Gosei Co., Ltd.) and 0.12 g of Pionin A-41C (produced by Takemoto Oil & Fat Co., Ltd.) were dissolved in 16.67 g of ethyl acetate. As an aqueous phase component, 37.5 g of an aqueous 4% by weight PVA-205 solution was prepared. The oil phase component and the aqueous phase component were mixed and emulsified using a homogenizer at 12,000 rpm for 10 minutes. The resulting emulsion was added to 25 g of distilled water and the mixture was stirred at room temperature for 30 minutes and then stirred at 40° C. for 2 hours. The thus-obtained microcapsule solution was diluted with distilled water to have a solid content concentration of 15% by weight to prepare Microcapsule (1). The average particle diameter of the microcapsule was 0.2 μm.

Coating Solution 2 for Protective Layer having the composition shown below was coated on the photosensitive layer using a bar and dried in an oven at 125° C. for 75 seconds to form a protective layer having a dry coating amount of 0.15 g/m², thereby preparing Lithographic Printing Plate Precursors 33 to 48, respectively.

| (Coating Solution 2 for Protective Layer) | |
|---|---|
| Polyvinyl alcohol (aqueous 6% by weight solution) (PVA 105, produced by Kuraray Co., Ltd., saponification degree: 98.5% by mole; polymerization degree: 500) | 2.24 g |
| Polyvinyl pyrrolidone (K 30) | 0.0053 g |
| Surfactant (aqueous 1% by weight solution) (Emalex 710, produced by Kao Corp.) | 2.15 g |
| Scale-like synthetic mica (aqueous 3.4% by weight dispersion)(MEB 3L, produced by UNICOO Co., Ltd., average particle size: 1 to 5 μm) | 3.75 g |
| Distilled water | 10.60 g |

(1) Exposure, Development and Printing

Each of Lithographic Printing Plate Precursors 33 to 48 was exposed by Trendsetter 3244VX, produced by Creo Co., equipped with a water-cooled 40 W infrared semiconductor laser under the conditions of output of 9 W, a rotational number of an outer surface drum of 210 rpm and resolution of 2,400 dpi.

Then, the development processing was performed using Aqueous Solution 1 shown above in the same manner as in Example 1 to prepare a lithographic printing plate (without heating).

On the other hand, within 30 seconds after the laser imagewise exposure, the exposed lithographic printing plate precursor was put in an oven and heated the entire surface of the lithographic printing plate precursor by blowing hot air to maintain at 110° C. for 15 seconds and then the development processing was performed within 30 seconds in the same manner as described above to prepare a lithographic printing plate (with heating).

Then, using each of the lithographic printing plate (without heating) and the lithographic printing plate (with heating), the printing durability and stain resistance were evaluated in the same manner as in Example 1. As the criterion lithographic printing plate for the evaluation, the lithographic printing plate of Comparative Example 52 was used. The results are shown in Table 4.

As is apparent from the results shown in Table 4, the lithographic printing plate precursor according to the invention can provide the lithographic printing plate having both high printing durability and excellent stain resistance by the simple processing.

Examples 89 to 90 and Comparative Examples 57 to 58

Figure 2:
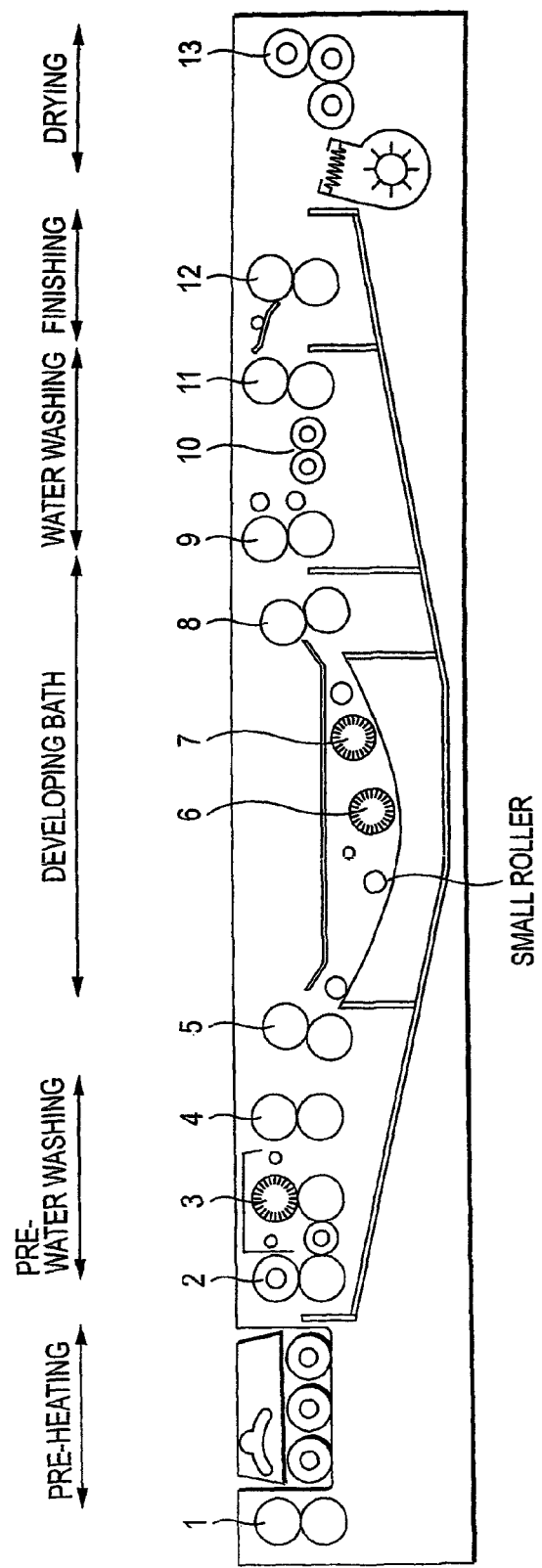
FIG. 2 is an illustration for showing a structure of another automatic development processor.

Each of Lithographic Printing Plate Precursors 5, 7, 37 and 39 was subjected to the laser imagewise exposure in the same manner as in Example 1 or Example 78 and then subjected to development processing using an automatic development processor having a structure shown in FIG. 2, wherein a heater of a pre-heat unit was turned off, Developer 1 having the composition shown below was charged in a developing bath, Aqueous Solution 8 having the composition shown below was charged in a finishing bath, water was charged in a pre-water washing bath and a water washing bath, and temperature of a drying zone was set at 110° C., at transportation speed of 100 cm/min, thereby preparing a lithographic printing plate (without heating).

On the other hand, the heater of the pre-heat unit was turned on to adjust the temperature of the pre-heat unit to 110° C. and then, each of the lithographic printing plate precursors after the laser imagewise exposure was subjected to development processing in the same manner as described above to prepare a lithographic printing plate (with heating).

Further, Supports 5, 7, 21 and 23 for lithographic printing plate precursor which were the supports of Lithographic Printing Plate Precursors 5, 7, 37 and 39, respectively were treated using the automatic development processor described above until the pre-water washing bath, developing bath and finishing bath, respectively and then the contact angle of water droplet in air of each of the supports thus-treated was measured.

Then, using each of the lithographic printing plate (without heating) and the lithographic printing plate (with heating), the printing durability and stain resistance were evaluated in the

TABLE 4

| | Lithographic Printing Plate Precursor | Support | Surface Treatment Compound | Contact Angle of Water Droplet in Air (degree) | | Printing Durability | | Stain Resistance | |
|---|---|---|---|---|---|---|---|---|---|
| | | | | Before Treatment | After Treatment | Without Heating | With Heating | Without Heating | With Heating |
| Example 78 | 33 | 17 | F-1 | 73 | 10 | 120 | 120 | 1,500 | 1,500 |
| Example 79 | 34 | 18 | F-1 + O-1 (3/1 mol/mol) | 80 | 11 | 150 | 160 | 1,500 | 1,500 |
| Example 80 | 35 | 19 | F-2 | 95 | 16 | 120 | 120 | 1,400 | 1,400 |
| Example 81 | 36 | 20 | F-3 | 96 | 19 | 150 | 150 | 1,400 | 1,400 |
| Example 82 | 37 | 21 | F-4 | 99 | 15 | 150 | 150 | 1,500 | 1,500 |
| Example 83 | 38 | 22 | F-1 + O-2(3/1 mol/mol) | 84 | 12 | 120 | 120 | 1,500 | 1,500 |
| Comparative Example 52 | 39 | 23 | O-1 | 102 | 100 | 100 | 100 | 100 | 100 |
| Comparative Example 53 | 40 | 24 | O-2 | 112 | 108 | 95 | 95 | 80 | 80 |
| Example 84 | 41 | 25 | F-5 | 72 | 26 | 105 | 105 | 1,300 | 1,300 |
| Example 85 | 42 | 26 | F-6 | 83 | 18 | 115 | 115 | 1,400 | 1,400 |
| Example 86 | 43 | 27 | F-7 | 99 | 13 | 125 | 125 | 1,500 | 1,500 |
| Example 87 | 44 | 28 | F-8 | 101 | 10 | 150 | 150 | 1,500 | 1,500 |
| Example 88 | 45 | 29 | F-9 | 110 | 12 | 140 | 140 | 1,500 | 1,500 |
| Comparative Example 54 | 46 | 30 | O-3 | 85 | 85 | 85 | 85 | 200 | 200 |
| Comparative Example 55 | 47 | 31 | O-4 | 90 | 80 | 95 | 95 | 200 | 200 |
| Comparative Example 56 | 48 | 32 | O-5 | 12 | 10 | 3 | 3 | 1,500 | 1,500 | same manner as in Example 1. As the criterion lithographic printing plate for the evaluation, the lithographic printing plates of Comparative Examples 57 and 58 were used, respectively. The results are shown in Table 5.

| (Developer 1) | |
|---|---|
| Water | 100.00 g |
| Benzyl alcohol | 1.00 g |
| Polyoxyethylene naphthyl ether (average number of oxyethylene: n = 13) | 1.00 g |
| Sodium salt of dioctylsulfosuccinic acid ester | 0.50 g |
| Ethylene glycol | 0.50 g |
| Ammonium primary phosphate | 0.05 g |
| Citric acid | 0.05 g |
| Tetrasodium salt of ethylenediaminetetraacetate | 0.05 g |
| (Aqueous Solution 8) | |
| Water | 100.00 g |
| Benzyl alcohol | 1.00 g |
| Sodium salt of dioctylsulfosuccinic acid ester | 0.50 g |
| Gum arabic | 1.00 g |
| Ethylene glycol | 0.50 g |
| Ammonium primary phosphate | 0.05 g |
| Citric acid | 0.05 g |
| Tetrasodium salt of ethylenediaminetetraacetate | 0.05 g | equipped with a water-cooled 40 W infrared semiconductor laser under the conditions of output of 9 W, a rotational number of an outer surface drum of 210 rpm and resolution of 2,400 dpi. The exposed lithographic printing plate precursor was mounted without conducting development processing on a cylinder of a printing machine (SOR-M, produced by Heidelberg Co.). After supplying Dampening Water (1) having the composition shown below and TRANS-G(N) black ink (produced by Dainippon Ink & Chemicals, Inc.), printing was performed at a printing speed of 6,000 sheets per hour. The printing durability and stain resistance were evaluated in the same manner as in Example 1. As the criterion lithographic printing plate for the evaluation, the lithographic printing plate of Comparative Example 59 was used. The contact angle of water droplet in air of the support for lithographic printing plate precursor was measured in the same manner as in Example 78 except for using Dampening Water (1) in place of Aqueous Solution 1. The results are shown in Table 6.

TABLE 5

| | Lithographic Printing Plate Precursor | Surface Treatment Compound | Contact Angle of Water Droplet in Air (degree) | | | | Printing Durability | | Stain Resistance | |
|---|---|---|---|---|---|---|---|---|---|---|
| | | | Before Treatment | Until Pre-water Washing Bath | Until Developing Bath | Until Finishing Bath | Without Heating | With Heating | Without Heating | With Heating |
| Example 89 | 5 | F-4 | 96 | 95 | 90 | 16 | 150 | 150 | 1,400 | 1,400 |
| Example 90 | 37 | F-4 | 99 | 96 | 91 | 15 | 150 | 160 | 1,500 | 1,500 |
| Comparative Example 57 | 7 | O-1 | 101 | 100 | 101 | 98 | 100 | 100 | 100 | 100 |
| Comparative Example 58 | 39 | O-1 | 102 | 100 | 100 | 100 | 100 | 100 | 100 | 100 |

As is apparent from the results shown in Table 5, the lithographic printing plate precursor according to the invention can provide the lithographic printing plate having both high printing durability and excellent stain resistance also by the plate making method including the treatment with the aqueous solution containing the hydrolyzing compound after the development.

Examples 91 to 96 and Comparative Examples 59 to 60

Each of Lithographic Printing Plate Precursors 33 to 40 was exposed by Trendsetter 3244VX, produced by Creo Co.,

| <Dampening Water (1)> | |
|---|---|
| Polymer (2) | 3 parts by weight |
| EU-3 (etching solution, produced by Fuji Film Co., Ltd.) | 1 part by weight |
| Water | 89 parts by weight |
| Isopropyl alcohol | 7 parts by weight |

TABLE 6

| | Lithographic Printing Plate Precursor | Support | Surface Treatment Compound | Contact Angle of Water Droplet in Air (degree) | | Printing Durability | Stain Resistance |
|---|---|---|---|---|---|---|---|
| | | | | Before Treatment | After Treatment | | |
| Example 91 | 33 | 17 | F-1 | 73 | 10 | 120 | 1,500 |
| Example 92 | 34 | 18 | F-1 + O-1 (3/1 mol/mol) | 80 | 11 | 150 | 1,500 |
| Example 93 | 35 | 19 | F-2 | 95 | 16 | 120 | 1,400 |

TABLE 6-continued

| Lithographic Printing Plate Precursor | Support | Surface Treatment Compound | Contact Angle of Water Droplet in Air (degree) | | Printing Durability | Stain Resistance |
|---|---|---|---|---|---|---|
| | | | Before Treatment | After Treatment | | |
| Example 94 | 36 | 20 | F-3 | 96 | 19 | 150 | 1,400 |
| Example 95 | 37 | 21 | F-4 | 99 | 15 | 150 | 1,500 |
| Example 96 | 38 | 22 | F-1 + O-2 (3/1 mol/mol) | 84 | 12 | 120 | 1,500 |
| Comparative Example 59 | 39 | 23 | O-1 | 100 | 100 | 100 | 100 |
| Comparative Example 60 | 40 | 24 | O-2 | 112 | 108 | 95 | 80 |

As is apparent from the results shown in Table 6, the lithographic printing plate precursor according to the invention can provide the lithographic printing plate having both high printing durability and excellent stain resistance also by the simple processing (on-machine development).

Examples 97 to 108 and Comparative Examples 61 to 64

<Preparation of Lithographic Printing Plate Precursors 49 to 56>

Coating Solution A for Image-Forming Layer having the composition shown below was coated on Supports 17 to 24 for lithographic printing plate precursor and dried at 35° C. for one hour to form an image-forming layer having a dry coating amount of 1.3 g/m², thereby preparing Lithographic Printing Plate Precursors 49 to 56, respectively.
(Coating Solution a for Image-Forming Layer)
To 11.25 g of a 10% dispersion of polymethyl methacrylate particle (average particle size: 90 nm) stabilized with Hostapal B (1% based on the polymer) in deionized water were successively added 5.83 g of a 15% dispersion of carbon black in water, 57.92 g of water and 25 g of a 2% aqueous solution of 98% hydrolyzed polyvinyl acetate (weight average molecular weight: 200,000) to prepare Coating Solution A for Image-Forming Layer.
<Preparation of Lithographic Printing Plate Precursors 57 to 64>

Coating Solution B for Image-Forming Layer having the composition shown below was coated on Supports 17 to 24 for lithographic printing plate precursor and dried at 60° C. for 2 minutes to form an image-forming layer having a dry coating amount of 1.3 g/m², thereby preparing Lithographic Printing Plate Precursors 57 to 64, respectively.

| (Coating Solution B for Image-Forming Layer) | |
|---|---|
| Water | 30 g |
| Dispersion of novolac resin fine particle shown below | 11.8 g |
| Tricresyl phosphate | 0.1 g |
| Megafac F-171 (fluorine-based surfactant, produced by Dainippon Ink & Chemicals, Inc.) | 0.1 g |

(Preparation of Dispersion of Novolac Resin Fine Particle)
To 12.0 g of ethyl acetate and 6.0 g of methyl ethyl ketone were dissolved 6.0 g of phenol novolac resin (metha/para ratio: 60/40) having a weight average molecular weight of 1,500, 1.5 g of light-to-heat converting agent (IR-26) shown below and 0.1 g of anionic surfactant (Pionin A-41 C, produced by Takemoto Oil & Fat Co., Ltd.) to prepare an oil phase component. To the oil phase component was added as an aqueous phase, 36.0 g of an aqueous 4% by weight polyvinyl alcohol (PVA-205, produced by Kuraray Co., Ltd.) solution and the mixture was emulsified using a homogenizer at 15,000 rpm for 15 minutes. After adding 24.0 g of water, the emulsion was heated at 40° C. for 3 hours to remove the organic solvent. The solid content concentration of the resulting dispersion of novolac resin fine particle was measured and found to be 13.0% by weight. The average particle diameter of the novolac resin fine particle was 0.25 μm.

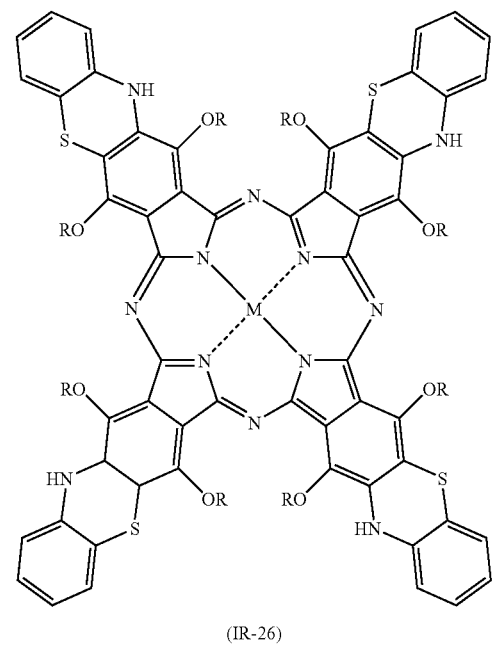

(IR-26)

M = VO, R = i-$C_5H_{11}$

<Exposure, Development and Printing>
Each of Lithographic Printing Plate Precursors 49 to 56 was exposed by a scanning NdYLF infrared laser emitting at 1,050 nm (on the surface of the image-forming layer, scanning speed: 4 m/sec, spot size: 15 μm and output: 170 mW). On the other hand, each of Lithographic Printing Plate Precursors 57 to 64 was exposed by Trendsetter 3244VFS, produced by Creo Co., equipped with a water-cooled 40 W infrared semiconductor laser under the conditions of output of 9 W, a rotational number of an outer surface drum of 210 rpm, energy on the surface of plate of 100 mJ/cm² and resolution of 2,400 dpi.

Then, each of the exposed lithographic printing plate precursors was subjected to the development and printing in the same manner as in Example 1 except for using Developer 2 having the composition shown below as shown in Table 7 and evaluated in the same manner as in Example 1. As the criterion lithographic printing plate for the evaluation, the lithographic printing plate of Comparative Example 61 was used. The results are shown in Table 7.

| (Developer 2) | |
| --- | --- |
| Water | 100.00 g |
| Benzyl alcohol | 1.00 g |
| Polyoxyethylene naphthyl ether (average number of oxyethylene: n = 13) | 1.00 g |
| Sodium salt of dioctylsulfosuccinic acid ester | 0.50 g |
| Gum arabic | 1.00 g |
| Ethylene glycol | 0.50 g |
| Ammonium primary phosphate | 0.05 g |
| Citric acid | 0.05 g |
| Tetrasodium salt of ethylenediaminetetraacetate | 0.05 g |

TABLE 7

| | Lithographic Printing Plate Precursor | Support | Surface Treatment Compound | Printing Durability | | Stain Resistance | |
| --- | --- | --- | --- | --- | --- | --- | --- |
| | | | | Without Heating | With Heating | Without Heating | With Heating |
| Example 97 | 49 | 17 | F-1 | 100 | 100 | 1,500 | 1,500 |
| Example 98 | 50 | 18 | F-1 + O-1 (3/1 mol/mol) | 100 | 100 | 1,500 | 1,500 |
| Example 99 | 51 | 19 | F-2 | 100 | 100 | 1,400 | 1,400 |
| Example 100 | 52 | 20 | F-3 | 100 | 100 | 1,400 | 1,400 |
| Example 101 | 53 | 21 | F-4 | 100 | 100 | 1,500 | 1,500 |
| Example 102 | 54 | 22 | F-1 + O-2 (3/1 mol/mol) | 100 | 100 | 1,500 | 1,500 |
| Comparative Example 61 | 55 | 23 | O-1 | 100 | 100 | 100 | 100 |
| Comparative Example 62 | 56 | 24 | O-2 | 95 | 95 | 80 | 80 |
| Example 103 | 57 | 17 | F-1 | 110 | 120 | 1,300 | 1,300 |
| Example 104 | 58 | 18 | F-1 + O-1 (3/1 mol/mol) | 110 | 130 | 1,400 | 1,400 |
| Example 105 | 59 | 19 | F-2 | 110 | 120 | 1,500 | 1,500 |
| Example 106 | 60 | 20 | F-3 | 110 | 130 | 1,500 | 1,500 |
| Example 107 | 61 | 21 | F-4 | 110 | 130 | 1,500 | 1,500 |
| Example 108 | 62 | 22 | F-1 + O-2 (3/1 mol/mol) | 110 | 120 | 1,500 | 1,500 |
| Comparative Example 63 | 63 | 23 | O-1 | 110 | 110 | 100 | 100 |
| Comparative Example 64 | 64 | 24 | O-2 | 105 | 105 | 80 | 80 |

As is apparent from the results shown in Table 7, the lithographic printing plate precursor having the heat fusion type image-forming layer according to the invention can provide a lithographic printing plate having both high printing durability and excellent stain resistance also by the simple processing.

Examples 201 to 250 and Comparative Examples 201 to 248

<Preparation of Supports 1-1 to 1-7 for Lithographic Printing Plate Precursor>

Surface treatment solution 101 having the composition shown below was coated on Aluminum support 1 described in Example 1 and dried at 100° C. for 3 minutes. The coating amount of the surface treatment layer was 10 mg/m².

| (Surface treatment solution 101) | |
| --- | --- |
| Surface treatment compound shown in Table 101 below | 0.50 g |
| N-Methylpyrrolidone | 49.00 g |
| Methanol | 450.00 g |
| Water | 1.50 g |

The contact angle of water droplet in air of each of Supports 1-1 to 1-7 for lithographic printing plate precursor thus-obtained was measured according to the method described hereinbefore. The results are shown in Table 101.

Each of Supports 1-1 to 1-7 for lithographic printing plate precursor was cut in size 3 cm×3 cm, and immersed in 20 ml of each of Aqueous Solutions 101 to 108 (each having pH of 4.5 to 5.5) at 25° C. for one minute. Then, the support was washed with distilled water and dried at 100° C. for one minute to obtain a support for lithographic printing plate precursor subjected to the hydrophilizing treatment.

| (Aqueous Solutions 101 to 108) | |
| --- | --- |
| Water | 100.00 g |
| Benzyl alcohol | 1.00 g |
| Polyoxyethylene naphthyl ether (average number of oxyethylene: n = 13) | 1.00 g |
| Sodium salt of dioctylsulfosuccinic acid ester | 0.50 g |
| Hydrophilizing compound shown in Table 101 | 3.00 g |
| Ethylene glycol | 0.50 g |
| Ammonium primary phosphate | 0.05 g |
| Citric acid | 0.05 g |

The contact angle of water droplet in air of each of Supports 1-1 to 1-7 for lithographic printing plate precursor subjected to the hydrophilizing treatment was measured according to the same method as described above. The results are shown in Table 101.

TABLE 101

| | | Contact Angle of Water Droplet in Air | Contact Angle of Water Droplet in Air after Treatment (degree) | | | | | | | |
|---|---|---|---|---|---|---|---|---|---|---|
| | | | Aqueous Solution 101 | Aqueous Solution 102 | Aqueous Solution 103 | Aqueous Solution 104 | Aqueous Solution 105 | Aqueous Solution 106 Comparative Hydrophilizing Compound | Aqueous Solution 107 Comparative Hydrophilizing Compound | Aqueous Solution 108 |
| Support | Surface Treatment Compound | (degree) | Hydrophilizing Compound | | | | | | | |
| | | | 1-A | 1-B | 1-C | 1-D | 1-E | 1-F | 1-G | None |
| 1-1 | (1) | 72 | 9 | 11 | 12 | 8 | 20 | 70 | 72 | 72 |
| 1-2 | (2) | 75 | 11 | 12 | 13 | 9 | 22 | 71 | 75 | 75 |
| 1-3 | (3) | 85 | 15 | 15 | 16 | 15 | 25 | 80 | 85 | 85 |
| 1-4 | (4) | 75 | 10 | 13 | 13 | 10 | 20 | 74 | 75 | 75 |
| 1-5 | (5) | 86 | 13 | 16 | 18 | 13 | 25 | 84 | 86 | 86 |
| 1-6 | (6) | 95 | 93 | 94 | 94 | 94 | 95 | 95 | 95 | 95 |
| 1-7 | (7) | 110 | 106 | 108 | 107 | 108 | 110 | 105 | 110 | 110 |

The surface treatment compounds and hydrophilizing compounds shown in Table 101 are described below.

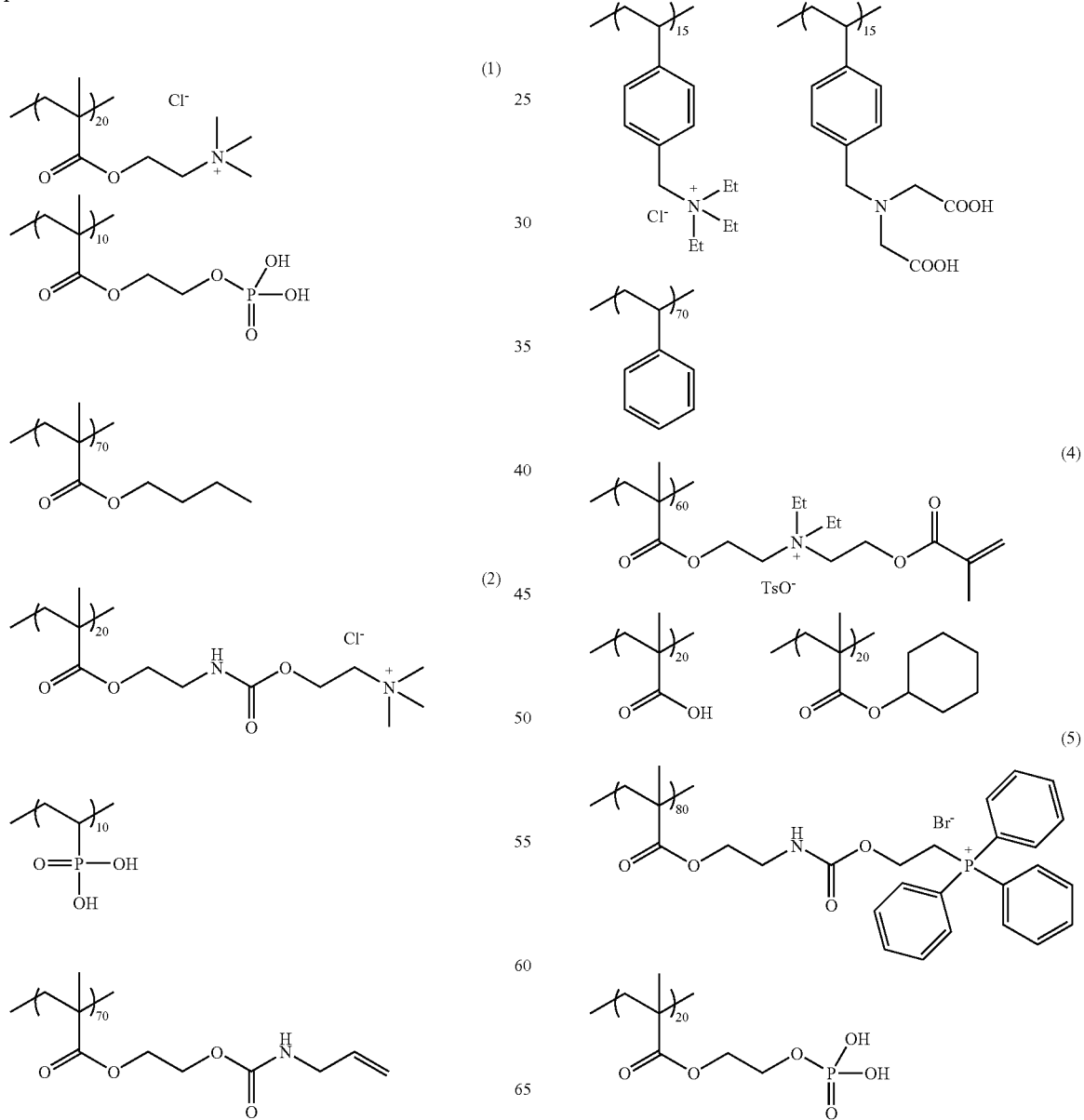

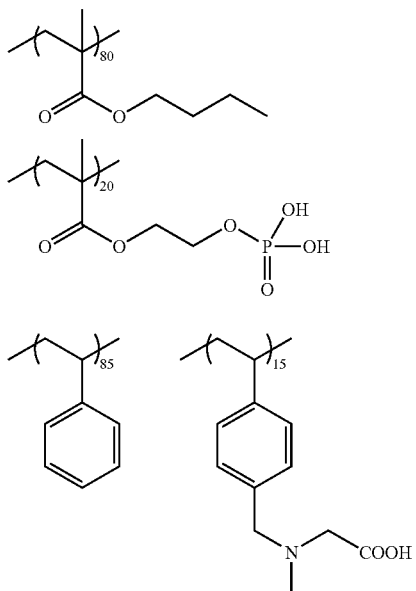

(6)

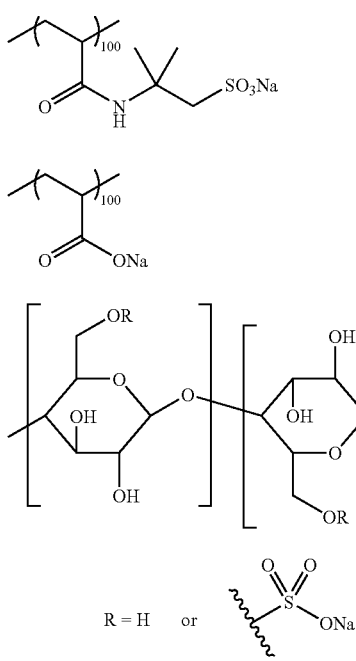

(7)

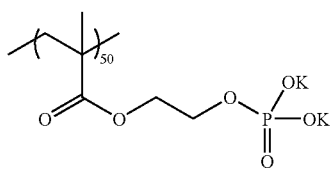

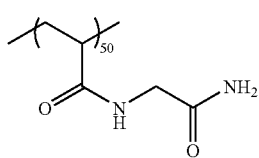

(1-A)

(1-B)

(1-C)

(1-D)

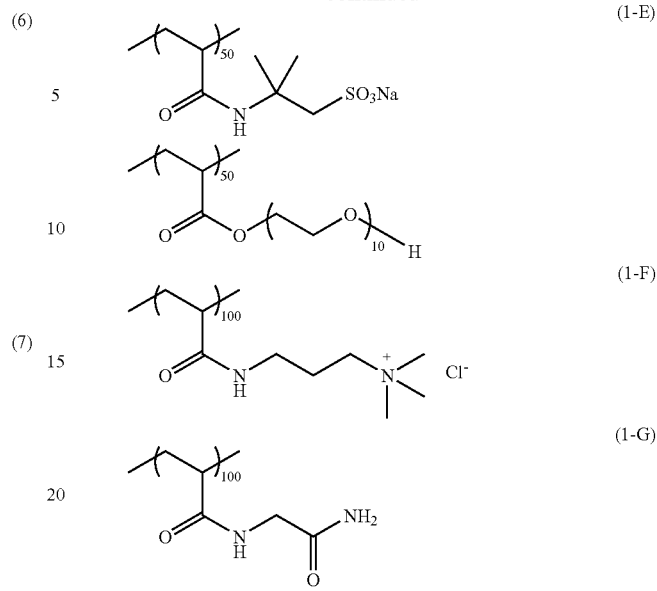

(1-E)

(1-F)

(1-G)

As is apparent from the results shown in Table 101, the large change in the contact angle can be achieved only when the compound having the functional group X and the hydrophilizing compound are used in combination according to the invention. Specifically, with respect to the support for lithographic printing plate precursor (having the compound having the functional group X on its surface) according to the invention, the contact angle of water droplet in air on the surface is decreased from 70° or more to 300 or less by the treatment with the aqueous solution containing the hydrophilizing compound (the compound having the functional group Y). On the contrary, in the case of the treatment with the aqueous solution not containing the hydrophilizing compound or in the case of using the comparative hydrophilizing compound, the decrease in the contact angle of water droplet in air is not recognized at all or extremely small. Further, as to Supports 1-6 and 1-7 each not having the compound having the functional group X on its surface, the contact angle of water droplet in air is only slightly decreased by the treatment with the aqueous solution containing the hydrophilizing compound, although the support itself exhibits the contact angle of water droplet in air of 700 or more.

<Preparation of Supports 2-1 to 2-5 for Lithographic Printing Plate Precursor>

Surface treatment solution 102 having the composition shown below was coated on Aluminum support 1 described in Example 1 and dried at 100° C. for 3 minutes. The coating amount of the surface treatment layer was 10 mg/m².

| (Surface treatment solution 102) | |
|---|---|
| Surface treatment compound shown in Table 102 below | 0.50 g |
| N-Methylpyrrolidone | 49.00 g |
| Methanol | 450.00 g |
| Water | 1.50 g |

The contact angle of water droplet in air of each of Supports 2-1 to 2-5 for lithographic printing plate precursor thus-obtained and Comparative Supports 1-6 to 1-7 for lithographic printing plate precursor was measured according to the method described hereinbefore. The results are shown in Table 102.

Each of Supports 2-1 to 2-5 for lithographic printing plate precursor and Comparative Supports 1-6 to 1-7 for lithographic printing plate precursor was cut in size 3 cm×3 cm, and immersed in 20 ml of each of Aqueous Solutions 109 to 116 (each having pH of 4.5 to 5.5) at 25° C. for one minute. Then, the support was washed with distilled water and dried at 100° C. for one minute to obtain a support for lithographic printing plate precursor subjected to the hydrophilizing treatment.

| (Aqueous Solutions 109 to 116) | |
|---|---|
| Water | 100.00 g |
| Benzyl alcohol | 1.00 g |
| Polyoxyethylene naphthyl ether (average number of oxyethylene: n = 13) | 1.00 g |
| Sodium salt of dioctylsulfosuccinic acid ester | 0.50 g |
| Hydrophilizing compound shown in Table 102 | 3.00 g |
| Ethylene glycol | 0.50 g |
| Ammonium primary phosphate | 0.05 g |
| Citric acid | 0.05 g |

The contact angle of water droplet in air of each of Supports 2-1 to 2-5 for lithographic printing plate precursor and Comparative Supports 1-6 to 1-7 for lithographic printing plate precursor subjected to the hydrophilizing treatment was measured according to the same method as described above. The results are shown in Table 102.

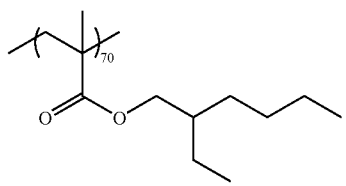

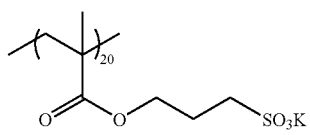 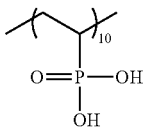

(9)

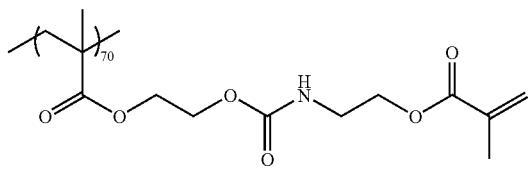

TABLE 102

| | | | Contact Angle of Water Droplet in Air after Treatment (degree) | | | | | | | |
|---|---|---|---|---|---|---|---|---|---|---|
| | | Contact Angle of Water Droplet in Air (degree) | Aqueous Solution 109 | Aqueous Solution 110 | Aqueous Solution 111 | Aqueous Solution 112 | Aqueous Solution 113 | Aqueous Solution 114 Comparative Hydrophilizing Compound | Aqueous Solution 115 Comparative Hydrophilizing Compound | Aqueous Solution 116 |
| | Surface Treatment | | | | Hydrophilizing Compound | | | | | |
| Support | Compound | | 2-A | 2-B | 2-C | 2-D | 2-E | 2-F | 2-G | None |
| 2-1 | (8) | 72 | 9 | 10 | 20 | 12 | 22 | 70 | 72 | 72 |
| 2-2 | (9) | 75 | 8 | 10 | 20 | 12 | 22 | 71 | 75 | 75 |
| 2-3 | (10) | 85 | 15 | 15 | 23 | 15 | 25 | 80 | 85 | 85 |
| 2-4 | (11) | 80 | 10 | 11 | 20 | 13 | 23 | 74 | 75 | 80 |
| 2-5 | (12) | 79 | 15 | 15 | 25 | 18 | 26 | 79 | 79 | 79 |
| 1-6 | (6) | 95 | 93 | 94 | 94 | 94 | 95 | 95 | 95 | 95 |
| 1-7 | (7) | 110 | 106 | 108 | 107 | 108 | 110 | 110 | 110 | 110 |

The surface treatment compounds and hydrophilizing compounds shown in Table 102 are described below.

(8)

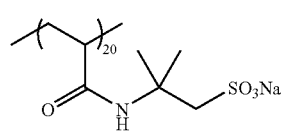

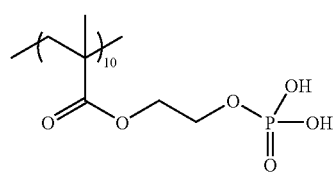

-continued (10)

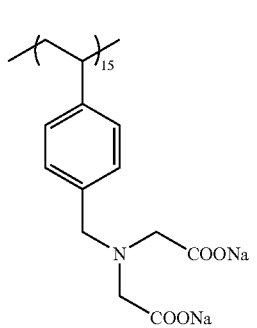 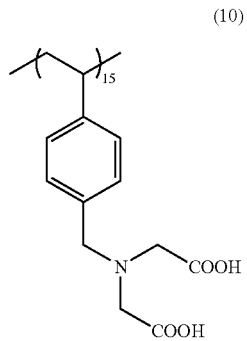

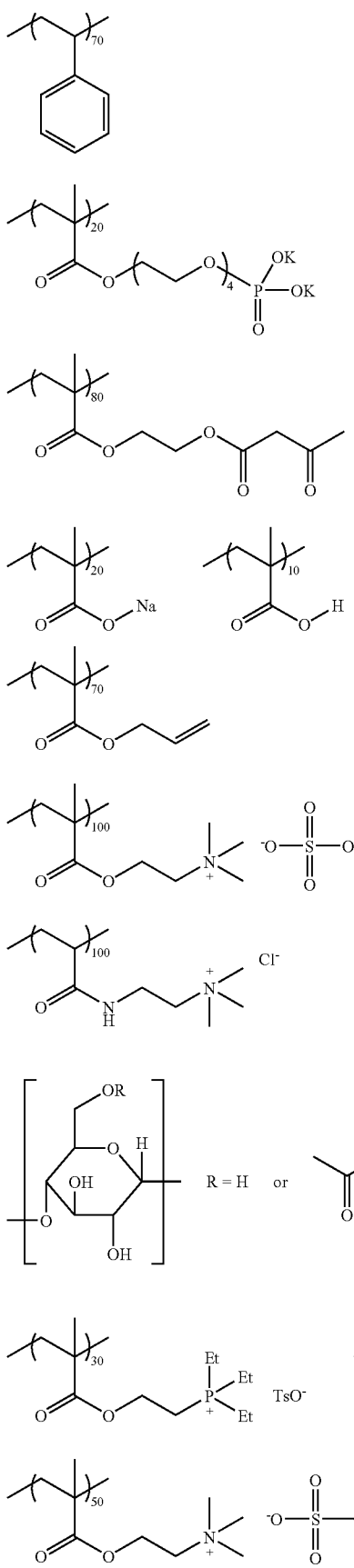

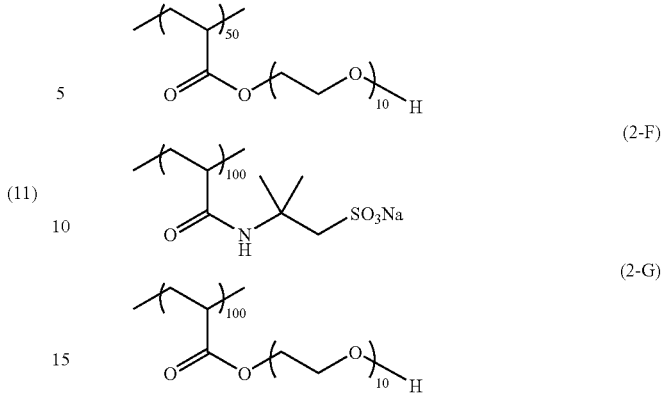

As is apparent from the results shown in Table 102, the large change in the contact angle can be achieved only when the compound having the functional group X and the hydrophilizing compound are used in combination according to the invention. Specifically, with respect to the support for lithographic printing plate precursor (having the compound having the functional group X on its surface) according to the invention, the contact angle of water droplet in air on the surface is decreased from 70° or more to 300 or less by the treatment with the aqueous solution containing the hydrophilizing compound (the compound having the functional group Y). On the contrary, in the case of the treatment with the aqueous solution not containing the hydrophilizing compound or in the case of using the comparative hydrophilizing compound, the decrease in the contact angle of water droplet in air is not recognized at all or extremely small. Further, as to Supports 1-6 and 1-7 each not having the compound having the functional group X on its surface, the contact angle of water droplet in air is only slightly decreased by the treatment with the aqueous solution containing the hydrophilizing compound, although the support itself exhibits the contact angle of water droplet in air of 700 or more.

<Preparation of Lithographic Printing Plate Precursors 1-1 to 1-12>

Lithographic Printing Plate Precursors 1-1 to 1-12 were prepared by coating the photosensitive layer and protective layer on each of the supports for lithographic printing plate precursor in the same manner as in Example 1 except for changing the dry coating amount of the protective layer to 0.50 g/m².

(1) Exposure, Development and Printing

Each of Lithographic Printing Plate Precursors 1-1 to 1-12 was subjected to the laser imagewise exposure in the same manner as in Example 1 and then, subjected to the development processing in the automatic development processor having a structure shown in FIG. 1 using each of Aqueous Solutions 101 to 107 shown above or each of Aqueous Solutions 109 to 115 shown above as shown in Table 103 to prepare a lithographic printing plate (without heating).

On the other hand, within 30 seconds after the laser imagewise exposure, the exposed lithographic printing plate precursor was put in an oven and heated the entire surface of the lithographic printing plate precursor by blowing hot air to maintain at 110° C. for 15 seconds and then the development processing was performed within 30 seconds in the same manner as described above to prepare a lithographic printing plate (with heating).

Then, using each of the lithographic printing plate (without heating) and the lithographic printing plate (with heating), the printing was performed in the same manner as in Example 1.

(2) Evaluation

With respect to the lithographic printing plates prepared above, the printing durability and stain resistance were evaluated in the same manner as in Example 1. The results are shown in Table 103. As the criterion (100) for the relative evaluation, the comparative example referred to as "Evaluation Criterion" in Table 103 was used.

TABLE 103

| | Lithographic Printing Plate Precursor | Support | Hydrophilizing Compound | Printing Durability Without Heating | Printing Durability With Heating | Stain Resistance Without Heating | Stain Resistance With Heating | Evaluation Criterion |
|---|---|---|---|---|---|---|---|---|
| Example 201 | 1-1 | 1-1 | 1-A | 100 | 100 | 650 | 650 | |
| Example 202 | | | 1-B | 100 | 100 | 650 | 650 | |
| Example 203 | | | 1-C | 100 | 100 | 650 | 650 | |
| Example 204 | | | 1-D | 100 | 100 | 650 | 650 | |
| Example 205 | | | 1-E | 100 | 100 | 600 | 600 | |
| Comparative Example 201 | | | 1-F | 100 | 100 | 100 | 100 | Evaluation Criterion |
| Comparative Example 202 | | | 1-G | 100 | 100 | 100 | 100 | |
| Example 206 | 1-2 | 1-2 | 1-A | 100 | 100 | 650 | 650 | |
| Example 207 | | | 1-B | 100 | 100 | 650 | 650 | |
| Example 208 | | | 1-C | 100 | 100 | 650 | 650 | |
| Example 209 | | | 1-D | 100 | 100 | 650 | 650 | |
| Example 210 | | | 1-E | 100 | 100 | 600 | 600 | |
| Comparative Example 203 | | | 1-F | 100 | 100 | 100 | 100 | Evaluation Criterion |
| Comparative Example 204 | | | 1-G | 100 | 100 | 100 | 100 | |
| Example 211 | 1-3 | 1-3 | 1-A | 100 | 100 | 700 | 700 | |
| Example 211 | | | 1-B | 100 | 100 | 700 | 700 | |
| Example 213 | | | 1-C | 100 | 100 | 680 | 680 | |
| Example 214 | | | 1-D | 100 | 100 | 700 | 700 | |
| Example 215 | | | 1-E | 100 | 100 | 680 | 680 | |
| Comparative Example 205 | | | 1-F | 100 | 100 | 100 | 100 | Evaluation Criterion |
| Comparative Example 206 | | | 1-G | 100 | 100 | 100 | 100 | |
| Example 216 | 1-4 | 1-4 | 1-A | 100 | 100 | 650 | 650 | |
| Example 217 | | | 1-B | 100 | 100 | 650 | 650 | |
| Example 218 | | | 1-C | 100 | 100 | 650 | 650 | |
| Example 219 | | | 1-D | 100 | 100 | 650 | 650 | |
| Example 220 | | | 1-E | 100 | 100 | 600 | 600 | |
| Comparative Example 207 | | | 1-F | 100 | 100 | 100 | 100 | Evaluation Criterion |
| Comparative Example 208 | | | 1-G | 100 | 100 | 100 | 100 | |
| Example 221 | 1-5 | 1-5 | 1-A | 100 | 100 | 700 | 700 | |
| Example 222 | | | 1-B | 100 | 100 | 680 | 680 | |
| Example 223 | | | 1-C | 100 | 100 | 680 | 680 | |
| Example 224 | | | 1-D | 100 | 100 | 700 | 700 | |
| Example 225 | | | 1-E | 100 | 100 | 650 | 650 | |
| Comparative Example 209 | | | 1-F | 100 | 100 | 100 | 100 | Evaluation Criterion |
| Comparative Example 210 | | | 1-G | 100 | 100 | 95 | 95 | |
| Comparative Example 211 | 1-6 | 1-6 | 1-A | 100 | 100 | 100 | 100 | Evaluation Criterion |
| Comparative Example 212 | | | 1-B | 100 | 100 | 100 | 100 | |
| Comparative Example 213 | | | 1-C | 100 | 100 | 100 | 100 | |
| Comparative Example 214 | | | 1-D | 100 | 100 | 100 | 100 | |
| Comparative Example 215 | | | 1-E | 100 | 100 | 100 | 100 | |
| Comparative Example 216 | | | 1-F | 100 | 100 | 100 | 100 | |
| Comparative Example 217 | | | 1-G | 100 | 100 | 100 | 100 | |
| Comparative Example 218 | 1-7 | 1-7 | 1-A | 100 | 100 | 100 | 100 | Evaluation Criterion |
| Comparative Example 219 | | | 1-B | 100 | 100 | 100 | 100 | |
| Comparative Example 220 | | | 1-C | 100 | 100 | 100 | 100 | |
| Comparative Example 221 | | | 1-D | 100 | 100 | 100 | 100 | |
| Comparative Example 222 | | | 1-E | 100 | 100 | 100 | 100 | |
| Comparative Example 223 | | | 1-F | 100 | 100 | 100 | 100 | Evaluation Criterion |
| Comparative Example 224 | | | 1-G | 100 | 100 | 100 | 100 | |
| Example 226 | 1-8 | 2-1 | 2-A | 100 | 100 | 650 | 650 | |

TABLE 103-continued

| | Lithographic Printing Plate Precursor | Support | Hydrophilizing Compound | Printing Durability Without Heating | Printing Durability With Heating | Stain Resistance Without Heating | Stain Resistance With Heating | Evaluation Criterion |
|---|---|---|---|---|---|---|---|---|
| Example 227 | | | 2-B | 100 | 100 | 650 | 650 | |
| Example 228 | | | 2-C | 100 | 100 | 600 | 600 | |
| Example 229 | | | 2-D | 100 | 100 | 650 | 650 | |
| Example 230 | | | 2-E | 100 | 100 | 600 | 600 | |
| Comparative Example 225 | | | 2-F | 100 | 100 | 100 | 100 | Evaluation Criterion |
| Comparative Example 226 | | | 2-G | 100 | 100 | 100 | 100 | |
| Example 231 | 1-9 | 2-2 | 2-A | 100 | 100 | 650 | 650 | |
| Example 232 | | | 2-B | 100 | 100 | 650 | 650 | |
| Example 233 | | | 2-C | 100 | 100 | 600 | 600 | |
| Example 234 | | | 2-D | 100 | 100 | 650 | 650 | |
| Example 235 | | | 2-E | 100 | 100 | 600 | 600 | |
| Comparative Example 227 | | | 2-F | 100 | 100 | 100 | 100 | Evaluation Criterion |
| Comparative Example 228 | | | 2-G | 100 | 100 | 100 | 100 | |
| Example 236 | 1-10 | 2-3 | 2-A | 100 | 100 | 700 | 700 | |
| Example 237 | | | 2-B | 100 | 100 | 700 | 700 | |
| Example 238 | | | 2-C | 100 | 100 | 650 | 650 | |
| Example 239 | | | 2-D | 100 | 100 | 700 | 700 | |
| Example 2405 | | | 2-E | 100 | 100 | 650 | 650 | |
| Comparative Example 229 | | | 2-F | 100 | 100 | 100 | 100 | Evaluation Criterion |
| Comparative Example 230 | | | 2-G | 100 | 100 | 100 | 100 | |
| Example 241 | 1-11 | 2-4 | 2-A | 100 | 100 | 650 | 650 | |
| Example 242 | | | 2-B | 100 | 100 | 650 | 650 | |
| Example 243 | | | 2-C | 100 | 100 | 600 | 600 | |
| Example 244 | | | 2-D | 100 | 100 | 650 | 650 | |
| Example 245 | | | 2-E | 100 | 100 | 600 | 600 | |
| Comparative Example 231 | | | 2-F | 100 | 100 | 100 | 100 | Evaluation Criterion |
| Comparative Example 232 | | | 2-G | 100 | 100 | 100 | 100 | |
| Example 246 | 1-12 | 2-5 | 2-A | 100 | 100 | 700 | 700 | |
| Example 247 | | | 2-B | 100 | 100 | 700 | 700 | |
| Example 248 | | | 2-C | 100 | 100 | 650 | 650 | |
| Example 249 | | | 2-D | 100 | 100 | 680 | 680 | |
| Example 250 | | | 2-E | 100 | 100 | 650 | 650 | |
| Comparative Example 233 | | | 2-F | 100 | 100 | 100 | 100 | Evaluation Criterion |
| Comparative Example 234 | | | 2-G | 100 | 100 | 100 | 100 | |
| Comparative Example 235 | 1-6 | 1-6 | 2-A | 100 | 100 | 100 | 100 | Evaluation Criterion |
| Comparative Example 236 | | | 2-B | 100 | 100 | 100 | 100 | |
| Comparative Example 237 | | | 2-C | 100 | 100 | 100 | 100 | |
| Comparative Example 238 | | | 2-D | 100 | 100 | 100 | 100 | |
| Comparative Example 239 | | | 2-E | 100 | 100 | 100 | 100 | |
| Comparative Example 240 | | | 2-F | 100 | 100 | 100 | 100 | |
| Comparative Example 241 | | | 2-G | 100 | 100 | 100 | 100 | |
| Comparative Example 242 | 1-7 | 1-7 | 2-A | 100 | 100 | 100 | 100 | Evaluation Criterion |
| Comparative Example 243 | | | 2-B | 100 | 100 | 100 | 100 | |
| Comparative Example 244 | | | 2-C | 100 | 100 | 100 | 100 | |
| Comparative Example 245 | | | 2-D | 100 | 100 | 100 | 100 | |
| Comparative Example 246 | | | 2-E | 100 | 100 | 100 | 100 | |
| Comparative Example 247 | | | 2-F | 100 | 100 | 100 | 100 | |
| Comparative Example 248 | | | 2-G | 100 | 100 | 100 | 100 | |

As is apparent from the results shown in Table 103, the lithographic printing plate prepared from the lithographic printing plate precursor according to the invention can provide improved stain resistance while maintaining good printing durability.

Examples 251 to 270 and Comparative Examples 249 to 284

<Preparation of Lithographic Printing Plate Precursors 1-13 to 1-18>

Coating Solution 2 for Photosensitive Layer described in Example 67 was coated on each of Supports 1-1, 1-3, 1-6, 1-7, 2-1 and 2-3 for lithographic printing plate precursor and dried at 80° C. for one minute. The coating amount of the photosensitive layer was 1.2 g/m².

Coating Solution 3 for Protective Layer having the composition shown below was coated on the photosensitive layer using a bar so as to have a dry coating amount of 0.50 g/m² and dried at 125° C. for 70 seconds to form a protective layer, thereby preparing Lithographic Printing Plate Precursors 1-13 to 1-18, respectively.

| (Coating Solution 3 for Protective Layer) | |
|---|---|
| Dispersion of Mica (1) shown below | 13.00 g |
| Polyvinyl alcohol (saponification degree: 98% by mole; polymerization degree: 500) | 1.30 g |
| Sodium 2-ethylhexylsulfosuccinate | 0.20 g |
| Vinyl pyrrolidone/vinyl acetate (1/1) copolymer (molecular weight: 70,000) | 0.05 g |
| Surfactant (Emalex 710, produced by Nihon-Emulsion Co., Ltd.) | 0.05 g |
| Water | 133.00 g |

(Preparation of Dispersion of Mica (1))

In 368 g of water was added 32 g of synthetic mica (SOMASIF ME-100, produced by CO-OP Chemical Co., Ltd.; aspect ratio: 1,000 or more) and dispersed using a homogenizer until the average particle diameter (measured by a laser scattering method) became 0.5 μm to obtain Dispersion of Mica (1).

Lithographic Printing Plate Precursors 1-13 to 1-18 thus-obtained were subjected to the exposure, development and printing in the same manner as in Example 201 except for using the solutions as shown in Table 104 respectively and evaluated in the same manner as in Example 201. The results are shown in Table 104. As the criterion (100) for the relative evaluation, the comparative example referred to as "Evaluation Criterion" in Table 104 was used.

TABLE 104

| | Lithographic Printing Plate Precursor | Support | Hydrophilizing Compound | Printing Durability | | Stain Resistance | | Evaluation Criterion |
|---|---|---|---|---|---|---|---|---|
| | | | | Without Heating | With Heating | Without Heating | With Heating | |
| Example 251 | 1-13 | 1-1 | 1-A | 100 | 100 | 650 | 650 | |
| Example 252 | | | 1-B | 100 | 100 | 650 | 650 | |
| Example 253 | | | 1-C | 100 | 100 | 650 | 650 | |
| Example 254 | | | 1-D | 100 | 100 | 650 | 650 | |
| Example 255 | | | 1-E | 100 | 100 | 600 | 600 | |
| Comparative Example 249 | | | 1-F | 100 | 100 | 100 | 100 | Evaluation Criterion |
| Comparative Example 250 | | | 1-G | 100 | 100 | 100 | 100 | |
| Example 256 | 1-14 | 1-3 | 1-A | 100 | 100 | 700 | 700 | |
| Example 257 | | | 1-B | 100 | 100 | 700 | 700 | |
| Example 258 | | | 1-C | 100 | 100 | 690 | 690 | |
| Example 259 | | | 1-D | 100 | 100 | 700 | 700 | |
| Example 260 | | | 1-E | 100 | 100 | 650 | 650 | |
| Comparative Example 251 | | | 1-F | 100 | 100 | 100 | 100 | Evaluation Criterion |
| Comparative Example 252 | | | 1-G | 100 | 100 | 100 | 100 | |
| Comparative Example 253 | 1-15 | 1-6 | 1-A | 100 | 100 | 100 | 100 | Evaluation Criterion |
| Comparative Example 254 | | | 1-B | 100 | 100 | 100 | 100 | |
| Comparative Example 255 | | | 1-C | 100 | 100 | 100 | 100 | |
| Comparative Example 256 | | | 1-D | 100 | 100 | 100 | 100 | |
| Comparative Example 257 | | | 1-E | 100 | 100 | 100 | 100 | |
| Comparative Example 258 | | | 1-F | 100 | 100 | 100 | 100 | |
| Comparative Example 259 | | | 1-G | 100 | 100 | 100 | 100 | |
| Comparative Example 260 | 1-16 | 1-7 | 1-A | 100 | 100 | 100 | 100 | Evaluation Criterion |
| Comparative Example 261 | | | 1-B | 100 | 100 | 100 | 100 | |

TABLE 104-continued

| Lithographic Printing Plate Precursor | Support | Hydrophilizing Compound | Printing Durability Without Heating | Printing Durability With Heating | Stain Resistance Without Heating | Stain Resistance With Heating | Evaluation Criterion |
|---|---|---|---|---|---|---|---|
| Comparative Example 262 | | 1-C | 100 | 100 | 100 | 100 | |
| Comparative Example 263 | | 1-D | 100 | 100 | 100 | 100 | |
| Comparative Example 264 | | 1-E | 100 | 100 | 100 | 100 | |
| Comparative Example 265 | | 1-F | 100 | 100 | 100 | 100 | |
| Comparative Example 266 | | 1-G | 100 | 100 | 100 | 100 | |
| Example 261 | 1-17 | 2-1 | 2-A | 100 | 100 | 650 | 650 | |
| Example 262 | | | 2-B | 100 | 100 | 650 | 650 | |
| Example 263 | | | 2-C | 100 | 100 | 600 | 600 | |
| Example 264 | | | 2-D | 100 | 100 | 650 | 650 | |
| Example 265 | | | 2-E | 100 | 100 | 600 | 600 | |
| Comparative Example 267 | | | 2-F | 100 | 100 | 100 | 100 | Evaluation Criterion |
| Comparative Example 268 | | | 2-G | 100 | 100 | 100 | 100 | |
| Example 266 | 1-18 | 2-3 | 2-A | 100 | 100 | 700 | 700 | |
| Example 267 | | | 2-B | 100 | 100 | 700 | 700 | |
| Example 268 | | | 2-C | 100 | 100 | 650 | 650 | |
| Example 269 | | | 2-D | 100 | 100 | 700 | 700 | |
| Example 270 | | | 2-E | 100 | 100 | 650 | 650 | |
| Comparative Example 269 | | | 2-F | 100 | 100 | 100 | 100 | Evaluation Criterion |
| Comparative Example 270 | | | 2-G | 100 | 100 | 100 | 100 | |
| Comparative Example 271 | 1-15 | 1-6 | 2-A | 100 | 100 | 100 | 100 | Evaluation Criterion |
| Comparative Example 272 | | | 2-B | 100 | 100 | 100 | 100 | |
| Comparative Example 273 | | | 2-C | 100 | 100 | 100 | 100 | |
| Comparative Example 274 | | | 2-D | 100 | 100 | 100 | 100 | |
| Comparative Example 275 | | | 2-E | 100 | 100 | 100 | 100 | |
| Comparative Example 276 | | | 2-F | 100 | 100 | 100 | 100 | |
| Comparative Example 277 | | | 2-G | 100 | 100 | 100 | 100 | |
| Comparative Example 278 | 1-16 | 1-7 | 2-A | 100 | 100 | 100 | 100 | Evaluation Criterion |
| Comparative Example 279 | | | 2-B | 100 | 100 | 100 | 100 | |
| Comparative Example 280 | | | 2-C | 100 | 100 | 100 | 100 | |
| Comparative Example 281 | | | 2-D | 100 | 100 | 100 | 100 | |
| Comparative Example 282 | | | 2-E | 100 | 100 | 100 | 100 | |
| Comparative Example 283 | | | 2-F | 100 | 100 | 100 | 100 | |
| Comparative Example 284 | | | 2-G | 100 | 100 | 100 | 100 | |

As is apparent from the results shown in Table 104, the lithographic printing plate prepared from the lithographic printing plate precursor according to the invention can provide improved stain resistance while maintaining good printing durability.

Examples 271 to 280 and Comparative Examples 285 to 290

Surface treatment solution 103 having the composition shown below was coated on Aluminum support 2 described in Example 78 and dried at 100° C. for 3 minutes to prepare Support 3-1 for lithographic printing plate precursor. The coating amount of the surface treatment layer was 7 mg/m².

| (Surface treatment solution 103) | |
|---|---|
| Surface treatment compound (3) shown above | 0.50 g |
| N-Methylpyrrolidone | 50.00 g |
| Methanol | 450.00 g |

Surface treatment solution 104 having the composition shown below was coated on Aluminum support 2 described in Example 78 and dried at 100° C. for 3 minutes to prepare Support 3-2 for lithographic printing plate precursor. The coating amount of the surface treatment layer was 8 mg/m².

| (Surface treatment solution 104) | |
|---|---|
| Surface treatment compound (10) shown above | 0.50 g |
| N-Methylpyrrolidone | 50.00 g |
| Methanol | 450.00 g |

<Preparation of Lithographic Printing Plate Precursors 1-19 to 1-20>

Coating Solution 3 for Photosensitive Layer described in Example 78 was coated on each of Supports 3-1 and 3-2 for lithographic printing plate precursor using a bar and dried in an oven at 70° C. for 60 seconds to form a photosensitive layer having a dry coating amount of 1.1 g/m².

Coating Solution 2 for Protective Layer described in Example 78 was coated on the photosensitive layer using a bar and dried in an oven at 125° C. for 75 seconds to form a protective layer having a dry coating amount of 0.15 g/m², thereby preparing Lithographic Printing Plate Precursors 1-19 and 1-20, respectively.

Each of Lithographic Printing Plate Precursors 1-19 and 1-20 was exposed by Trendsetter 3244VX, produced by Creo Co., equipped with a water-cooled 40 W infrared semiconductor laser under the conditions of output of 9 W, a rotational number of an outer surface drum of 210 rpm and resolution of 2,400 dpi.

Then, the development and printing was performed in the same manner as in Example 201 except for using each of Aqueous Solutions 117 to 131 having the composition shown below as shown in Table 105 and evaluated in the same manner as in Example 201. Further, with respect to Supports 3-1 and 3-2 for lithographic printing plate precursor, the contact angle of water droplet in air was measured before and after the treatment with the hydrophilizing compound in the same manner as in Example 201. The results are shown in Table 105. As the criterion (100) for the relative evaluation, the comparative example referred to as "Evaluation Criterion" in Table 105 was used.

| (Aqueous Solutions 117 to 131) | |
|---|---|
| Water | 100.00 g |
| Polyoxyethylene naphthyl ether (average number of oxyethylene: n = 13) | 0.50 g |
| Sodium salt of dioctylsulfosuccinic acid ester | 0.50 g |
| Hydrophilizing compound shown in Table 105 | 3.00 g |
| Ammonium primary phosphate | 0.05 g |
| Citric acid | 0.05 g |

TABLE 105

| | Lithographic Printing Plate Precursor | Support | Aqueous Solution | Hydro-philizing Compound | Contact Angle of Water Droplet in Air (degree) Before Treatment | Contact Angle of Water Droplet in Air (degree) After Treatment | Printing Durability Without Heating | Printing Durability With Heating | Stain Resistance Without Heating | Stain Resistance With Heating | Evaluation Criterion |
|---|---|---|---|---|---|---|---|---|---|---|---|
| Example 271 | 1-19 | 3-1 | 117 | 1-A | 90 | 15 | 100 | 100 | 700 | 700 | |
| Example 272 | | | 118 | 1-B | | 15 | 100 | 100 | 700 | 700 | |
| Example 273 | | | 119 | 1-C | | 16 | 100 | 100 | 690 | 690 | |
| Example 274 | | | 120 | 1-D | | 15 | 100 | 100 | 700 | 700 | |
| Example 275 | | | 121 | 1-E | | 25 | 100 | 100 | 680 | 680 | |
| Comparative Example 285 | | | 122 | 1-F | | 85 | 100 | 100 | 100 | 100 | Evaluation Criterion |
| Comparative Example 286 | | | 123 | 1-G | | 90 | 100 | 100 | 70 | 70 | |
| Comparative Example 287 | | | 124 | None | | 90 | 100 | 100 | 70 | 70 | |
| Example 276 | 1-20 | 3-2 | 125 | 2-A | 80 | 15 | 100 | 100 | 700 | 700 | |
| Example 277 | | | 126 | 2-B | | 15 | 100 | 100 | 700 | 700 | |
| Example 278 | | | 127 | 2-C | | 23 | 100 | 100 | 680 | 680 | |
| Example 279 | | | 128 | 2-D | | 15 | 100 | 100 | 700 | 700 | |
| Example 280 | | | 129 | 2-E | | 25 | 100 | 100 | 680 | 680 | |
| Comparative Example 288 | | | 130 | 2-F | | 80 | 100 | 100 | 100 | 100 | Evaluation Criterion |
| Comparative Example 289 | | | 131 | 2-G | | 80 | 100 | 100 | 100 | 100 | |
| Comparative Example 290 | | | 124 | None | | 80 | 100 | 100 | 100 | 100 | |

As is apparent from the results shown in Table 105, the lithographic printing plate prepared from the lithographic printing plate precursor according to the invention can provide improved stain resistance while maintaining good printing durability.

Examples 281 to 290 and Comparative Examples 291 to 296

<Preparation of Lithographic Printing Plate Precursor 1-21>

Coating Solution C for Image-Forming Layer having the composition shown below was coated on Support 3-1 for lithographic printing plate precursor using a bar and dried in an oven at 100° C. for 120 seconds to form an image-forming layer having a dry coating amount of 1.1 g/m², thereby preparing Lithographic Printing Plate Precursor 1-21.

| (Coating Solution C for Image-Forming Layer) | |
|---|---|
| Heat Decarboxylating Polymer (1) shown below | 1.0 g |
| Infrared absorbing agent (NK-3508, produced by Nippon Kankosikiso Kenkyusho K.K | 0.15 g |
| Megafac F-177 (fluorine-based surfactant, produced by Dainippon Ink & Chemicals, Inc.) | 0.06 g |
| Methyl ethyl ketone | 20 g |
| Methyl alcohol | 7 g |

Heat Decarboxylating Polymer (1)

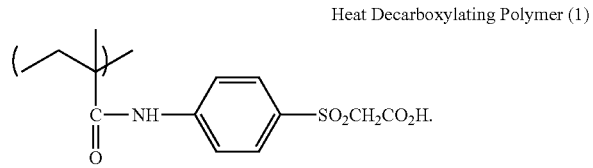

<Preparation of Lithographic Printing Plate Precursor 1-22>

Coating Solution D for Image-Forming Layer having the composition shown below was coated on Support 3-2 for lithographic printing plate precursor using a bar and dried in an oven at 80° C. for 180 seconds to form an image-forming layer having a dry coating amount of 1.2 g/m², thereby preparing Lithographic Printing Plate Precursor 1-22.

| (Coating Solution D for Image-Forming Layer) | |
|---|---|
| Heat-Sensitive Polymer Compound (1) shown below | 4.0 g |
| Infrared absorbing agent (IR-125, produced by Wako Pure Chemical Industries, Ltd.) | 0.15 g |
| Acid generator (diphenyliodonium anthraquinonesulfonate) | 0.15 g |
| Dye obtained by substituting counter ion of Victoria Pure Blue BOH with 1-naphthalenesulfonic acid | 0.05 g |
| Fluorine-based surfactant (Megafac F-177, produced by Dainippon Ink & Chemicals, Inc.) | 0.06 g |
| Methyl ethyl ketone | 20 g |
| γ-Butyrolactone | 10 g |
| 1-Methoxy-2-propanol | 8 g |
| Water | 2 g |

Heat-Sensitizer Polymer Compound (1)

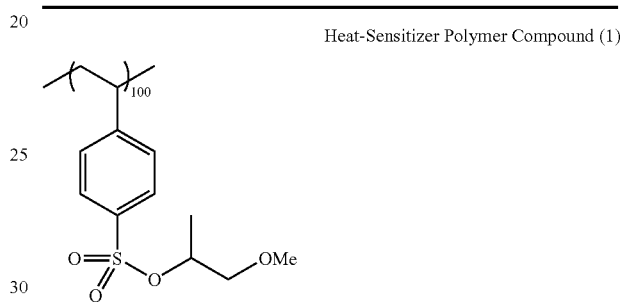

Using each of Lithographic Printing Plate Precursors 1-21 and 1-22, the image exposure, development and printing were performed in the same manner as in Example 271 using each of Aqueous Solutions 117 to 131 as shown in Table 106 and the printing durability and stain resistance were evaluated in the same manner as in Example 271. The results are shown in Table 106. As the criterion (100) for the relative evaluation, the comparative example referred to as "Evaluation Criterion" in Table 106 was used.

TABLE 106

| | Lithographic Printing Plate Precursor | Support | Aqueous Solution | Hydrophilizing Compound | Printing Durability | | Stain Resistance | | Evaluation Criterion |
|---|---|---|---|---|---|---|---|---|---|
| | | | | | Without Heating | With Heating | Without Heating | With Heating | |
| Example 281 | 1-21 | 3-1 | 117 | 1-A | 100 | 100 | 690 | 690 | |
| Example 282 | | | 118 | 1-B | 100 | 100 | 690 | 690 | |
| Example 283 | | | 119 | 1-C | 100 | 100 | 670 | 670 | |
| Example 284 | | | 120 | 1-D | 100 | 100 | 690 | 690 | |
| Example 285 | | | 121 | 1-E | 100 | 100 | 660 | 660 | |
| Comparative Example 291 | | | 122 | 1-F | 100 | 100 | 100 | 100 | Evaluation Criterion |
| Comparative Example 292 | | | 123 | 1-G | 100 | 100 | 70 | 70 | |
| Comparative Example 293 | | | 124 | None | 100 | 100 | 70 | 70 | |
| Example 286 | 1-22 | 3-2 | 125 | 2-A | 100 | 100 | 680 | 680 | |
| Example 287 | | | 126 | 2-B | 100 | 100 | 680 | 680 | |
| Example 288 | | | 127 | 2-C | 100 | 100 | 660 | 660 | |
| Example 289 | | | 128 | 2-D | 100 | 100 | 680 | 680 | |
| Example 290 | | | 129 | 2-E | 100 | 100 | 660 | 660 | |
| Comparative Example 295 | | | 130 | 2-F | 100 | 100 | 100 | 100 | Evaluation Criterion |

TABLE 106-continued

| Lithographic Printing Plate Precursor | Support | Aqueous Solution | Hydrophilizing Compound | Printing Durability Without Heating | Printing Durability With Heating | Stain Resistance Without Heating | Stain Resistance With Heating | Evaluation Criterion |
|---|---|---|---|---|---|---|---|---|
| Comparative Example 296 | | 131 | 2-G | 100 | 100 | 100 | 100 | |
| Comparative Example 297 | | 124 | None | 100 | 100 | 100 | 100 | |

As is apparent from the results shown in Table 106, the lithographic printing plate precursor having the polarity conversion type image-forming layer according to the invention can provide improved stain resistance while maintaining good printing durability.

Examples 291 to 300 and Comparative Examples 297 to 300

Each of Lithographic Printing Plate Precursors 1-1 and 1-17 was subjected to the laser imagewise exposure in the same manner as in Example 201 or Example 261 and then subjected to development processing using an automatic development processor having a structure shown in FIG. 2, wherein a heater of a pre-heat unit was turned off, Developer 1-1 having the composition shown below was charged in a developing bath, each of Aqueous Solution 132 to 145 having the composition shown below was charged in a finishing bath, water was charged in a pre-water washing bath and a water washing bath, and temperature of a drying zone was set at 110° C., at transportation speed of 100 cm/min, thereby preparing a lithographic printing plate (without heating).

On the other hand, the heater of the pre-heat unit was turned on to adjust the temperature of the pre-heat unit to 110° C. and then, each of the lithographic printing plate precursors after the laser imagewise exposure was subjected to development processing in the same manner as described above to prepare a lithographic printing plate (with heating).

Then, using each of the lithographic printing plate (without heating) and the lithographic printing plate (with heating), the printing durability and stain resistance were evaluated in the same manner as in Example 201. The results are shown in Table 107. As the criterion (100) for the relative evaluation, the comparative example referred to as "Evaluation Criterion" in Table 107 was used.

| (Developer 1-1) | |
|---|---|
| Water | 100.00 g |
| Benzyl alcohol | 1.00 g |
| Polyoxyethylene naphthyl ether (average number of oxyethylene: n = 13) | 1.00 g |
| Sodium salt of dioctylsulfosuccinic acid ester | 0.50 g |
| Ethylene glycol | 0.50 g |
| Ammonium primary phosphate | 0.05 g |
| Citric acid | 0.05 g |
| (Aqueous Solutions 132 to 145) | |
| Water | 100.00 g |
| Sodium salt of dioctylsulfosuccinic acid ester | 0.50 g |
| Hydrophilizing compound shown in Table 107 | 2.00 g |
| Ammonium primary phosphate | 0.05 g |
| Citric acid | 0.05 g |

TABLE 107

| Lithographic Printing Plate Precursor | Support | Aqueous Solution | Hydrophilizing Compound | Printing Durability Without Heating | Printing Durability With Heating | Stain Resistance Without Heating | Stain Resistance With Heating | Evaluation Criterion |
|---|---|---|---|---|---|---|---|---|
| Example 291 | 1-1 | 1-1 | 132 | 1-A | 100 | 100 | 650 | 650 | |
| Example 292 | | | 133 | 1-B | 100 | 100 | 650 | 650 | |
| Example 293 | | | 134 | 1-C | 100 | 100 | 650 | 650 | |
| Example 294 | | | 135 | 1-D | 100 | 100 | 650 | 650 | |
| Example 295 | | | 136 | 1-E | 100 | 100 | 600 | 600 | |
| Comparative Example 297 | | | 137 | 1-F | 100 | 100 | 100 | 100 | Evaluation Criterion |
| Comparative Example 298 | | | 138 | 1-G | 100 | 100 | 100 | 100 | |
| Example 296 | 1-17 | 2-1 | 139 | 2-A | 100 | 100 | 650 | 650 | |
| Example 297 | | | 140 | 2-B | 100 | 100 | 650 | 650 | |
| Example 298 | | | 141 | 2-C | 100 | 100 | 600 | 600 | |
| Example 299 | | | 142 | 2-D | 100 | 100 | 650 | 650 | |
| Example 300 | | | 143 | 2-E | 100 | 100 | 600 | 600 | |
| Comparative Example 299 | | | 144 | 2-F | 100 | 100 | 100 | 100 | Evaluation Criterion |
| Comparative Example 300 | | | 145 | 2-G | 100 | 100 | 100 | 100 | |

As is apparent from the results shown in Table 107, the lithographic printing plate precursor according to the invention can provide a lithographic printing plate having improved stain resistance while maintaining good printing durability also by the plate making method including the treatment with the aqueous solution containing the hydrolyzing compound after the development.

Examples 301 to 320 and Comparative Examples 301 to 312

Each of Lithographic Printing Plate Precursors 1-19 to 1-22 was exposed by Trendsetter 3244VX, produced by Creo Co., equipped with a water-cooled 40 W infrared semiconductor laser under the conditions of output of 9 W, a rotational number of an outer surface drum of 210 rpm and resolution of 2,400 dpi. The exposed lithographic printing plate precursor was mounted without conducting development processing on a cylinder of a printing machine (SOR-M, produced by Heidelberg Co.). After supplying each of Dampening Waters (1-1) to (1-15) having the composition shown below and TRANS-G(N) black ink (produced by Dainippon Ink & Chemicals, Inc.), printing was performed at a printing speed of 6,000 sheets per hour. The printing durability and stain resistance were evaluated in the same manner as in Example 201. The results are shown in Table 108. As the criterion (100) for the relative evaluation, the comparative example referred to as "Evaluation Criterion" in Table 108 was used.

| <Dampening Waters (1-1) to (1-15)> | |
|---|---|
| Hydrophilizing compound shown in Table 108 | 3 parts by weight |
| EU-3 (etching solution, produced by Fuji Film Co., Ltd.) | 1 part by weight |
| Water | 89 parts by weight |
| Isopropyl alcohol | 7 parts by weight |

TABLE 108

| | Lithographic Printing Plate Precursor | Support | Dampening Water | Hydrophilizing Compound | Printing Durability Without Heating | Printing Durability With Heating | Stain Resistance Without Heating | Stain Resistance With Heating | Evaluation Criterion |
|---|---|---|---|---|---|---|---|---|---|
| Example 301 | 1-19 | 3-1 | 1-1 | 1-A | 100 | 100 | 700 | 700 | |
| Example 302 | | | 1-2 | 1-B | 100 | 100 | 700 | 700 | |
| Example 303 | | | 1-3 | 1-C | 100 | 100 | 690 | 690 | |
| Example 304 | | | 1-4 | 1-D | 100 | 100 | 700 | 700 | |
| Example 305 | | | 1-5 | 1-E | 100 | 100 | 680 | 680 | |
| Comparative Example 301 | | | 1-6 | 1-F | 100 | 100 | 100 | 100 | Evaluation Criterion |
| Comparative Example 302 | | | 1-7 | 1-G | 100 | 100 | 70 | 70 | |
| Comparative Example 303 | | | 1-8 | None | 100 | 100 | 70 | 70 | |
| Example 306 | 1-20 | 3-2 | 1-9 | 2-A | 100 | 100 | 700 | 700 | |
| Example 307 | | | 1-10 | 2-B | 100 | 100 | 700 | 700 | |
| Example 308 | | | 1-11 | 2-C | 100 | 100 | 680 | 680 | |
| Example 309 | | | 1-12 | 2-D | 100 | 100 | 700 | 700 | |
| Example 310 | | | 1-13 | 2-E | 100 | 100 | 680 | 680 | |
| Comparative Example 304 | | | 1-14 | 2-F | 100 | 100 | 100 | 100 | Evaluation Criterion |
| Comparative Example 305 | | | 1-15 | 2-G | 100 | 100 | 100 | 100 | |
| Comparative Example 306 | | | 1-8 | None | 100 | 100 | 100 | 100 | |
| Example 311 | 1-21 | 3-1 | 1-1 | 1-A | 100 | 100 | 700 | 700 | |
| Example 312 | | | 1-2 | 1-B | 100 | 100 | 700 | 700 | |
| Example 313 | | | 1-3 | 1-C | 100 | 100 | 690 | 690 | |
| Example 314 | | | 1-4 | 1-D | 100 | 100 | 700 | 700 | |
| Example 315 | | | 1-5 | 1-E | 100 | 100 | 680 | 680 | |
| Comparative Example 307 | | | 1-6 | 1-F | 100 | 100 | 100 | 100 | Evaluation Criterion |
| Comparative Example 308 | | | 1-7 | 1-G | 100 | 100 | 70 | 70 | |
| Comparative Example 309 | | | 1-8 | None | 100 | 100 | 70 | 70 | |
| Example 316 | 1-22 | 3-2 | 1-9 | 2-A | 100 | 100 | 700 | 700 | |
| Example 317 | | | 1-10 | 2-B | 100 | 100 | 700 | 700 | |
| Example 318 | | | 1-11 | 2-C | 100 | 100 | 680 | 680 | |
| Example 319 | | | 1-12 | 2-D | 100 | 100 | 700 | 700 | |
| Example 320 | | | 1-13 | 2-E | 100 | 100 | 680 | 680 | |
| Comparative Example 310 | | | 1-14 | 2-F | 100 | 100 | 100 | 100 | Evaluation Criterion |
| Comparative Example 311 | | | 1-15 | 2-G | 100 | 100 | 100 | 100 | |
| Comparative Example 312 | | | 1-8 | None | 100 | 100 | 100 | 100 | |

As is apparent from the results shown in Table 108, the lithographic printing plate precursor according to the invention can provide the lithographic printing plate having both high printing durability and excellent stain resistance also by the simple processing (on-machine development).

201. The results are shown in Table 109. As the criterion (100) for the relative evaluation, the comparative example referred to as "Evaluation Criterion" in Table 109 was used

TABLE 109

|  | Lithographic Printing Plate Precursor | Support | Aqueous Solution | Hydrophilizing Compound | Printing Durability Without Heating | Printing Durability With Heating | Stain Resistance Without Heating | Stain Resistance With Heating | Evaluation Criterion |
|---|---|---|---|---|---|---|---|---|---|
| Example 321 | 1-23 | 3-1 | 117 | 1-A | 100 | 100 | 700 | 700 |  |
| Example 322 |  |  | 118 | 1-B | 100 | 100 | 700 | 700 |  |
| Example 323 |  |  | 119 | 1-C | 100 | 100 | 690 | 690 |  |
| Example 324 |  |  | 120 | 1-D | 100 | 100 | 700 | 700 |  |
| Example 325 |  |  | 121 | 1-E | 100 | 100 | 680 | 680 |  |
| Comparative Example 313 |  |  | 122 | 1-F | 100 | 100 | 100 | 100 | Evaluation Criterion |
| Comparative Example 314 |  |  | 123 | 1-G | 100 | 100 | 70 | 70 |  |
| Comparative Example 315 |  |  | 124 | None | 100 | 100 | 70 | 70 |  |
| Example 326 | 1-24 | 3-2 | 125 | 2-A | 100 | 100 | 700 | 700 |  |
| Example 327 |  |  | 126 | 2-B | 100 | 100 | 700 | 700 |  |
| Example 328 |  |  | 127 | 2-C | 100 | 100 | 680 | 680 |  |
| Example 329 |  |  | 128 | 2-D | 100 | 100 | 700 | 700 |  |
| Example 330 |  |  | 129 | 2-E | 100 | 100 | 680 | 680 |  |
| Comparative Example 316 |  |  | 130 | 2-F | 100 | 100 | 100 | 100 | Evaluation Criterion |
| Comparative Example 317 |  |  | 131 | 2-G | 100 | 100 | 100 | 100 |  |
| Comparative Example 318 |  |  | 124 | None | 100 | 100 | 100 | 100 |  |

Examples 321 to 330 and Comparative Examples 313 to 318

<Preparation of Lithographic Printing Plate Precursor 1-23>

Coating Solution A for Image-Forming Layer described above was coated on Support 3-1 for lithographic printing plate precursor and dried at 35° C. for one hour to form an image-forming layer having a dry coating amount of 1.3 g/m$^2$, thereby preparing Lithographic Printing Plate Precursor 1-23.

<Preparation of Lithographic Printing Plate Precursor 1-24>

Coating Solution B for Image-Forming Layer described above was coated on Support 3-2 for lithographic printing plate precursor and dried at 60° C. for 2 minutes to form an image-forming layer having a dry coating amount of 1.3 g/m$^2$, thereby preparing Lithographic Printing Plate Precursor 1-24.

<Exposure, Development and Printing>

Lithographic Printing Plate Precursor 1-23 was exposed by a scanning NdYLF infrared laser emitting at 1,050 nm (on the surface of the image-forming layer, scanning speed: 4 m/sec, spot size: 15 μm and output: 170 mW). On the other hand, Lithographic Printing Plate Precursor 1-24 was exposed by Trendsetter 3244VFS, produced by Creo Co., equipped with a water-cooled 40 W infrared semiconductor laser under the conditions of output of 9 W, a rotational number of an outer surface drum of 210 rpm, energy on the surface of plate of 100 mJ/cm$^2$ and resolution of 2,400 dpi.

Then, each of the exposed lithographic printing plate precursors was subjected to the development and printing in the same manner as in Example 201 except for using each of Aqueous Solutions 117 to 131 described above as shown in Table 109 and evaluated in the same manner as in Example As is apparent from the results shown in Table 109, the lithographic printing plate precursor having the heat fusion type image-forming layer according to the invention can provide a lithographic printing plate having both high printing durability and excellent stain resistance also by the simple processing.

This application is based on Japanese Patent application JP 2007-089729, filed Mar. 29, 2007, and Japanese Patent application JP 2007-256774, filed Sep. 28, 2007, the entire contents of which are hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A method for preparing a lithographic printing plate, comprising:
   providing a lithographic printing plate precursor comprising: a support having a surface, a contact angle of water droplet in air on which is 70° or more; and a photosensitive layer, wherein the support has, on a surface of the support, a compound having a functional group X, the functional group X being a functional group capable of forming a chemical bond with a compound having a functional group Y which can interact with the functional group X, when the functional group X is brought into contact with the compound having a functional group Y, to adsorb the compound having a functional group Y on the surface of the support to decrease the contact angle of water droplet in air on the surface of the support to 30° or less;
   exposing imagewise the lithographic printing plate precursor; and developing the exposed lithographic printing plate precursor with an aqueous solution having pH of from 2 to 10 to form a non-image area, wherein at or after the development, the lithographic printing plate precursor is treated with an aqueous solution containing the compound having a functional group Y, to decrease the contact angle of water droplet in air on the surface of the support in the unexposed area to 30° or less;

wherein:

the functional group X is a functional group represented by the following formula (0):

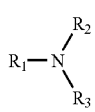

(0)

wherein $R_1$ to $R_3$ each independently represents a monovalent group comprising at least one atom selected from the group consisting of hydrogen, carbon, oxygen, nitrogen, sulfur, phosphorus, halogen and silicon or a covalent bond, or appropriate two of $R_1$ to $R_3$ may be combined with each other to form a ring, provided that at least one of $R_1$ to $R_3$ represents a divalent connecting group for connecting to a skeleton of the compound having the functional group X, which comprises at least one atom selected from the group consisting of hydrogen, carbon, oxygen, nitrogen, sulfur, phosphorus, halogen and silicon; and the functional group Y is a functional group selected from the group consisting of —$SO_3H$, —$PO(OH)(OM)$ and —$B(OH)(OM)$ wherein M represents a hydrogen atom, a metal cation, an ammonium group, a phosphonium group, an iodonium group, a sulfonium group, a diazonium group or an azinium group.

2. A method for preparing a lithographic printing plate, comprising:

providing a lithographic printing plate precursor comprising: a support having a surface, a contact angle of water droplet in air on which is 70° or more; and a photosensitive layer, wherein the support has, on a surface of the support, a compound having a functional group X, the functional group X being a functional group capable of forming a chemical bond with a compound having a functional group Y which can interact with the functional group X, when the functional group X is brought into contact with the compound having a functional group Y, to adsorb the compound having a functional group Y on the surface of the support to decrease the contact angle of water droplet in air on the surface of the support to 30° or less;

exposing imagewise the lithographic printing plate precursor; and developing the exposed lithographic printing plate precursor with an aqueous solution having pH of from 2 to 10 to form a non-image area, wherein at or after the development, the lithographic printing plate precursor is treated with an aqueous solution containing the compound having a functional group Y, to decrease the contact angle of water droplet in air on the surface of the support in the unexposed area to 30° or less;

wherein the functional group X is a functional group having a positive charge and is represented by one of the following formulae (1) to (5) and the functional group Y is a functional group having a negative charge and is represented by one of the following formulae (6) to (8):

(1)

(2)

(3)

(4)

(5)

in the formulae (1) to (5), $R_1$ to $R_3$ each independently represents a hydrogen atom, an alkyl group, an aryl group, an alkenyl group or an alkynyl group, L represents a divalent connecting group for connecting to a skeleton of the compound having the functional group X, and $Z^-$ represents a counter anion;

(6)

(7)

(8)

in the formulae (6) to (8), $M_1^+$ and $M_2^+$ each independently represents a counter cation, and L represents a divalent connecting group for connecting to a skeleton of the compound having the functional group Y.

3. A method for preparing a lithographic printing plate, comprising:

providing a lithographic printing plate precursor comprising: a support having a surface, a contact angle of water droplet in air on which is 70° or more; and a photosensitive layer, wherein the support has, on a surface of the support, a compound having a functional group X, the functional group X being a functional group capable of forming a chemical bond with a compound having a functional group Y which can interact with the functional group X, when the functional group X is brought into contact with the compound having a functional group Y, to adsorb the compound having a functional group Y on the surface of the support to decrease the contact angle of water droplet in air on the surface of the support to 30° or less;

exposing imagewise the lithographic printing plate precursor; and developing the exposed lithographic printing plate precursor with an aqueous solution having pH of from 2 to 10 to form a non-image area, wherein at or after the development, the lithographic printing plate precursor is treated with an aqueous solution containing the compound having a functional group Y, to decrease the contact angle of water droplet in air on the surface of the support in the unexposed area to 30° or less;

wherein the functional group X is a functional group having a negative charge and is represented by one of the following formulae (9) to (11) and the functional group Y is a functional group having a positive charge and is represented by one of the following formulae (12) to (16):

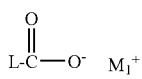
(9)

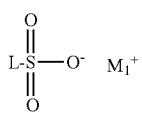
(10)

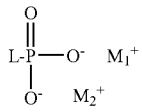
(11)

in the formulae (9) to (11), $M_1^+$ and $M_2^+$ each independently represents a counter cation, and L represents a divalent connecting group for connecting to a skeleton of the compound having the functional group X;

(12)

(13)

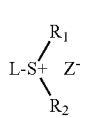
(14)

(15)

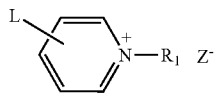
(16)

in the formulae (12) to (16), $R_1$ to $R_3$ each independently represents a hydrogen atom, an alkyl group, an aryl group, an alkenyl group or an alkynyl group, L represents a divalent connecting group for connecting to a skeleton of the compound having the functional group Y, and $Z^-$ represents a counter anion.

* * * * *